(12) United States Patent
van den Boom

(10) Patent No.: US 8,446,299 B2
(45) Date of Patent: May 21, 2013

(54) METHOD AND DEVICE FOR ENCODING AND DECODING OF DATA IN UNIQUE NUMBER VALUES

(76) Inventor: Ipo Paulus Willem Marinus Maria van den Boom, Almelo (NL)

( * ) Notice: Subject to any disclaimer, the term of this patent is extended or adjusted under 35 U.S.C. 154(b) by 145 days.

(21) Appl. No.: 12/994,127

(22) PCT Filed: May 25, 2009

(86) PCT No.: PCT/NL2009/050289
§ 371 (c)(1),
(2), (4) Date: Dec. 29, 2010

(87) PCT Pub. No.: WO2009/142502
PCT Pub. Date: Nov. 26, 2009

(65) Prior Publication Data
US 2011/0122003 A1    May 26, 2011

(30) Foreign Application Priority Data

May 21, 2008   (NL) ..................................... 2001597

(51) Int. Cl.
*H03M 7/30* (2006.01)
(52) U.S. Cl.
USPC ............. 341/76; 455/466; 707/674; 707/803; 707/828; 709/205; 709/206; 341/77; 341/25; 341/80

(58) Field of Classification Search .............. 341/50–90; 455/466; 707/803, 674, 828; 709/206, 205
See application file for complete search history.

(56) References Cited

U.S. PATENT DOCUMENTS

| | | | | |
|---|---|---|---|---|
| 6,732,155 | B2* | 5/2004 | Meek ............................ | 709/206 |
| 6,993,166 | B2* | 1/2006 | Lo et al. ....................... | 382/124 |
| 7,814,165 | B2* | 10/2010 | Peters .......................... | 709/207 |
| 7,865,476 | B2* | 1/2011 | Kodama ....................... | 707/674 |
| 7,917,584 | B2* | 3/2011 | Arthursson ................... | 709/205 |
| 7,966,758 | B2* | 6/2011 | Scott Watts .................... | 40/641 |

OTHER PUBLICATIONS

Data Compression: The Complete Reference, Springer, 4th edition (Dec. 2006), Chapter 3, "Dictionary Methods," pp. 171-173.
Hagamen et al., "Encoding Verbal Information as Unique Numbers," IBM Syst., No. 4, 1972, pp. 278-315.

* cited by examiner

Primary Examiner — Lam T Mai
(74) Attorney, Agent, or Firm — Fliesler Meyer LLP

(57) ABSTRACT

Systems and methods for the encoding of data in a dataset, comprising the storage of the data in an i-th temporary code list (TCL(i)); generating an i-th folder (folder(i)) from the i-th temporary code list (TCL(i)) by replacing each value by an index that refers to the same value in a reference database; generating new temporary codes, using a predetermined formula F that always combines at least two values from the i-th folder (folder(i)), and placing thereof in an (i+1)-th temporary code list (TCL(i+1)); and the recursive repetition of actions b) and c) for subsequent values of i, so long as the (i+1)-th temporary code list (TCL(i+1)) or the (i+1)-th folder (Folder (i+1)) contains one or more values more than once.

24 Claims, 43 Drawing Sheets

Fig 2

| Data set | TCL(0)= Data set | PCL(0) | Map(0) | TCL(1)= F1(map(0)) | PCL(1) | Map(1) | TCL(2)= F2(map(1)) | PCL(2) | Map(2) | TCL(3)= F3(map(2)) | PCL(3) | Map(3) | TCL(4)= F4(map(3)) | PCL(4) | Map(4) |
|---|---|---|---|---|---|---|---|---|---|---|---|---|---|---|---|
| FF | FF | FF | 1 | F1(1;2) | F1(1;2) | 1 | F2(1;2) | F2(1;2) | 1 | F3(1;2) | F3(1;2) | 1 | F4(1;2) | F4(1;2) | 1 |
| 12 | 12 | 12 | 2 | F1(1;1) | F1(1;1) | 2 | | F2(3;2) | 2 | F3(3;1) | F3(3;1) | 2 | | | |
| FF | FF | 0C | 1 | F1(3;4) | F1(3;4) | 3 | F2(3;2) | F2(1;3) | 3 | | | | | | |
| FF | FF | 13 | 1 | F1(1;1) | | 2 | | | 1 | | | | | | |
| 0C | 0C | | 3 | F1(1;1) | | 1 | F2(1;3) | | | | | | | | |
| 13 | 13 | | 4 | F1(3;4) | | 3 | | | | | | | | | |
| FF | FF | | 1 | F1(1;2) | | 1 | F2(1;2) | | | | | | | | |
| FF | FF | | 1 | F1(1;1) | | 2 | | | | | | | | | |
| FF | FF | | 1 | | | | | | | | | | | | |
| 12 | 12 | | 2 | | | | | | | | | | | | |
| 0C | 0C | | 3 | | | | | | | | | | | | |
| 13 | 13 | | 4 | | | | | | | | | | | | |
| FF | FF | | 1 | | | | | | | | | | | | |
| 12 | 12 | | 2 | | | | | | | | | | | | |
| FF | FF | | 1 | | | | | | | | | | | | |
| FF | FF | | 1 | | | | | | | | | | | | |

Fig 3

DCT-matrix 1

| 10 | 4  | 2  | 5  | 1 | 0  | -1 | 0 |
|----|----|----|----|---|----|----|---|
| 3  | 4  | 1  | 2  | 1 | 1  | 0  | 0 |
| 1  | 2  | 1  | 2  | 1 | -1 | 0  | 0 |
| 1  | 1  | 0  | -1 | 0 | 0  | 0  | 0 |
| 2  | 1  | -1 | 0  | 0 | 0  | 0  | 0 |
| 1  | -1 | 0  | 0  | 0 | 0  | 0  | 0 |
| 1  | 0  | 0  | 0  | 0 | 0  | 0  | 0 |
| 0  | 0  | 0  | 0  | 0 | 0  | 0  | 0 |

DCT-matrix 2

| 11 | 5 | 3 | 5 | 2 | 0 | 0 | 0 |
|----|---|---|---|---|---|---|---|
| 3  | 5 | 2 | 3 | 3 | 2 | 1 | 0 |
| 0  | 2 | 1 | 3 | 1 | 0 | 0 | 0 |
| 3  | 2 | 0 | 0 | 0 | 0 | 0 | 0 |
| 2  | 0 | 0 | 0 | 0 | 0 | 0 | 0 |
| 2  | 0 | 0 | 0 | 0 | 0 | 0 | 0 |
| 0  | 0 | 0 | 0 | 0 | 0 | 0 | 0 |
| 0  | 0 | 0 | 0 | 0 | 0 | 0 | 0 |

DCT-matrix 3

| 12 | 6  | 3 | 6 | 3  | 1 | 0 | 0 |
|----|----|---|---|----|---|---|---|
| 2  | 4  | 3 | 3 | 3  | 1 | 0 | 0 |
| -1 | 0  | 4 | 2 | 2  | 1 | 0 | 0 |
| 4  | 1  | 1 | 2 | -1 | 0 | 0 | 0 |
| 2  | 3  | 0 | 1 | 0  | 0 | 0 | 0 |
| 1  | -1 | 0 | 0 | 0  | 0 | 0 | 0 |
| 0  | 0  | 0 | 0 | 0  | 0 | 0 | 0 |
| 0  | 0  | 0 | 0 | 0  | 0 | 0 | 0 |

DCT-matrix 4

| 13 | 7  | 2 | 5 | 2  | 1  | 0 | 0 |
|----|----|---|---|----|----|---|---|
| 3  | 4  | 2 | 2 | 5  | -1 | 0 | 0 |
| -2 | -1 | 4 | 3 | -1 | 0  | 0 | 0 |
| 2  | -1 | 1 | 2 | 0  | 0  | 0 | 0 |
| 0  | 2  | 0 | 0 | 0  | 0  | 0 | 0 |
| 0  | 0  | 0 | 0 | 0  | 0  | 0 | 0 |
| 0  | 0  | 0 | 0 | 0  | 0  | 0 | 0 |
| 0  | 0  | 0 | 0 | 0  | 0  | 0 | 0 | first cell in each matrix: DC value
other cells in each matrix: AC values

Fig 4

Zig-zag ordering

DCT-matrix 1

| 10 | 4 | 3 | 1 | 4 | 2 | 5 | 1 | 2 | 1 | 2 | 1 | 1 | 2 | 1 | 0 |
|----|---|---|---|---|---|---|---|---|---|---|---|---|---|---|---|
| 1 | 2 | 0 | 1 | 1 | 1 | -1 | -1 | -1 | 1 | 1 | -1 | 0 | 0 | -1 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |

DCT-matrix 2

| 11 | 5 | 3 | 0 | 5 | 3 | 5 | 2 | 2 | 3 | 2 | 2 | 1 | 3 | 2 | 0 |
|----|---|---|---|---|---|---|---|---|---|---|---|---|---|---|---|
| 3 | 3 | 0 | 0 | 2 | 0 | 0 | 0 | 0 | 1 | 2 | 0 | 0 | 1 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |

DCT-matrix 3

| 12 | 6 | 2 | -1 | 4 | 3 | 6 | 3 | 0 | 4 | 2 | 1 | 4 | 3 | 3 | 1 |
|----|---|---|----|---|---|---|---|---|---|---|---|---|---|---|---|
| 3 | 2 | 1 | 3 | 1 | 0 | -1 | 0 | 2 | 2 | 1 | 0 | 0 | 0 | 1 | -1 |
| 1 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |

DCT-matrix 4

| 13 | 7 | 3 | -2 | 4 | 2 | 5 | 2 | -1 | 2 | 0 | -1 | 4 | 2 | 2 | 1 |
|----|---|---|----|---|---|---|---|----|---|---|----|---|---|---|---|
| 5 | 3 | 1 | 2 | 0 | 0 | 0 | 0 | 2 | -1 | -1 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |

Fig 5a.1

Encoding in unique values

Encoding per 2 values (bytes)

| Base Value | Encoding round 1 | | Base Value | Encoding round 1 | |
|---|---|---|---|---|---|
| Value 1 2^8 | 256 | | Value 1 2^8 | 256 | |
| Value 2 2^0 | 1 | | Value 2 2^0 | 1 | |

ENCODING ROUND 1

| DCT-matrix 1 | | | | | DCT-matrix 2 | | | | |
|---|---|---|---|---|---|---|---|---|---|
| Number | DCT values (Data set) | | TCL(0) | PCL(0) | File(0) | DCT values (Data set) | | TCL(0) | PCL(0) | File(0) |
| 1 | 10 | 2560 | | | | 11 | 2816 | | | |
| 2 | 4 | 4 | 2564 | 2564 | 1 | 5 | 5 | 2821 | 2821 | 15 |
| 3 | 3 | 768 | | | | 3 | 768 | | | |
| 4 | 1 | 1 | 769 | 769 | 2 | 0 | 0 | 768 | 768 | 16 |
| 5 | 4 | 1024 | | | | 5 | 1280 | | | |
| 6 | 2 | 2 | 1026 | 1026 | 3 | 3 | 3 | 1283 | 1283 | 17 |
| 7 | 5 | 1280 | | | | 5 | 1280 | | | |
| 8 | 1 | 1 | 1281 | 1281 | 4 | 2 | 2 | 1282 | 1282 | 18 |
| 9 | 2 | 512 | | | | 2 | 512 | | | |
| 10 | 1 | 1 | 513 | 513 | 5 | 3 | 3 | 515 | 515 | 19 |
| 11 | 2 | 512 | | | | 2 | 512 | | | |
| 12 | 1 | 1 | 513 | | 5 | 2 | 2 | 514 | 514 | 20 |
| 13 | 1 | 256 | | | | 1 | 256 | | | |
| 14 | 2 | 2 | 258 | 258 | 6 | 3 | 3 | 259 | 259 | 21 |
| 15 | 1 | 256 | | | | 2 | 512 | | | |
| 16 | 0 | 0 | 256 | 256 | 7 | 0 | 0 | 512 | 512 | 22 |
| 17 | 1 | 256 | | | | 3 | 768 | | | |
| 18 | 2 | 2 | 258 | | 6 | 3 | 3 | 771 | 771 | 23 |
| 19 | 0 | 0 | | | | 0 | 0 | | | |
| 20 | 1 | 1 | 1 | 1 | 8 | 0 | 0 | 0 | | 13 |
| 21 | 1 | 256 | | | | 2 | 512 | | | |
| 22 | 1 | 1 | 257 | 257 | 9 | 0 | 0 | 512 | | 22 |
| 23 | -1 | -256 | | | | 0 | 0 | | | |
| 24 | -1 | -1 | -257 | -257 | 10 | 0 | 0 | 0 | | 13 |
| 25 | -1 | -256 | | | | 0 | 0 | | | |
| 26 | 1 | 1 | -255 | -255 | 11 | 1 | 1 | 1 | | 8 |
| 27 | 1 | 256 | | | | 2 | 512 | | | |
| 28 | -1 | -1 | 255 | 255 | 12 | 0 | 0 | 512 | | 22 |
| 29 | 0 | 0 | | | | 0 | 0 | | | |
| 30 | 0 | 0 | 0 | 0 | 13 | 1 | 1 | 1 | | 8 |
| 31 | -1 | -256 | | | | 0 | 0 | | | |
| 32 | 0 | 0 | -256 | -256 | 14 | 0 | 0 | 0 | | 13 |
| 33 | 0 | 0 | | | | 0 | 0 | | | |
| 34 | 0 | 0 | 0 | | 13 | 0 | 0 | 0 | | 13 |

Fig 5a.2

Encoding in unique values

Encoding per 2 values (bytes)

| Base Value | Encoding round 1 | | Base Value | Encoding round 1 | |
|---|---|---|---|---|---|
| Value 1 2^8 | 256 | | Value 1 2^8 | 256 | |
| Value 2 2^0 | 1 | | Value 2 2^0 | 1 | |

DCT-matrix 3

| Number | DCT values (Data set) | | TCL(0) | PCL(0) | File(0) |
|---|---|---|---|---|---|
| 1 | 12 | 3072 | | | |
| 2 | 6 | 6 | 3078 | 3078 | 24 |
| 3 | 2 | 512 | | | |
| 4 | -1 | -1 | 511 | 511 | 25 |
| 5 | 4 | 1024 | | | |
| 6 | 3 | 3 | 1027 | 1027 | 26 |
| 7 | 6 | 1536 | | | |
| 8 | 3 | 3 | 1539 | 1539 | 27 |
| 9 | 0 | 0 | | | |
| 10 | 4 | 4 | 4 | 4 | 28 |
| 11 | 2 | 512 | | | |
| 12 | 1 | 1 | 513 | | 5 |
| 13 | 4 | 1024 | | | |
| 14 | 3 | 3 | 1027 | | 26 |
| 15 | 3 | 768 | | | |
| 16 | 1 | 1 | 769 | | 2 |
| 17 | 3 | 768 | | | |
| 18 | 2 | 2 | 770 | 770 | 29 |
| 19 | 1 | 256 | | | |
| 20 | 3 | 3 | 259 | | 21 |
| 21 | 1 | 256 | | | |
| 22 | 0 | 0 | 256 | | 7 |
| 23 | -1 | -256 | | | |
| 24 | 0 | 0 | -256 | | 14 |
| 25 | 2 | 512 | | | |
| 26 | 2 | 2 | 514 | | 20 |
| 27 | 1 | 256 | | | |
| 28 | 0 | 0 | 256 | | 7 |
| 29 | 0 | 0 | | | |
| 30 | 0 | 0 | 0 | | 13 |
| 31 | 1 | 256 | | | |
| 32 | -1 | -1 | 255 | | 12 |
| 33 | 1 | 256 | | | |
| 34 | 0 | 0 | 256 | | 7 |

DCT-matrix 4

| DCT values (Data set) | | TCL(0) | PCL(0) | File(0) |
|---|---|---|---|---|
| 13 | 3328 | | | |
| 7 | 7 | 3335 | 3335 | 30 |
| 3 | 768 | | | |
| -2 | -2 | 766 | 766 | 31 |
| 4 | 1024 | | | |
| 2 | 2 | 1026 | | 3 |
| 5 | 1280 | | | |
| 2 | 2 | 1282 | | 18 |
| -1 | -256 | | | |
| 2 | 512 | 256 | | 7 |
| 0 | 0 | | | |
| -1 | -1 | -1 | -1 | 32 |
| 4 | 1024 | | | |
| 2 | 2 | 1026 | | 3 |
| 2 | 512 | | | |
| 1 | 1 | 513 | | 5 |
| 5 | 1280 | | | |
| 3 | 3 | 1283 | | 17 |
| 1 | 256 | | | |
| 2 | 2 | 258 | | 6 |
| 0 | 0 | | | |
| 0 | 0 | 0 | | 13 |
| 0 | 0 | | | |
| 0 | 0 | 0 | | 13 |
| 2 | 512 | | | |
| -1 | -1 | 511 | | 25 |
| -1 | -256 | | | |
| 0 | 0 | -256 | | 14 |
| 0 | 0 | | | |
| 0 | 0 | 0 | | 13 |
| 0 | 0 | | | |
| 0 | 0 | 0 | | 13 |
| 0 | 0 | | | |
| 0 | 0 | 0 | | 13 |

Fig 5b.1

Encoding in unique values
Encoding per 2 values (bytes)

| Base  | Encoding round 1 | | Base | Encoding round 1 |
|---|---|---|---|---|
| Value | | | Value | |
| Value 1 2^8 | 256 | | Value 1 2^8 | 256 |
| Value 2 2^0 | 1 | | Value 2 2^0 | 1 |

ENCODING ROUND 1

DCT-matrix 1                                    DCT-matrix 2

| DCT values Number (Data set) | TCL(0) | PCL(0) | File(0) | DCT values (Data set) | TCL(0) | PCL(0) | File(0) |
|---|---|---|---|---|---|---|---|
| 35 | 0 | 0 |    | 0 | 0 |   |    |
| 36 | 0 | 0 | 0 | 13 | 0 | 0 | 0 | 13 |
| 37 | 0 | 0 |    | 0 | 0 |   |    |
| 38 | 0 | 0 | 0 | 13 | 0 | 0 | 0 | 13 |
| 39 | 0 | 0 |    | 0 | 0 |   |    |
| 40 | 0 | 0 | 0 | 13 | 0 | 0 | 0 | 13 |
| 41 | 0 | 0 |    | 0 | 0 |   |    |
| 42 | 0 | 0 | 0 | 13 | 0 | 0 | 0 | 13 |
| 43 | 0 | 0 |    | 0 | 0 |   |    |
| 44 | 0 | 0 | 0 | 13 | 0 | 0 | 0 | 13 |
| 45 | 0 | 0 |    | 0 | 0 |   |    |
| 46 | 0 | 0 | 0 | 13 | 0 | 0 | 0 | 13 |
| 47 | 0 | 0 |    | 0 | 0 |   |    |
| 48 | 0 | 0 | 0 | 13 | 0 | 0 | 0 | 13 |
| 49 | 0 | 0 |    | 0 | 0 |   |    |
| 50 | 0 | 0 | 0 | 13 | 0 | 0 | 0 | 13 |
| 51 | 0 | 0 |    | 0 | 0 |   |    |
| 52 | 0 | 0 | 0 | 13 | 0 | 0 | 0 | 13 |
| 53 | 0 | 0 |    | 0 | 0 |   |    |
| 54 | 0 | 0 | 0 | 13 | 0 | 0 | 0 | 13 |
| 55 | 0 | 0 |    | 0 | 0 |   |    |
| 56 | 0 | 0 | 0 | 13 | 0 | 0 | 0 | 13 |
| 57 | 0 | 0 |    | 0 | 0 |   |    |
| 58 | 0 | 0 | 0 | 13 | 0 | 0 | 0 | 13 |
| 59 | 0 | 0 |    | 0 | 0 |   |    |
| 60 | 0 | 0 | 0 | 13 | 0 | 0 | 0 | 13 |
| 61 | 0 | 0 |    | 0 | 0 |   |    |
| 62 | 0 | 0 | 0 | 13 | 0 | 0 | 0 | 13 |
| 63 | 0 | 0 |    | 0 | 0 |   |    |
| 64 | 0 | 0 | 0 | 13 | 0 | 0 | 0 | 13 |

Fig 5b.2

Encoding in unique values

Encoding per 2 values (bytes)

| Base Value | Encoding round 1 | | Base Value | Encoding round 1 | |
|---|---|---|---|---|---|
| Value 1 $2^8$ | 256 | | Value 1 $2^8$ | 256 | |
| Value 2 $2^0$ | 1 | | Value 2 $2^0$ | 1 | |

DCT-matrix 3

| DCT values Number | (Data set) | TCL(0) | PCL(0) | File(0) |
|---|---|---|---|---|
| 35 | 0 | 0 | | |
| 36 | 0 | 0 | 0 | 13 |
| 37 | 0 | 0 | | |
| 38 | 0 | 0 | 0 | 13 |
| 39 | 0 | 0 | | |
| 40 | 0 | 0 | 0 | 13 |
| 41 | 0 | 0 | | |
| 42 | 0 | 0 | 0 | 13 |
| 43 | 0 | 0 | | |
| 44 | 0 | 0 | 0 | 13 |
| 45 | 0 | 0 | | |
| 46 | 0 | 0 | 0 | 13 |
| 47 | 0 | 0 | | |
| 48 | 0 | 0 | 0 | 13 |
| 49 | 0 | 0 | | |
| 50 | 0 | 0 | 0 | 13 |
| 51 | 0 | 0 | | |
| 52 | 0 | 0 | 0 | 13 |
| 53 | 0 | 0 | | |
| 54 | 0 | 0 | 0 | 13 |
| 55 | 0 | 0 | | |
| 56 | 0 | 0 | 0 | 13 |
| 57 | 0 | 0 | | |
| 58 | 0 | 0 | 0 | 13 |
| 59 | 0 | 0 | | |
| 60 | 0 | 0 | 0 | 13 |
| 61 | 0 | 0 | | |
| 62 | 0 | 0 | 0 | 13 |
| 63 | 0 | 0 | | |
| 64 | 0 | 0 | 0 | 13 |

DCT-matrix 4

| DCT values (Data set) | | TCL(0) | PCL(0) | File(0) |
|---|---|---|---|---|
| 0 | 0 | | | |
| 0 | 0 | 0 | 13 | |
| 0 | 0 | | | |
| 0 | 0 | 0 | 13 | |
| 0 | 0 | | | |
| 0 | 0 | 0 | 13 | |
| 0 | 0 | | | |
| 0 | 0 | 0 | 13 | |
| 0 | 0 | | | |
| 0 | 0 | 0 | 13 | |
| 0 | 0 | | | |
| 0 | 0 | 0 | 13 | |
| 0 | 0 | | | |
| 0 | 0 | 0 | 13 | |
| 0 | 0 | | | |
| 0 | 0 | 0 | 13 | |
| 0 | 0 | | | |
| 0 | 0 | 0 | 13 | |
| 0 | 0 | | | |
| 0 | 0 | 0 | 13 | |
| 0 | 0 | | | |
| 0 | 0 | 0 | 13 | |
| 0 | 0 | | | |
| 0 | 0 | 0 | 13 | |
| 0 | 0 | | | |
| 0 | 0 | 0 | 13 | |
| 0 | 0 | | | |
| 0 | 0 | 0 | 13 | |
| 0 | 0 | | | |
| 0 | 0 | 0 | 13 | |

Fig 6.1

ENCODING ROUND 2

| Base values | | | | Base values | | | |
|---|---|---|---|---|---|---|---|
| Value 1 | 2^16 | 65536 | | Value 1 | 2^16 | 65536 | |
| Value 2 | 2^0 | 1 | | Value 2 | 2^0 | 1 | |
| File(0) | | TCL(1) | PCL(1) File(1) | File(0) | | TCL(1) | PCL(1) File(1) |
| 1 | 65536 | | | 15 | 983040 | | |
| 2 | 2 | 65538 | 65538    1 | 16 | 16 | 983056 | 983056   10 |
| 3 | 196608 | | | 17 | 1114112 | | |
| 4 | 4 | 196612 | 196612    2 | 18 | 18 | 1114130 | 1114130   11 |
| 5 | 327680 | | | 19 | 1245184 | | |
| 5 | 5 | 327685 | 327685    3 | 20 | 20 | 1245204 | 1245204   12 |
| 6 | 393216 | | | 21 | 1376256 | | |
| 7 | 7 | 393223 | 393223    4 | 22 | 22 | 1376278 | 1376278   13 |
| 6 | 393216 | | | 23 | 1507328 | | |
| 8 | 8 | 393224 | 393224    5 | 13 | 13 | 1507341 | 1507341   14 |
| 9 | 589824 | | | 22 | 1441792 | | |
| 10 | 10 | 589834 | 589834    6 | 13 | 13 | 1441805 | 1441805   15 |
| 11 | 720896 | | | 8 | 524288 | | |
| 12 | 12 | 720908 | 720908    7 | 22 | 22 | 524310 | 524310   16 |
| 13 | 851968 | | | 8 | 524288 | | |
| 14 | 14 | 851982 | 851982    8 | 13 | 13 | 524301 | 524301   17 |
| 13 | 851968 | | | 13 | 851968 | | |
| 13 | 13 | 851981 | 851981    9 | 13 | 13 | 851981 | 9 |
| 13 | 851968 | | | 13 | 851968 | | |
| 13 | 13 | 851981 | 9 | 13 | 13 | 851981 | 9 |
| 13 | 851968 | | | 13 | 851968 | | |
| 13 | 13 | 851981 | 9 | 13 | 13 | 851981 | 9 |
| 13 | 851968 | | | 13 | 851968 | | |
| 13 | 13 | 851981 | 9 | 13 | 13 | 851981 | 9 |
| 13 | 851.968 | | | 13 | 851.968 | | |
| 13 | 13 | 851981 | 9 | 13 | 13 | 851981 | 9 |
| 13 | 851.968 | | | 13 | 851.968 | | |
| 13 | 13 | 851981 | 9 | 13 | 13 | 851981 | 9 |
| 13 | 851.968 | | | 13 | 851.968 | | |
| 13 | 13 | 851981 | 9 | 13 | 13 | 851981 | 9 |
| 13 | 851.968 | | | 13 | 851.968 | | |
| 13 | 13 | 851981 | 9 | 13 | 13 | 851981 | 9 |

Fig 6.2

| Base values | | | | Base values | | | |
|---|---|---|---|---|---|---|---|
| Value 1 | 2^16 | 65536 | | Value 1 | 2^16 | 65536 | |
| Value 2 | 2^0 | 1 | | Value 2 | 2^0 | 1 | |
| File(0) | | TCL(1) | PCL(1) File(1) | File(0) | | TCL(1) | PCL(1) File(1) |
| 24 | 1572864 | | | 30 | 1966080 | | |
| 25 | 25 | 1572889 | 1572889   18 | 31 | 31 | 1966111 | 1966111   27 |
| 26 | 1703936 | | | 3 | 196608 | | |
| 27 | 27 | 1703963 | 1703963   19 | 18 | 18 | 196626 | 196626   28 |
| 28 | 1835008 | | | 7 | 458752 | | |
| 5 | 5 | 1835013 | 1835013   20 | 32 | 32 | 458784 | 458784   29 |
| 26 | 1703936 | | | 3 | 196608 | | |
| 2 | 2 | 1703938 | 1703938   21 | 5 | 5 | 196613 | 196613   30 |
| 29 | 1900544 | | | 17 | 1114112 | | |
| 21 | 21 | 1900565 | 1900565   22 | 6 | 6 | 1114118 | 1114118   31 |
| 7 | 458752 | | | 13 | 851968 | | |
| 14 | 14 | 458766 | 458766   23 | 13 | 13 | 851981 | 9 |
| 20 | 1310720 | | | 25 | 1638400 | | |
| 7 | 7 | 1310727 | 1310727   24 | 14 | 14 | 1638414 | 1638414   32 |
| 13 | 851968 | | | 13 | 851968 | | |
| 12 | 12 | 851980 | 851980   25 | 13 | 13 | 851981 | 9 |
| 7 | 458752 | | | 13 | 851968 | | |
| 13 | 13 | 458765 | 458765   26 | 13 | 13 | 851981 | 9 |
| 13 | 851968 | | | 13 | 851968 | | |
| 13 | 13 | 851981 | 9 | 13 | 13 | 851981 | 9 |
| 13 | 851968 | | | 13 | 851968 | | |
| 13 | 13 | 851981 | 9 | 13 | 13 | 851981 | 9 |
| 13 | 851968 | | | 13 | 851968 | | |
| 13 | 13 | 851981 | 9 | 13 | 13 | 851981 | 9 |
| 13 | 851.968 | | | 13 | 851.968 | | |
| 13 | 13 | 851981 | 9 | 13 | 13 | 851981 | 9 |
| 13 | 851.968 | | | 13 | 851.968 | | |
| 13 | 13 | 851981 | 9 | 13 | 13 | 851981 | 9 |
| 13 | 851.968 | | | 13 | 851.968 | | |
| 13 | 13 | 851981 | 9 | 13 | 13 | 851981 | 9 |
| 13 | 851.968 | | | 13 | 851.968 | | |
| 13 | 13 | 851981 | 9 | 13 | 13 | 851981 | 9 |

Fig 7

| Reference database 1 | | | Reference database 2 | |
|---|---|---|---|---|
| Encoding round 1 | Number of times in database | | Encoding round 2 | Number of times in database |
| 2564 | 1 | 1 | 65538 | 1 |
| 769 | 2 | 2 | 196612 | 1 |
| 1026 | 3 | 3 | 327685 | 1 |
| 1281 | 4 | 1 | 393223 | 1 |
| 513 | 5 | 4 | 393224 | 1 |
| 258 | 6 | 3 | 589834 | 1 |
| 256 | 7 | 5 | 720908 | 1 |
| 1 | 8 | 3 | 851982 | 1 |
| 257 | 9 | 1 | 851981 | 33 |
| -257 | 10 | 1 | 983056 | 1 |
| -255 | 11 | 1 | 1114130 | 1 |
| 255 | 12 | 2 | 1245204 | 1 |
| 0 | 13 | 72 | 1376278 | 1 |
| -256 | 14 | 3 | 1507341 | 1 |
| 2821 | 15 | 1 | 1441805 | 1 |
| 768 | 16 | 1 | 524310 | 1 |
| 1283 | 17 | 2 | 524301 | 1 |
| 1282 | 18 | 2 | 1572889 | 1 |
| 515 | 19 | 1 | 1703963 | 1 |
| 514 | 20 | 2 | 1835013 | 1 |
| 259 | 21 | 2 | 1703938 | 1 |
| 512 | 22 | 3 | 1900565 | 1 |
| 771 | 23 | 1 | 1310727 | 1 |
| 3078 | 24 | 1 | 458766 | 1 |
| 511 | 25 | 2 | 851980 | 1 |
| 1027 | 26 | 1 | 458765 | 1 |
| 1539 | 27 | 1 | 1966111 | 1 |
| 4 | 28 | 1 | 196626 | 1 |
| 770 | 29 | 1 | 458784 | 1 |
| 3335 | 30 | 1 | 196613 | 1 |
| 766 | 31 | 1 | 1114118 | 1 |
| -1 | 32 | 1 | 1638414 | 1 |

Fig 8

Minimum standard reference database
(Most frequent value at lowest possible position in reference database)

Encoding round 1

| Key code | |
|---|---|
| 0 | 1 |
| 256 | 2 |
| 513 | 3 |
| 1 | 4 |
| 258 | 5 |
| 512 | 6 |
| -256 | 7 |
| 1026 | 8 |
| 769 | 9 |
| 255 | 10 |
| 514 | 11 |
| 259 | 12 |
| 511 | 13 |
| 1282 | 14 |
| 1283 | 15 |
| -257 | 16 |
| -255 | 17 |
| -1 | 18 |
| 4 | 19 |
| 257 | 20 |
| 515 | 21 |
| 766 | 22 |
| 769 | 23 |
| 770 | 24 |
| 771 | 25 |
| 1027 | 26 |
| 1281 | 27 |
| 1539 | 28 |
| 2564 | 29 |
| 2821 | 30 |
| 3335 | 31 |
| 3078 | 32 |

Encoding round 2

| Key code | |
|---|---|
| 65537 | 1 |
| 65544 | 2 |
| 65547 | 3 |
| 196609 | 4 |
| 196616 | 5 |
| 196627 | 6 |
| 262148 | 7 |
| 327681 | 8 |
| 327687 | 9 |
| 393219 | 10 |
| 393221 | 11 |
| 458753 | 12 |
| 589828 | 13 |
| 589839 | 14 |
| 589852 | 15 |
| 786435 | 16 |
| 851975 | 17 |
| 917512 | 18 |
| 1048582 | 19 |
| 1048591 | 20 |
| 1179659 | 21 |
| 1310724 | 22 |
| 1376273 | 23 |
| 1441804 | 24 |
| 1638413 | 25 |
| 1703937 | 26 |
| 1769482 | 27 |
| 1769501 | 28 |
| 1966090 | 29 |
| 2031640 | 30 |
| 2097166 | 31 |
| 2162711 | 32 |

Minimum standard reference database

Fig 9a.1

Encoding in unique values
Encoding per 2 values (bytes)

| Base Value | Encoding round 1 | | | | | Base Value | Encoding round 1 | | | | |
|---|---|---|---|---|---|---|---|---|---|---|---|
| Value 1 | 2^8 | 256 | | | | Value 1 | 2^8 | 256 | | | |
| Value 2 | 2^0 | 1 | | | | Value 2 | 2^0 | 1 | | | |

Encoding round 1

DCT-matrix 1

| Number | DCT values (Data set) | | TCL(0) | PCL(0) | File(0) |
|---|---|---|---|---|---|
| 1 | 10 | 2560 | | | |
| 2 | 4 | 4 | 2564 | 2564 | 29 |
| 3 | 3 | 768 | | | |
| 4 | 1 | 1 | 769 | 769 | 9 |
| 5 | 4 | 1024 | | | |
| 6 | 2 | 2 | 1026 | 1026 | 8 |
| 7 | 5 | 1280 | | | |
| 8 | 1 | 1 | 1281 | 1281 | 27 |
| 9 | 2 | 512 | | | |
| 10 | 1 | 1 | 513 | 513 | 3 |
| 11 | 2 | 512 | | | |
| 12 | 1 | 1 | 513 | | 3 |
| 13 | 1 | 256 | | | |
| 14 | 2 | 2 | 258 | 258 | 5 |
| 15 | 1 | 256 | | | |
| 16 | 0 | 0 | 256 | 256 | 2 |
| 17 | 1 | 256 | | | |
| 18 | 2 | 2 | 258 | | 5 |
| 19 | 0 | 0 | | | |
| 20 | 1 | 1 | 1 | 1 | 4 |
| 21 | 1 | 256 | | | |
| 22 | 1 | 1 | 257 | 257 | 20 |
| 23 | -1 | -256 | | | |
| 24 | -1 | -1 | -257 | -257 | 16 |
| 25 | -1 | -256 | | | |
| 26 | 1 | 1 | -255 | -255 | 17 |
| 27 | 1 | 256 | | | |
| 28 | -1 | -1 | 255 | 255 | 10 |
| 29 | 0 | 0 | | | |
| 30 | 0 | 0 | 0 | 0 | 1 |
| 31 | -1 | -256 | | | |
| 32 | 0 | 0 | -256 | -256 | 7 |
| 33 | 0 | 0 | | | |
| 34 | 0 | 0 | | 0 | 1 |

DCT-matrix 2

| | DCT values (Data set) | | TCL(0) | PCL(0) | File(0) |
|---|---|---|---|---|---|
| | 11 | 2816 | | | |
| | 5 | 5 | 2821 | 2821 | 30 |
| | 3 | 768 | | | |
| | 0 | 0 | 768 | 768 | 23 |
| | 5 | 1280 | | | |
| | 3 | 3 | 1283 | 1283 | 15 |
| | 5 | 1280 | | | |
| | 2 | 2 | 1282 | 1282 | 14 |
| | 2 | 512 | | | |
| | 3 | 3 | 515 | 515 | 21 |
| | 2 | 512 | | | |
| | 2 | 2 | 514 | 514 | 11 |
| | 1 | 256 | | | |
| | 3 | 3 | 259 | 259 | 12 |
| | 2 | 512 | | | |
| | 0 | 0 | 512 | 512 | 6 |
| | 3 | 768 | | | |
| | 3 | 3 | 771 | 771 | 25 |
| | 0 | 0 | | | |
| | 0 | 0 | 0 | | 1 |
| | 2 | 512 | | | |
| | 0 | 0 | 512 | | 6 |
| | 0 | 0 | | | |
| | 0 | 0 | 0 | | 1 |
| | 0 | 0 | | | |
| | 1 | 1 | 1 | | 4 |
| | 2 | 512 | | | |
| | 0 | 0 | 512 | | 6 |
| | 0 | 0 | | | |
| | 1 | 1 | 1 | | 4 |
| | 0 | 0 | | | |
| | 0 | 0 | 0 | | 1 |
| | 0 | 0 | | | |
| | 0 | 0 | 0 | | 1 |

*Fig 9a.2*

| Base Value | Encoding round 1 | |
|---|---|---|
| Value 1 | 2^8 | 256 |
| Value 2 | 2^0 | 1 |

DCT-matrix 3

| DCT values Number | (Data set) | | TCL(0) | PCL(0) | File(0) |
|---|---|---|---|---|---|
| 1 | 12 | 3072 | | | |
| 2 | 6 | 6 | 3078 | 3078 | 31 |
| 3 | 2 | 512 | | | |
| 4 | -1 | -1 | 511 | 511 | 13 |
| 5 | 4 | 1024 | | | |
| 6 | 3 | 3 | 1027 | 1027 | 26 |
| 7 | 6 | 1536 | | | |
| 8 | 3 | 3 | 1539 | 1539 | 28 |
| 9 | 0 | 0 | | | |
| 10 | 4 | 4 | 4 | 4 | 19 |
| 11 | 2 | 512 | | | |
| 12 | 1 | 1 | 513 | | 3 |
| 13 | 4 | 1024 | | | |
| 14 | 3 | 3 | 1027 | 1027 | 26 |
| 15 | 3 | 768 | | | |
| 16 | 1 | 1 | 769 | | 9 |
| 17 | 3 | 768 | | | |
| 18 | 2 | 2 | 770 | 770 | 24 |
| 19 | 1 | 256 | | | |
| 20 | 3 | 3 | 259 | | 12 |
| 21 | 1 | 256 | | | |
| 22 | 0 | 0 | 256 | | 2 |
| 23 | -1 | -256 | | | |
| 24 | 0 | 0 | -256 | | 7 |
| 25 | 2 | 512 | | | |
| 26 | 2 | 2 | 514 | | 11 |
| 27 | 1 | 256 | | | |
| 28 | 0 | 0 | 256 | | 2 |
| 29 | 0 | 0 | | | |
| 30 | 0 | 0 | 0 | | 1 |
| 31 | 1 | 256 | | | |
| 32 | -1 | -1 | 255 | | 10 |
| 33 | 1 | 256 | | | |
| 34 | 0 | 0 | 256 | | 2 |

| Base Value | Encoding round 1 | |
|---|---|---|
| Value 1 | 2^8 | 256 |
| Value 2 | 2^0 | 1 |

DCT-matrix 4

| DCT values | (Data set) | | TCL(0) | PCL(0) | File(0) |
|---|---|---|---|---|---|
| 1 | 13 | 3328 | | | |
| 2 | 7 | 7 | 3335 | 3335 | 32 |
| 3 | 3 | 768 | | | |
| 4 | -2 | -2 | 766 | 766 | 22 |
| 5 | 4 | 1024 | | | |
| 6 | 2 | 2 | 1026 | | 8 |
| 7 | 5 | 1280 | | | |
| 8 | 2 | 2 | 1282 | 1282 | 14 |
| 9 | -1 | -256 | | | |
| 10 | 2 | 512 | 256 | | 2 |
| 11 | 0 | 0 | | | |
| 12 | -1 | -1 | -1 | -1 | 18 |
| 13 | 4 | 1024 | | | |
| 14 | 2 | 2 | 1026 | | 8 |
| 15 | 2 | 512 | | | |
| 16 | 1 | 1 | 513 | | 3 |
| 17 | 5 | 1280 | | | |
| 18 | 3 | 3 | 1283 | 1283 | 15 |
| 19 | 1 | 256 | | | |
| 20 | 2 | 2 | 258 | | 5 |
| 21 | 0 | 0 | | | |
| 22 | 0 | 0 | 0 | | 1 |
| 23 | 0 | 0 | | | |
| 24 | 0 | 0 | 0 | | 1 |
| 25 | 2 | 512 | | | |
| 26 | -1 | -1 | 511 | | 13 |
| 27 | -1 | -256 | | | |
| 28 | 0 | 0 | -256 | | 7 |
| 29 | 0 | 0 | | | |
| 30 | 0 | 0 | 0 | | 1 |
| 31 | 0 | 0 | | | |
| 32 | 0 | 0 | 0 | | 1 |
| 33 | 0 | 0 | | | |
| 34 | 0 | 0 | 0 | | 1 |

Fig 9b.1

Encoding in unique values
Encoding per 2 values (bytes)

| Base | Encoding round 1 | | | | Base | Encoding round 1 | | |
|---|---|---|---|---|---|---|---|---|
| Value | | | | | Value | | | |
| Value 1 | $2^8$ | 256 | | | Value 1 | $2^8$ | 256 | |
| Value 2 | $2^0$ | 1 | | | Value 2 | $2^0$ | 1 | |

Encoding round 1

DCT-matrix 1                                          DCT-matrix 2

| Number | DCT values (Data set) | | TCL(0) | PCL(0) | File(0) | DCT values (Data set) | | TCL(0) | PCL(0) | File(0) |
|---|---|---|---|---|---|---|---|---|---|---|
| 35 | 0 | 0 | | | | 0 | 0 | | | |
| 36 | 0 | 0 | 0 | | 1 | 0 | 0 | 0 | | 1 |
| 37 | 0 | 0 | | | | 0 | 0 | | | |
| 38 | 0 | 0 | 0 | | 1 | 0 | 0 | 0 | | 1 |
| 39 | 0 | 0 | | | | 0 | 0 | | | |
| 40 | 0 | 0 | 0 | | 1 | 0 | 0 | 0 | | 1 |
| 41 | 0 | 0 | | | | 0 | 0 | | | |
| 42 | 0 | 0 | 0 | | 1 | 0 | 0 | 0 | | 1 |
| 43 | 0 | 0 | | | | 0 | 0 | | | |
| 44 | 0 | 0 | 0 | | 1 | 0 | 0 | 0 | | 1 |
| 45 | 0 | 0 | | | | 0 | 0 | | | |
| 46 | 0 | 0 | 0 | | 1 | 0 | 0 | 0 | | 1 |
| 47 | 0 | 0 | | | | 0 | 0 | | | |
| 48 | 0 | 0 | 0 | | 1 | 0 | 0 | 0 | | 1 |
| 49 | 0 | 0 | | | | 0 | 0 | | | |
| 50 | 0 | 0 | 0 | | 1 | 0 | 0 | 0 | | 1 |
| 51 | 0 | 0 | | | | 0 | 0 | | | |
| 52 | 0 | 0 | 0 | | 1 | 0 | 0 | 0 | | 1 |
| 53 | 0 | 0 | | | | 0 | 0 | | | |
| 54 | 0 | 0 | 0 | | 1 | 0 | 0 | 0 | | 1 |
| 55 | 0 | 0 | | | | 0 | 0 | | | |
| 56 | 0 | 0 | 0 | | 1 | 0 | 0 | 0 | | 1 |
| 57 | 0 | 0 | | | | 0 | 0 | | | |
| 58 | 0 | 0 | 0 | | 1 | 0 | 0 | 0 | | 1 |
| 59 | 0 | 0 | | | | 0 | 0 | | | |
| 60 | 0 | 0 | 0 | | 1 | 0 | 0 | 0 | | 1 |
| 61 | 0 | 0 | | | | 0 | 0 | | | |
| 62 | 0 | 0 | 0 | | 1 | 0 | 0 | 0 | | 1 |
| 63 | 0 | 0 | | | | 0 | 0 | | | |
| 64 | 0 | 0 | 0 | | 1 | 0 | 0 | 0 | | 1 |

Fig 9b.2

Base   Encoding round 1
Value
Value 1   2^8   256
Value 2   2^0   1

Base   Encoding round 1
Value
Value 1   2^8   256
Value 2   2^0   1

| DCT-matrix 3 | | | | | DCT-matrix 4 | | | | |
|---|---|---|---|---|---|---|---|---|---|
| DCT values Number (Data set) | | TCL(0) | PCL(0) | File(0) | DCT values (Data set) | | TCL(0) | PCL(0) | File(0) |
| 35 | 0 | 0 | | | 0 | 0 | | | |
| 36 | 0 | 0 | 0 | 1 | 0 | 0 | 0 | | 1 |
| 37 | 0 | 0 | | | 0 | 0 | | | |
| 38 | 0 | 0 | 0 | 1 | 0 | 0 | 0 | | 1 |
| 39 | 0 | 0 | | | 0 | 0 | | | |
| 40 | 0 | 0 | 0 | 1 | 0 | 0 | 0 | | 1 |
| 41 | 0 | 0 | | | 0 | 0 | | | |
| 42 | 0 | 0 | 0 | 1 | 0 | 0 | 0 | | 1 |
| 43 | 0 | 0 | | | 0 | 0 | | | |
| 44 | 0 | 0 | 0 | 1 | 0 | 0 | 0 | | 1 |
| 45 | 0 | 0 | | | 0 | 0 | | | |
| 46 | 0 | 0 | 0 | 1 | 0 | 0 | 0 | | 1 |
| 47 | 0 | 0 | | | 0 | 0 | | | |
| 48 | 0 | 0 | 0 | 1 | 0 | 0 | 0 | | 1 |
| 49 | 0 | 0 | | | 0 | 0 | | | |
| 50 | 0 | 0 | 0 | 1 | 0 | 0 | 0 | | 1 |
| 51 | 0 | 0 | | | 0 | 0 | | | |
| 52 | 0 | 0 | 0 | 1 | 0 | 0 | 0 | | 1 |
| 53 | 0 | 0 | | | 0 | 0 | | | |
| 54 | 0 | 0 | 0 | 1 | 0 | 0 | 0 | | 1 |
| 55 | 0 | 0 | | | 0 | 0 | | | |
| 56 | 0 | 0 | 0 | 1 | 0 | 0 | 0 | | 1 |
| 57 | 0 | 0 | | | 0 | 0 | | | |
| 58 | 0 | 0 | 0 | 1 | 0 | 0 | 0 | | 1 |
| 59 | 0 | 0 | | | 0 | 0 | | | |
| 60 | 0 | 0 | 0 | 1 | 0 | 0 | 0 | | 1 |
| 61 | 0 | 0 | | | 0 | 0 | | | |
| 62 | 0 | 0 | 0 | 1 | 0 | 0 | 0 | | 1 |
| 63 | 0 | 0 | | | 0 | 0 | | | |
| 64 | 0 | 0 | 0 | 1 | 0 | 0 | 0 | | 1 |

Fig 10.1

Encoding round 2

| base value | | | | | base value | | | | |
|---|---|---|---|---|---|---|---|---|---|
| value 1 | 2^32 | 65536 | | | value 1 | 2^32 | 65536 | | |
| value 2 | 2^0 | 1 | | | value 2 | 2^0 | 1 | | |
| File(0) | | TCL(1) | PCL(1) | File(1) | File(0) | | TCL(1) | PCL(1) | File(1) |
| 29 | 1900544 | | | | 30 | 1966080 | | | |
| 9 | 9 | 1900553 | 1900553 | 29 | 23 | 23 | 1966103 | 1966103 | 30 |
| 8 | 524288 | | | | 15 | 983040 | | | |
| 27 | 27 | 524315 | 524315 | 15 | 14 | 14 | 983054 | 983054 | 20 |
| 3 | 196608 | | | | 21 | 1376256 | | | |
| 3 | 3 | 196611 | 196611 | 7 | 11 | 11 | 1376267 | 1376267 | 24 |
| 5 | 327680 | | | | 12 | 786432 | | | |
| 2 | 2 | 327682 | 327682 | 10 | 6 | 6 | 786438 | 786438 | 17 |
| 5 | 327680 | | | | 25 | 1638400 | | | |
| 4 | 4 | 327684 | 327684 | 11 | 1 | 1 | 1638401 | 1638401 | 26 |
| 20 | 1310720 | | | | 6 | 393216 | | | |
| 16 | 16 | 1310736 | 1310736 | 23 | 1 | 1 | 393217 | 393217 | 12 |
| 17 | 1114112 | | | | 4 | 262144 | | | |
| 10 | 10 | 1114122 | 1114122 | 21 | 6 | 6 | 262150 | 262150 | 9 |
| 1 | 65536 | | | | 4 | 262144 | | | |
| 7 | 7 | 65543 | 65543 | 2 | 1 | 1 | 262145 | 262145 | 8 |
| 1 | 65536 | | | | 1 | 65536 | | | |
| 1 | 1 | 65537 | 65537 | 1 | 1 | 1 | 65537 | | 1 |
| 1 | 65536 | | | | 1 | 65536 | | | |
| 1 | 1 | 65537 | | 1 | 1 | 1 | 65537 | | 1 |
| 1 | 65536 | | | | 1 | 65536 | | | |
| 1 | 1 | 65537 | | 1 | 1 | 1 | 65537 | | 1 |
| 1 | 65536 | | | | 1 | 65536 | | | |
| 1 | 1 | 65537 | | 1 | 1 | 1 | 65537 | | 1 |
| 1 | 65.536 | | | | 1 | 65.536 | | | |
| 1 | 1 | 65537 | | 1 | 1 | 1 | 65537 | | 1 |
| 1 | 65.536 | | | | 1 | 65.536 | | | |
| 1 | 1 | 65537 | | 1 | 1 | 1 | 65537 | | 1 |
| 1 | 65.536 | | | | 1 | 65.536 | | | |
| 1 | 1 | 65537 | | 1 | 1 | 1 | 65537 | | 1 |
| 1 | 65.536 | | | | 1 | 65.536 | | | |
| 1 | 1 | 65537 | | 1 | 1 | 1 | 65537 | | 1 |

Fig 10.2

| base value | | | | | base value | | | | |
|---|---|---|---|---|---|---|---|---|---|
| value 1 | 2^32 | 65536 | | | value 1 | 2^32 | 65536 | | |
| value 2 | 2^0 | 1 | | | value 2 | 2^0 | 1 | | |
| File(0) | | TCL(1) | PCL(1) | File(1) | File(0) | | TCL(1) | PCL(1) | File(1) |
| 31 | 2031616 | | | | 32 | 2097152 | | | |
| 13 | 13 | 2031629 | 2031629 | 31 | 22 | 22 | 2097174 | 2097174 | 32 |
| 26 | 1703936 | | | | 8 | 524288 | | | |
| 28 | 28 | 1703964 | 1703964 | 28 | 14 | 14 | 524302 | 524302 | 14 |
| 19 | 1245184 | | | | 2 | 131072 | | | |
| 3 | 3 | 1245187 | 1245187 | 22 | 18 | 18 | 131090 | 131090 | 6 |
| 26 | 1703936 | | | | 8 | 524288 | | | |
| 9 | 9 | 1703945 | 1703945 | 27 | 3 | 3 | 524291 | 524291 | 13 |
| 24 | 1572864 | | | | 15 | 983040 | | | |
| 12 | 12 | 1572876 | 1572876 | 25 | 5 | 5 | 983045 | 983045 | 19 |
| 2 | 131072 | | | | 1 | 65536 | | | |
| 7 | 7 | 131079 | 131079 | 5 | 1 | 1 | 65537 | | 1 |
| 11 | 720896 | | | | 13 | 851968 | | | |
| 2 | 2 | 720898 | 720898 | 16 | 7 | 7 | 851975 | 851975 | 18 |
| 1 | 65536 | | | | 1 | 65536 | | | |
| 10 | 10 | 65546 | 65546 | 3 | 1 | 1 | 65537 | | 1 |
| 2 | 131072 | | | | 1 | 65536 | | | |
| 1 | 1 | 131073 | 131073 | 4 | 1 | 1 | 65537 | | 1 |
| 1 | 65536 | | | | 1 | 65536 | | | |
| 1 | 1 | 65537 | | 1 | 1 | 1 | 65537 | | 1 |
| 1 | 65536 | | | | 1 | 65536 | | | |
| 1 | 1 | 65537 | | 1 | 1 | 1 | 65537 | | 1 |
| 1 | 65536 | | | | 1 | 65536 | | | |
| 1 | 1 | 65537 | | 1 | 1 | 1 | 65537 | | 1 |
| 1 | 65.536 | | | | 1 | 65.536 | | | |
| 1 | 1 | 65537 | | 1 | 1 | 1 | 65537 | | 1 |
| 1 | 65.536 | | | | 1 | 65.536 | | | |
| 1 | 1 | 65537 | | 1 | 1 | 1 | 65537 | | 1 |
| 1 | 65.536 | | | | 1 | 65.536 | | | |
| 1 | 1 | 65537 | | 1 | 1 | 1 | 65537 | | 1 |
| 1 | 65.536 | | | | 1 | 65.536 | | | |
| 1 | 1 | 65537 | | 1 | 1 | 1 | 65537 | | 1 |

Fig 11

Difference DCT-matrices after zig-zag ordering

DCT-matrix 1

| 10 | 4 | 3 | 1 | 4 | 2 | 5 | 1 | 2 | 1 | 2 | 1 | 1 | 2 | 1 | 0 |
|---|---|---|---|---|---|---|---|---|---|---|---|---|---|---|---|
| 1 | 2 | 0 | 1 | 1 | 1 | -1 | -1 | -1 | 1 | 1 | -1 | 0 | 0 | -1 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |

Difference DCT-matrix 2 relative to DCT-matrix 1

| 1 | 1 | 0 | -1 | 1 | 1 | 0 | 1 | 0 | 2 | 0 | 1 | 0 | 1 | 1 | 0 |
|---|---|---|---|---|---|---|---|---|---|---|---|---|---|---|---|
| 2 | 1 | 0 | -1 | 1 | -1 | 1 | 1 | 1 | 0 | 1 | 1 | 0 | 1 | 1 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |

Difference DCT-matrix 3 relative to DCT-matrix 2

| 1 | 1 | -1 | -1 | -1 | 0 | 1 | 1 | -2 | 1 | 0 | -1 | 3 | 0 | 1 | 1 |
|---|---|---|---|---|---|---|---|---|---|---|---|---|---|---|---|
| 0 | -1 | 1 | 3 | -1 | 0 | -1 | 0 | 2 | 1 | -1 | 0 | 0 | -1 | 1 | -1 |
| 1 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |

Difference DCT-matrix 4 relative to DCT-matrix 3

| 1 | 1 | 1 | -1 | 0 | -1 | -1 | -1 | -1 | -2 | -2 | -2 | 0 | -1 | -1 | 0 |
|---|---|---|---|---|---|---|---|---|---|---|---|---|---|---|---|
| 2 | 1 | 0 | -1 | -1 | 0 | 1 | 0 | 0 | -3 | -2 | 0 | 0 | 0 | -1 | 1 |
| -1 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |

Fig 12a.1

Encoding in unique values
Encoding per 2 values (bytes)

| Base values: | Encoding round 1 | | Base values: | Encoding round 1 | |
|---|---|---|---|---|---|
| Value 1 | $2^8$ | 256 | Value 1 | $2^8$ | 256 |
| Value 2 | $2^0$ | 1 | Value 2 | $2^0$ | 1 |

Encoding round 1

DCT-matrix 1

| DCT values number | (Data set) | | TCL(0) | PCL(0) | File(0) |
|---|---|---|---|---|---|
| 1 | 10 | 2560 | | | |
| 2 | 4 | 4 | 2564 | 2564 | 1 |
| 3 | 3 | 768 | | | |
| 4 | 1 | 1 | 769 | 769 | 2 |
| 5 | 4 | 1024 | | | |
| 6 | 2 | 2 | 1026 | 1026 | 3 |
| 7 | 5 | 1280 | | | |
| 8 | 1 | 1 | 1281 | 1281 | 4 |
| 9 | 2 | 512 | | | |
| 10 | 1 | 1 | 513 | 513 | 5 |
| 11 | 2 | 512 | | | |
| 12 | 1 | 1 | 513 | | 5 |
| 13 | 1 | 256 | | | |
| 14 | 2 | 2 | 258 | 258 | 6 |
| 15 | 1 | 256 | | | |
| 16 | 0 | 0 | 256 | 256 | 7 |
| 17 | 1 | 256 | | | |
| 18 | 2 | 2 | 258 | | 6 |
| 19 | 0 | 0 | | | |
| 20 | 1 | 1 | 1 | 1 | 8 |
| 21 | 1 | 256 | | | |
| 22 | 1 | 1 | 257 | 257 | 9 |
| 23 | -1 | -256 | | | |
| 24 | -1 | -1 | -257 | -257 | 10 |
| 25 | -1 | -256 | | | |
| 26 | 1 | 1 | -255 | -255 | 11 |
| 27 | 1 | 256 | | | |
| 28 | -1 | -1 | 255 | 255 | 12 |
| 29 | 0 | 0 | | | |
| 30 | 0 | 0 | 0 | 0 | 13 |
| 31 | -1 | -256 | | | |
| 32 | 0 | 0 | -256 | -256 | 14 |
| 33 | 0 | 0 | | | |
| 34 | 0 | 0 | | 0 | 13 |

DCT-matrix 2

| DCT values | (Data set) | TCL(0) | PCL(0) | File(0) |
|---|---|---|---|---|
| 1 | 256 | | | |
| 1 | 1 | 257 | | 9 |
| 0 | 0 | | | |
| -1 | -1 | -1 | -1 | 15 |
| 1 | 256 | | | |
| 1 | 1 | 257 | | 9 |
| 0 | 0 | | | |
| 1 | 1 | 1 | | 8 |
| 0 | 0 | | | |
| 2 | 2 | 2 | 2 | 16 |
| 0 | 0 | | | |
| 1 | 1 | 1 | | 8 |
| 0 | 0 | | | |
| 1 | 1 | 1 | | 8 |
| 1 | 256 | | | |
| 0 | 0 | 256 | | 7 |
| 2 | 512 | | | |
| 1 | 1 | 513 | | 5 |
| 0 | 0 | | | |
| -1 | -1 | -1 | | 15 |
| 1 | 256 | | | |
| -1 | -1 | 255 | | 12 |
| 1 | 256 | | | |
| 1 | 1 | 257 | | 9 |
| 1 | 256 | | | |
| 0 | 0 | 256 | | 7 |
| 0 | 0 | | | |
| 0 | 0 | 0 | | 13 |
| 0 | 0 | | | |
| 0 | 0 | 0 | | 13 |
| 0 | 0 | | | |
| 0 | 0 | 0 | | 13 |
| 0 | 0 | | | |
| 0 | 0 | 0 | | 13 |

Fig 12a.2

Base values: Encoding round 1
Value 1   2^8   256
Value 2   2^0   1

Base values: Encoding round 1
Value 1   2^8   256
Value 2   2^0   1

DCT-matrix 3

| DCT values number | (Data set) | | TCL(0) | PCL(0) | File(0) |
|---|---|---|---|---|---|
| 1 | 1 | 256 | | | |
| 2 | 1 | 1 | 257 | | 9 |
| 3 | -1 | -256 | | | |
| 4 | -1 | -1 | -257 | | 10 |
| 5 | -1 | -256 | | | |
| 6 | 0 | 0 | -256 | | 14 |
| 7 | 1 | 256 | | | |
| 8 | 1 | 1 | 257 | | 9 |
| 9 | -2 | -512 | | | |
| 10 | 1 | 1 | -511 | -511 | 17 |
| 11 | 0 | 0 | | | |
| 12 | -1 | -1 | -1 | | 15 |
| 13 | 3 | 768 | | | |
| 14 | 0 | 0 | 768 | 768 | 18 |
| 15 | 1 | 256 | | | |
| 16 | 1 | 1 | 257 | | 9 |
| 17 | 0 | 0 | | | |
| 18 | -1 | -1 | -1 | | 15 |
| 19 | 1 | 256 | | | |
| 20 | 0 | 0 | 256 | | 7 |
| 21 | -1 | -256 | | | |
| 22 | 0 | 0 | -256 | | 14 |
| 23 | -1 | -256 | | | |
| 24 | 1 | 1 | -255 | | 11 |
| 25 | 2 | 512 | | | |
| 26 | 1 | 1 | 513 | | 5 |
| 27 | -1 | -256 | | | |
| 28 | 0 | 0 | -256 | | 14 |
| 29 | 0 | 0 | | | |
| 30 | -1 | -1 | -1 | | 15 |
| 31 | 1 | 256 | | | |
| 32 | -1 | -1 | 255 | | 12 |
| 33 | 0 | 0 | | | |
| 34 | 0 | 0 | 0 | | 13 |

DCT-matrix 4

| DCT values | (Data set) | | TCL(0) | PCL(0) | File(0) |
|---|---|---|---|---|---|
| 1 | 1 | 256 | | | |
| 2 | 1 | 1 | 257 | | 9 |
| 3 | 1 | 256 | | | |
| 4 | -1 | -1 | 255 | | 12 |
| 5 | 0 | 0 | | | |
| 6 | -1 | -1 | -1 | | 15 |
| 7 | -1 | -256 | | | |
| 8 | -1 | -1 | -257 | | 10 |
| 9 | -1 | -256 | | | |
| 10 | -2 | -2 | -258 | -258 | 19 |
| 11 | -2 | -512 | | | |
| 12 | -2 | -2 | -514 | -514 | 20 |
| 13 | 0 | 0 | | | |
| 14 | -1 | -1 | -1 | | 15 |
| 15 | -1 | -256 | | | |
| 16 | 0 | 0 | -256 | | 14 |
| 17 | 2 | 512 | | | |
| 18 | 1 | 1 | 513 | | 5 |
| 19 | 0 | 0 | | | |
| 20 | -1 | -1 | -1 | | 15 |
| 21 | -1 | -256 | | | |
| 22 | 0 | 0 | -256 | | 14 |
| 23 | 1 | 256 | | | |
| 24 | 0 | 0 | 256 | | 7 |
| 25 | 0 | 0 | | | |
| 26 | -3 | -3 | -3 | -3 | 21 |
| 27 | -2 | -512 | | | |
| 28 | 0 | 0 | -512 | -512 | 22 |
| 29 | 0 | 0 | | | |
| 30 | 0 | 0 | 0 | | 13 |
| 31 | -1 | -256 | | | |
| 32 | 1 | 1 | -255 | | 11 |
| 33 | 0 | 0 | | | |
| 34 | 0 | 0 | 0 | | 13 |

Fig 12b.1

Encoding in unique values
Encoding per 2 values (bytes)

| Base values: | Encoding round 1 | | | Base values: | Encoding round 1 | | |
|---|---|---|---|---|---|---|---|
| Value 1 | 2^8 | 256 | | Value 1 | 2^8 | 256 | |
| Value 2 | 2^0 | 1 | | Value 2 | 2^0 | 1 | |

Encoding round 1

DCT-matrix 1                                  DCT-matrix 2

| DCT values number | TCL(0) (Data set) | PCL(0) | File(0) | DCT values (Data set) | TCL(0) | PCL(0) | File(0) |
|---|---|---|---|---|---|---|---|
| 35 | 0 0 |   |    | 0 0 |   |   |    |
| 36 | 0 0 | 0 | 13 | 0 0 | 0 | 13 |    |
| 37 | 0 0 |   |    | 0 0 |   |   |    |
| 38 | 0 0 | 0 | 13 | 0 0 | 0 | 13 |    |
| 39 | 0 0 |   |    | 0 0 |   |   |    |
| 40 | 0 0 | 0 | 13 | 0 0 | 0 | 13 |    |
| 41 | 0 0 |   |    | 0 0 |   |   |    |
| 42 | 0 0 | 0 | 13 | 0 0 | 0 | 13 |    |
| 43 | 0 0 |   |    | 0 0 |   |   |    |
| 44 | 0 0 | 0 | 13 | 0 0 | 0 | 13 |    |
| 45 | 0 0 |   |    | 0 0 |   |   |    |
| 46 | 0 0 | 0 | 13 | 0 0 | 0 | 13 |    |
| 47 | 0 0 |   |    | 0 0 |   |   |    |
| 48 | 0 0 | 0 | 13 | 0 0 | 0 | 13 |    |
| 49 | 0 0 |   |    | 0 0 |   |   |    |
| 50 | 0 0 | 0 | 13 | 0 0 | 0 | 13 |    |
| 51 | 0 0 |   |    | 0 0 |   |   |    |
| 52 | 0 0 | 0 | 13 | 0 0 | 0 | 13 |    |
| 53 | 0 0 |   |    | 0 0 |   |   |    |
| 54 | 0 0 | 0 | 13 | 0 0 | 0 | 13 |    |
| 55 | 0 0 |   |    | 0 0 |   |   |    |
| 56 | 0 0 | 0 | 13 | 0 0 | 0 | 13 |    |
| 57 | 0 0 |   |    | 0 0 |   |   |    |
| 58 | 0 0 | 0 | 13 | 0 0 | 0 | 13 |    |
| 59 | 0 0 |   |    | 0 0 |   |   |    |
| 60 | 0 0 | 0 | 13 | 0 0 | 0 | 13 |    |
| 61 | 0 0 |   |    | 0 0 |   |   |    |
| 62 | 0 0 | 0 | 13 | 0 0 | 0 | 13 |    |
| 63 | 0 0 |   |    | 0 0 |   |   |    |
| 64 | 0 0 | 0 | 13 | 0 0 | 0 | 13 |    |

Fig 12b.2

Base   Encoding
values:  round 1
Value 1  2^8  256
Value 2  2^0   1

Base   Encoding
values:  round 1
Value 1  2^8  256
Value 2  2^0   1

DCT-matrix 3

| DCT values number | DCT values (Data set) | | TCL(0) | PCL(0) | File(0) |
|---|---|---|---|---|---|
| 35 | 0 | 0 | | | |
| 36 | 0 | 0 | 0 | | 13 |
| 37 | 0 | 0 | | | |
| 38 | 0 | 0 | 0 | | 13 |
| 39 | 0 | 0 | | | |
| 40 | 0 | 0 | 0 | | 13 |
| 41 | 0 | 0 | | | |
| 42 | 0 | 0 | 0 | | 13 |
| 43 | 0 | 0 | | | |
| 44 | 0 | 0 | 0 | | 13 |
| 45 | 0 | 0 | | | |
| 46 | 0 | 0 | 0 | | 13 |
| 47 | 0 | 0 | | | |
| 48 | 0 | 0 | 0 | | 13 |
| 49 | 0 | 0 | | | |
| 50 | 0 | 0 | 0 | | 13 |
| 51 | 0 | 0 | | | |
| 52 | 0 | 0 | 0 | | 13 |
| 53 | 0 | 0 | | | |
| 54 | 0 | 0 | 0 | | 13 |
| 55 | 0 | 0 | | | |
| 56 | 0 | 0 | 0 | | 13 |
| 57 | 0 | 0 | | | |
| 58 | 0 | 0 | 0 | | 13 |
| 59 | 0 | 0 | | | |
| 60 | 0 | 0 | 0 | | 13 |
| 61 | 0 | 0 | | | |
| 62 | 0 | 0 | 0 | | 13 |
| 63 | 0 | 0 | | | |
| 64 | 0 | 0 | 0 | | 13 |

DCT-matrix 4

| DCT values (Data set) | | TCL(0) | PCL(0) | File(0) |
|---|---|---|---|---|
| 0 | 0 | | | |
| 0 | 0 | 0 | | 13 |
| 0 | 0 | | | |
| 0 | 0 | 0 | | 13 |
| 0 | 0 | | | |
| 0 | 0 | 0 | | 13 |
| 0 | 0 | | | |
| 0 | 0 | 0 | | 13 |
| 0 | 0 | | | |
| 0 | 0 | 0 | | 13 |
| 0 | 0 | | | |
| 0 | 0 | 0 | | 13 |
| 0 | 0 | | | |
| 0 | 0 | 0 | | 13 |
| 0 | 0 | | | |
| 0 | 0 | 0 | | 13 |
| 0 | 0 | | | |
| 0 | 0 | 0 | | 13 |
| 0 | 0 | | | |
| 0 | 0 | 0 | | 13 |
| 0 | 0 | | | |
| 0 | 0 | 0 | | 13 |
| 0 | 0 | | | |
| 0 | 0 | 0 | | 13 |
| 0 | 0 | | | |
| 0 | 0 | 0 | | 13 |
| 0 | 0 | | | |
| 0 | 0 | 0 | | 13 |
| 0 | 0 | | | |
| 0 | 0 | 0 | | 13 |

Fig 13.1

Encoding round 2

Base values
Value 1  2^16  65536
Value 2  2^0   1

Base values
Value 1  2^16  65536
Value 2  2^0   1

| File(0) | | TCL(1) | PCL(1) | File(1) | File(0) | | TCL(1) | PCL(1) | File(1) |
|---|---|---|---|---|---|---|---|---|---|
| 1 | 65536 | | | | 9 | 589824 | | | |
| 2 | 2 | 65538 | 65538 | 1 | 15 | 15 | 589839 | 589839 | 10 |
| 3 | 196608 | | | | 9 | 589824 | | | |
| 4 | 4 | 196612 | 196612 | 2 | 8 | 8 | 589832 | 589832 | 11 |
| 5 | 327680 | | | | 16 | 1048576 | | | |
| 5 | 5 | 327685 | 327685 | 3 | 8 | 8 | 1048584 | 1048584 | 12 |
| 6 | 393216 | | | | 8 | 524288 | | | |
| 7 | 7 | 393223 | 393223 | 4 | 7 | 7 | 524295 | 524295 | 13 |
| 6 | 393216 | | | | 5 | 327680 | | | |
| 8 | 8 | 393224 | 393224 | 5 | 15 | 15 | 327695 | 327695 | 14 |
| 9 | 589824 | | | | 12 | 786432 | | | |
| 10 | 10 | 589834 | 589834 | 6 | 9 | 9 | 786441 | 786441 | 15 |
| 11 | 720896 | | | | 7 | 458752 | | | |
| 12 | 12 | 720908 | 720908 | 7 | 13 | 13 | 458765 | 458765 | 16 |
| 13 | 851968 | | | | 13 | 851968 | | | |
| 14 | 14 | 851982 | 851982 | 8 | 13 | 13 | 851981 | | 9 |
| 13 | 851968 | | | | 13 | 851968 | | | |
| 13 | 13 | 851981 | 851981 | 9 | 13 | 13 | 851981 | | 9 |
| 13 | 851968 | | | | 13 | 851968 | | | |
| 13 | 13 | 851981 | | 9 | 13 | 13 | 851981 | | 9 |
| 13 | 851968 | | | | 13 | 851968 | | | |
| 13 | 13 | 851981 | | 9 | 13 | 13 | 851981 | | 9 |
| 13 | 851968 | | | | 13 | 851968 | | | |
| 13 | 13 | 851981 | | 9 | 13 | 13 | 851981 | | 9 |
| 13 | 851968 | | | | 13 | 851968 | | | |
| 13 | 13 | 851981 | | 9 | 13 | 13 | 851981 | | 9 |
| 13 | 851968 | | | | 13 | 851968 | | | |
| 13 | 13 | 851981 | | 9 | 13 | 13 | 851981 | | 9 |
| 13 | 851968 | | | | 13 | 851968 | | | |
| 13 | 13 | 851981 | | 9 | 13 | 13 | 851981 | | 9 |

Fig 13.2

| Base values | | | | | Base values | | | |
|---|---|---|---|---|---|---|---|---|
| Value 2^16 | 65536 | | | | Value 2^16 | 65536 | | |
| Value: 2^0 | 1 | | | | Value 2^0 | 1 | | |
| File(0) | | TCL(1) | PCL(1) | File(1) | File(0) | | TCL(1) | PCL(1) | File(1) |
| 9 | 589824 | | | | 9 | 589824 | | | |
| 10 | 10 | 589834 | 589834 | 17 | 12 | 12 | 589836 | 589836 | 25 |
| 14 | 917504 | | | | 15 | 983040 | | | |
| 9 | 9 | 917513 | 917513 | 18 | 10 | 10 | 983050 | 983050 | 26 |
| 17 | 1114112 | | | | 19 | 1245184 | | | |
| 15 | 15 | 1114127 | 1114127 | 19 | 20 | 20 | 1245204 | 1245204 | 27 |
| 18 | 1179648 | | | | 15 | 983040 | | | |
| 9 | 9 | 1179657 | 1179657 | 20 | 14 | 14 | 983054 | 983054 | 28 |
| 15 | 983040 | | | | 5 | 327680 | | | |
| 7 | 7 | 983047 | 983047 | 21 | 15 | 15 | 327695 | 327695 | 29 |
| 14 | 917504 | | | | 14 | 917504 | | | |
| 11 | 11 | 917515 | 917515 | 22 | 7 | 7 | 917511 | 917511 | 30 |
| 5 | 327680 | | | | 21 | 1376256 | | | |
| 14 | 14 | 327694 | 327694 | 23 | 22 | 22 | 1376278 | 1376278 | 31 |
| 15 | 983040 | | | | 13 | 851968 | | | |
| 12 | 12 | 983052 | 983052 | 24 | 11 | 11 | 851979 | 851979 | 32 |
| 13 | 851968 | | | | 13 | 851968 | | | |
| 13 | 13 | 851981 | | 9 | 13 | 13 | 851981 | | 9 |
| 13 | 851968 | | | | 13 | 851968 | | | |
| 13 | 13 | 851981 | | 9 | 13 | 13 | 851981 | | 9 |
| 13 | 851968 | | | | 13 | 851968 | | | |
| 13 | 13 | 851981 | | 9 | 13 | 13 | 851981 | | 9 |
| 13 | 851968 | | | | 13 | 851968 | | | |
| 13 | 13 | 851981 | | 9 | 13 | 13 | 851981 | | 9 |
| 13 | 851968 | | | | 13 | 851968 | | | |
| 13 | 13 | 851981 | | 9 | 13 | 13 | 851981 | | 9 |
| 13 | 851968 | | | | 13 | 851968 | | | |
| 13 | 13 | 851981 | | 9 | 13 | 13 | 851981 | | 9 |
| 13 | 851968 | | | | 13 | 851968 | | | |
| 13 | 13 | 851981 | | 9 | 13 | 13 | 851981 | | 9 |

Fig 14

Referentiedatabase

| Encoding round 1 | | number of times in database | | Encoding round 2 | number of times in database |
|---|---|---|---|---|---|
| 2564 | 1 | 1 | 1 | 65538 | 1 |
| 769 | 2 | 1 | 2 | 196612 | 1 |
| 1026 | 3 | 1 | 3 | 327685 | 1 |
| 1281 | 4 | 1 | 4 | 393223 | 1 |
| 513 | 5 | 5 | 5 | 393224 | 1 |
| 258 | 6 | 2 | 6 | 589834 | 1 |
| 256 | 7 | 5 | 7 | 720908 | 1 |
| 1 | 8 | 5 | 8 | 851982 | 1 |
| 257 | 9 | 8 | 9 | 851981 | 33 |
| -257 | 10 | 5 | 10 | 589839 | 1 |
| -255 | 11 | 3 | 11 | 589832 | 1 |
| 255 | 12 | 5 | 12 | 1048584 | 1 |
| 0 | 13 | 69 | 13 | 524295 | 1 |
| -256 | 14 | 6 | 14 | 327695 | 1 |
| -1 | 15 | 7 | 15 | 786441 | 1 |
| 2 | 16 | 1 | 16 | 458765 | 1 |
| -511 | 17 | 1 | 17 | 589834 | 1 |
| 768 | 18 | 1 | 18 | 917513 | 1 |
| -258 | 19 | 1 | 19 | 1114127 | 1 |
| -514 | 20 | 1 | 20 | 1179657 | 1 |
| -3 | 21 | 1 | 21 | 983047 | 1 |
| -512 | 22 | 1 | 22 | 917515 | 1 |
| | | | 23 | 327694 | 1 |
| | | | 24 | 983052 | 1 |
| | | | 25 | 589836 | 1 |
| | | | 26 | 983050 | 1 |
| | | | 27 | 1245204 | 1 |
| | | | 28 | 983054 | 1 |
| | | | 29 | 327695 | 1 |
| | | | 30 | 917511 | 1 |
| | | | 31 | 1376278 | 1 |
| | | | 32 | 851979 | 1 |

Fig 15

Minimum standard reference database
(Most frequent values at lowest possible position in reference database)

| Encoding round 1 | | Encoding round 2 | |
|---|---|---|---|
| | Key code | | Key code |
| 0 | 1 | 65537 | 1 |
| 257 | 3 | 196614 | 2 |
| -1 | 4 | 524292 | 3 |
| -256 | 5 | 65541 | 4 |
| -257 | 6 | 65547 | 5 |
| 1 | 7 | 196612 | 6 |
| 513 | 8 | 196615 | 7 |
| 256 | 9 | 196618 | 8 |
| 255 | 10 | 262149 | 9 |
| -255 | 11 | 262150 | 10 |
| 258 | 12 | 262153 | 11 |
| 2 | 13 | 262154 | 12 |
| -511 | 14 | 327683 | 13 |
| 768 | 15 | 327689 | 14 |
| -258 | 16 | 327691 | 15 |
| -514 | 17 | 458761 | 16 |
| -3 | 18 | 524293 | 17 |
| -512 | 19 | 524296 | 18 |
| 1281 | 20 | 589825 | 19 |
| 1026 | 21 | 655363 | 20 |
| 769 | 22 | 720906 | 21 |
| 2564 | 23 | 786439 | 22 |
| | | 786441 | 23 |
| | | 851975 | 24 |
| | | 917508 | 25 |
| | | 983043 | 26 |
| | | 1048593 | 27 |
| | | 1179667 | 28 |
| | | 1376276 | 29 |
| | | 1507350 | 30 |

Fig 16a.1

Encoding in unique values
Encoding per 2 values (bytes)

| Base values: | Encoding round 1 | |
|---|---|---|
| Value 1 | 2^8 | 256 |
| Value 2 | 2^0 | 1 |

| Base values: | Encoding round 1 | |
|---|---|---|
| Value 1 | 2^8 | 256 |
| Value 2 | 2^0 | 1 |

Encoding round 1

DCT-matrix 1

| DCT values number | (Data set) | | TCL(0) | PCL(0) | File(0) |
|---|---|---|---|---|---|
| 1 | 10 | 2560 | | | |
| 2 | 4 | 4 | 2564 | 2564 | 23 |
| 3 | 3 | 768 | | | |
| 4 | 1 | 1 | 769 | 769 | 22 |
| 5 | 4 | 1024 | | | |
| 6 | 2 | 2 | 1026 | 1026 | 21 |
| 7 | 5 | 1280 | | | |
| 8 | 1 | 1 | 1281 | 1281 | 20 |
| 9 | 2 | 512 | | | |
| 10 | 1 | 1 | 513 | 513 | 8 |
| 11 | 2 | 512 | | | |
| 12 | 1 | 1 | 513 | | 8 |
| 13 | 1 | 256 | | | |
| 14 | 2 | 2 | 258 | 258 | 12 |
| 15 | 1 | 256 | | | |
| 16 | 0 | 0 | 256 | 256 | 9 |
| 17 | 1 | 256 | | | |
| 18 | 2 | 2 | 258 | | 12 |
| 19 | 0 | 0 | | | |
| 20 | 1 | 1 | 1 | 1 | 7 |
| 21 | 1 | 256 | | | |
| 22 | 1 | 1 | 257 | 257 | 3 |
| 23 | -1 | -256 | | | |
| 24 | -1 | -1 | -257 | -257 | 6 |
| 25 | -1 | -256 | | | |
| 26 | 1 | 1 | -255 | -255 | 11 |
| 27 | 1 | 256 | | | |
| 28 | -1 | -1 | 255 | 255 | 10 |
| 29 | 0 | 0 | | | |
| 30 | 0 | 0 | 0 | 0 | 1 |
| 31 | -1 | -256 | | | |
| 32 | 0 | 0 | -256 | -256 | 5 |
| 33 | 0 | 0 | | | |
| 34 | 0 | 0 | 0 | | 1 |

DCT-matrix 2

| DCT values | (Data set) | | TCL(0) | PCL(0) | File(0) |
|---|---|---|---|---|---|
| 1 | 256 | | | | |
| 1 | 1 | 257 | | | 3 |
| 0 | 0 | | | | |
| -1 | -1 | -1 | -1 | | 4 |
| 1 | 256 | | | | |
| 1 | 1 | 257 | | | 3 |
| 0 | 0 | | | | |
| 1 | 1 | 1 | | | 7 |
| 0 | 0 | | | | |
| 2 | 2 | 2 | 2 | | 13 |
| 0 | 0 | | | | |
| 1 | 1 | 1 | | | 7 |
| 0 | 0 | | | | |
| 1 | 1 | 1 | | | 7 |
| 1 | 256 | | | | |
| 0 | 0 | 256 | | | 9 |
| 2 | 512 | | | | |
| 1 | 1 | 513 | | | 8 |
| 0 | 0 | | | | |
| -1 | -1 | -1 | | | 4 |
| 1 | 256 | | | | |
| -1 | -1 | 255 | | | 10 |
| 1 | 256 | | | | |
| 1 | 1 | 257 | | | 3 |
| 1 | 256 | | | | |
| 0 | 0 | 256 | | | 9 |
| 0 | 0 | | | | |
| 0 | 0 | 0 | | | 1 |
| 0 | 0 | | | | |
| 0 | 0 | 0 | | | 1 |
| 0 | 0 | | | | |
| 0 | 0 | 0 | | | 1 |
| 0 | 0 | | | | |
| 0 | 0 | 0 | | | 1 |

*Fig 16a.2*

Base values: Encoding round 1
Value 1  2^8  256
Value 2  2^0  1

Base values: Encoding round 1
Value 1  2^8  256
Value 2  2^0  1

DCT-matrix 3

| DCT values number | (Data set) | | TCL(0) | PCL(0) | File(0) |
|---|---|---|---|---|---|
| 1  | 1  | 256 |      |      |    |
| 2  | 1  | 1   | 257  |      | 3  |
| 3  | -1 | -256|      |      |    |
| 4  | -1 | -1  | -257 |      | 6  |
| 5  | -1 | -256|      |      |    |
| 6  | 0  | 0   | -256 |      | 5  |
| 7  | 1  | 256 |      |      |    |
| 8  | 1  | 1   | 257  |      | 3  |
| 9  | -2 | -512|      |      |    |
| 10 | 1  | 1   | -511 | -511 | 14 |
| 11 | 0  | 0   |      |      |    |
| 12 | -1 | -1  | -1   |      | 4  |
| 13 | 3  | 768 |      |      |    |
| 14 | 0  | 0   | 768  | 768  | 15 |
| 15 | 1  | 256 |      |      |    |
| 16 | 1  | 1   | 257  |      | 3  |
| 17 | 0  | 0   |      |      |    |
| 18 | -1 | -1  | -1   |      | 4  |
| 19 | 1  | 256 |      |      |    |
| 20 | 0  | 0   | 256  |      | 9  |
| 21 | -1 | -256|      |      |    |
| 22 | 0  | 0   | -256 |      | 5  |
| 23 | -1 | -256|      |      |    |
| 24 | 1  | 1   | -255 |      | 11 |
| 25 | 2  | 512 |      |      |    |
| 26 | 1  | 1   | 513  |      | 8  |
| 27 | -1 | -256|      |      |    |
| 28 | 0  | 0   | -256 |      | 5  |
| 29 | 0  | 0   |      |      |    |
| 30 | -1 | -1  | -1   |      | 4  |
| 31 | 1  | 256 |      |      |    |
| 32 | -1 | -1  | 255  |      | 10 |
| 33 | 0  | 0   |      |      |    |
| 34 | 0  | 0   | 0    |      | 1  |

DCT-matrix 4

| DCT values | (Data set) | | TCL(0) | PCL(0) | File(0) |
|---|---|---|---|---|---|
| 1  | 256 |      |      |    |
| 1  | 1   | 257  |      | 3  |
| 1  | 256 |      |      |    |
| -1 | -1  | 255  |      | 10 |
| 0  | 0   |      |      |    |
| -1 | -1  | -1   |      | 4  |
| -1 | -256|      |      |    |
| -1 | -1  | -257 |      | 6  |
| -1 | -256|      |      |    |
| -2 | -2  | -258 | -258 | 16 |
| -2 | -512|      |      |    |
| -2 | -2  | -514 | -514 | 17 |
| 0  | 0   |      |      |    |
| -1 | -1  | -1   |      | 4  |
| -1 | -256|      |      |    |
| 0  | 0   | -256 |      | 5  |
| 2  | 512 |      |      |    |
| 1  | 1   | 513  |      | 8  |
| 0  | 0   |      |      |    |
| -1 | -1  | -1   |      | 4  |
| -1 | -256|      |      |    |
| 0  | 0   | -256 |      | 5  |
| 1  | 256 |      |      |    |
| 0  | 0   | 256  |      | 9  |
| 0  | 0   |      |      |    |
| -3 | -3  | -3   | -3   | 18 |
| -2 | -512|      |      |    |
| 0  | 0   | -512 | -512 | 19 |
| 0  | 0   |      |      |    |
| 0  | 0   | 0    |      | 1  |
| -1 | -256|      |      |    |
| 1  | 1   | -255 |      | 11 |
| 0  | 0   |      |      |    |
| 0  | 0   | 0    |      | 1  |

Fig 16b.1

Encoding in unique values
Encoding per 2 values (bytes)

| Base values: | Encoding round 1 | | | Base values: | Encoding round 1 | |
|---|---|---|---|---|---|---|
| Value 1 | 2^8 | 256 | | Value 1 | 2^8 | 256 |
| Value 2 | 2^0 | 1 | | Value 2 | 2^0 | 1 |

Encoding round 1

DCT-matrix 1                                       DCT-matrix 2

| DCT values number | (Data set) | | TCL(0) | PCL(0) | File(0) | DCT values (Data set) | | TCL(0) | PCL(0) | File(0) |
|---|---|---|---|---|---|---|---|---|---|---|
| 35 | 0 | 0 | | | | 0 | 0 | | | |
| 36 | 0 | 0 | 0 | | 1 | 0 | 0 | 0 | | 1 |
| 37 | 0 | 0 | | | | 0 | 0 | | | |
| 38 | 0 | 0 | 0 | | 1 | 0 | 0 | 0 | | 1 |
| 39 | 0 | 0 | | | | 0 | 0 | | | |
| 40 | 0 | 0 | 0 | | 1 | 0 | 0 | 0 | | 1 |
| 41 | 0 | 0 | | | | 0 | 0 | | | |
| 42 | 0 | 0 | 0 | | 1 | 0 | 0 | 0 | | 1 |
| 43 | 0 | 0 | | | | 0 | 0 | | | |
| 44 | 0 | 0 | 0 | | 1 | 0 | 0 | 0 | | 1 |
| 45 | 0 | 0 | | | | 0 | 0 | | | |
| 46 | 0 | 0 | 0 | | 1 | 0 | 0 | 0 | | 1 |
| 47 | 0 | 0 | | | | 0 | 0 | | | |
| 48 | 0 | 0 | 0 | | 1 | 0 | 0 | 0 | | 1 |
| 49 | 0 | 0 | | | | 0 | 0 | | | |
| 50 | 0 | 0 | 0 | | 1 | 0 | 0 | 0 | | 1 |
| 51 | 0 | 0 | | | | 0 | 0 | | | |
| 52 | 0 | 0 | 0 | | 1 | 0 | 0 | 0 | | 1 |
| 53 | 0 | 0 | | | | 0 | 0 | | | |
| 54 | 0 | 0 | 0 | | 1 | 0 | 0 | 0 | | 1 |
| 55 | 0 | 0 | | | | 0 | 0 | | | |
| 56 | 0 | 0 | 0 | | 1 | 0 | 0 | 0 | | 1 |
| 57 | 0 | 0 | | | | 0 | 0 | | | |
| 58 | 0 | 0 | 0 | | 1 | 0 | 0 | 0 | | 1 |
| 59 | 0 | 0 | | | | 0 | 0 | | | |
| 60 | 0 | 0 | 0 | | 1 | 0 | 0 | 0 | | 1 |
| 61 | 0 | 0 | | | | 0 | 0 | | | |
| 62 | 0 | 0 | 0 | | 1 | 0 | 0 | 0 | | 1 |
| 63 | 0 | 0 | | | | 0 | 0 | | | |
| 64 | 0 | 0 | 0 | | 1 | 0 | 0 | 0 | | 1 |

Fig 16b.2

Base Encoding  
values: round 1  
Value 1  $2^8$  256  
Value 2  $2^0$  1

Base Encoding  
values: round 1  
Value 1  $2^8$  256  
Value 2  $2^0$  1

DCT-matrix 3

| DCT values number | (Data set) | | TCL(0) | PCL(0) | File(0) |
|---|---|---|---|---|---|
| 35 | 0 | 0 | | | |
| 36 | 0 | 0 | 0 | | 1 |
| 37 | 0 | 0 | | | |
| 38 | 0 | 0 | 0 | | 1 |
| 39 | 0 | 0 | | | |
| 40 | 0 | 0 | 0 | | 1 |
| 41 | 0 | 0 | | | |
| 42 | 0 | 0 | 0 | | 1 |
| 43 | 0 | 0 | | | |
| 44 | 0 | 0 | 0 | | 1 |
| 45 | 0 | 0 | | | |
| 46 | 0 | 0 | 0 | | 1 |
| 47 | 0 | 0 | | | |
| 48 | 0 | 0 | 0 | | 1 |
| 49 | 0 | 0 | | | |
| 50 | 0 | 0 | 0 | | 1 |
| 51 | 0 | 0 | | | |
| 52 | 0 | 0 | 0 | | 1 |
| 53 | 0 | 0 | | | |
| 54 | 0 | 0 | 0 | | 1 |
| 55 | 0 | 0 | | | |
| 56 | 0 | 0 | 0 | | 1 |
| 57 | 0 | 0 | | | |
| 58 | 0 | 0 | 0 | | 1 |
| 59 | 0 | 0 | | | |
| 60 | 0 | 0 | 0 | | 1 |
| 61 | 0 | 0 | | | |
| 62 | 0 | 0 | 0 | | 1 |
| 63 | 0 | 0 | | | |
| 64 | 0 | 0 | 0 | | 1 |

DCT-matrix 4

| DCT values | (Data set) | | TCL(0) | PCL(0) | File(0) |
|---|---|---|---|---|---|
| | 0 | 0 | | | |
| | 0 | 0 | 0 | | 1 |
| | 0 | 0 | | | |
| | 0 | 0 | 0 | | 1 |
| | 0 | 0 | | | |
| | 0 | 0 | 0 | | 1 |
| | 0 | 0 | | | |
| | 0 | 0 | 0 | | 1 |
| | 0 | 0 | | | |
| | 0 | 0 | 0 | | 1 |
| | 0 | 0 | | | |
| | 0 | 0 | 0 | | 1 |
| | 0 | 0 | | | |
| | 0 | 0 | 0 | | 1 |
| | 0 | 0 | | | |
| | 0 | 0 | 0 | | 1 |
| | 0 | 0 | | | |
| | 0 | 0 | 0 | | 1 |
| | 0 | 0 | | | |
| | 0 | 0 | 0 | | 1 |
| | 0 | 0 | | | |
| | 0 | 0 | 0 | | 1 |
| | 0 | 0 | | | |
| | 0 | 0 | 0 | | 1 |
| | 0 | 0 | | | |
| | 0 | 0 | 0 | | 1 |
| | 0 | 0 | | | |
| | 0 | 0 | 0 | | 1 |
| | 0 | 0 | | | |
| | 0 | 0 | 0 | | 1 |

Fig 17.1

```
Encoding round 2
Base values                                      Base values
Value 1  2^16   65536                            Value 1 2^16   65536
Value 2  2^0    1                                Value 2 2^0    1
         File(0)       TCL(1)   PCL(1) File(1)           File(0)       TCL(1)   PCL(1) File(1)
         23  1507328                                     3   196608
         22        22  1507350  1507350   30            4         4   196612   196612    6
         21  1376256                                     3   196608
         20        20  1376276  1376276   29            7         7   196615   196615    7
         8   524288                                     13   851968
         8         8   524296   524296    18            7         7   851975   851975   24
         12  786432                                     7   458752
         9         9   786441   786441    23            9         9   458761   458761   16
         12  786432                                     8   524288
         7         7   786439   786439    22            4         4   524292   524292    3
         3   196608                                     10   655360
         6         6   196614   196614    2             3         3   655363   655363   20
         11  720896                                     9   589824
         10       10   720906   720906    21            1         1   589825   589825   19
         1   65536                                      1    65536
         5         5   65541    65541     4             1         1   65537              1
         1   65536                                      1    65536
         1         1   65537              1             1         1   65537              1
         1   65536                                      1    65536
         1         1   65537              1             1         1   65537              1
         1   65536                                      1    65536
         1         1   65537              1             1         1   65537              1
         1   65536                                      1    65536
         1         1   65537              1             1         1   65537              1
         1   65536                                      1    65536
         1         1   65537              1             1         1   65537              1
         1   65536                                      1    65536
         1         1   65537              1             1         1   65537              1
         1   65536                                      1    65536
         1         1   65537              1             1         1   65537              1
```

Fig 17.2

| Base values | | | | |
|---|---|---|---|---|
| Value 2^16 | 65536 | | | |
| Value 2^0 | 1 | | | |
| File(0) | | TCL(1) | PCL(1) | File(1) |
| 3 | 196608 | | | |
| 6 | 6 | 196614 | | 2 |
| 5 | 327680 | | | |
| 3 | 3 | 327683 | 327683 | 13 |
| 14 | 917504 | | | |
| 4 | 4 | 917508 | 917508 | 25 |
| 15 | 983040 | | | |
| 3 | 3 | 983043 | 983043 | 26 |
| 4 | 262144 | | | |
| 9 | 9 | 262153 | 262153 | 11 |
| 5 | 327680 | | | |
| 11 | 11 | 327691 | 327691 | 15 |
| 8 | 524288 | | | |
| 5 | 5 | 524293 | 524293 | 17 |
| 4 | 262144 | | | |
| 10 | 10 | 262154 | 262154 | 12 |
| 1 | 65536 | | | |
| 1 | 1 | 65537 | | 1 |
| 1 | 65536 | | | |
| 1 | 1 | 65537 | | 1 |
| 1 | 65536 | | | |
| 1 | 1 | 65537 | | 1 |
| 1 | 65536 | | | |
| 1 | 1 | 65537 | | 1 |
| 1 | 65536 | | | |
| 1 | 1 | 65537 | | 1 |
| 1 | 65536 | | | |
| 1 | 1 | 65537 | | 1 |
| 1 | 65536 | | | |
| 1 | 1 | 65537 | | 1 |

| Base values | | | | |
|---|---|---|---|---|
| Value 1 2^16 | 65536 | | | |
| Value 2 2^0 | 1 | | | |
| File(0) | | TCL(1) | PCL(1) | File(1) |
| 3 | 196608 | | | |
| 10 | 10 | 196618 | 196618 | 8 |
| 4 | 262144 | | | |
| 6 | 6 | 262150 | 262150 | 10 |
| 16 | 1048576 | | | |
| 17 | 17 | 1048593 | 1048593 | 27 |
| 4 | 262144 | | | |
| 5 | 5 | 262149 | 262149 | 9 |
| 8 | 524288 | | | |
| 4 | 4 | 524292 | | 3 |
| 5 | 327680 | | | |
| 9 | 9 | 327689 | 327689 | 14 |
| 18 | 1179648 | | | |
| 19 | 19 | 1179667 | 1179667 | 28 |
| 1 | 65536 | | | |
| 11 | 11 | 65547 | 65547 | 5 |
| 1 | 65536 | | | |
| 1 | 1 | 65537 | | 1 |
| 1 | 65536 | | | |
| 1 | 1 | 65537 | | 1 |
| 1 | 65536 | | | |
| 1 | 1 | 65537 | | 1 |
| 1 | 65536 | | | |
| 1 | 1 | 65537 | | 1 |
| 1 | 65536 | | | |
| 1 | 1 | 65537 | | 1 |
| 1 | 65536 | | | |
| 1 | 1 | 65537 | | 1 |
| 1 | 65536 | | | |
| 1 | 1 | 65537 | | 1 |

Fig 18

Zig-zag ordering

DCT-matrix 1

```
10  4  3  1  4  2  5  1  2  1  2  1  1  2  1  0
 1  2  0  1  1  1 -1 -1 -1  1  1 -1  0  0 -1  0
 0  0  0  0  0  0  0  0  0  0  0  0  0  0  0  0
 0  0  0  0  0  0  0  0  0  0  0  0  0  0  0  0
```

DCT-matrix 2

```
11  5  3  0  5  3  5  2  2  3  2  2  1  3  2  0
 3  3  0  0  2  0  0  0  0  1  2  0  0  1  0  0
 0  0  0  0  0  0  0  0  0  0  0  0  0  0  0  0
 0  0  0  0  0  0  0  0  0  0  0  0  0  0  0  0
```

DCT-matrix 3

```
12  6  2 -1  4  3  6  3  0  4  2  1  4  3  3  1
 3  2  1  3  1  0 -1  0  2  2  1  0  0  0  1 -1
 1  0  0  0  0  0  0  0  0  0  0  0  0  0  0  0
 0  0  0  0  0  0  0  0  0  0  0  0  0  0  0  0
```

DCT-matrix 4

Encoding in unique numbers
Encoding first 32 DCT values per 2 values (bytes) and second 32 DCT values at once

| Base value | Encoding round 1 | | Base value | Encoding round 1 | |
|---|---|---|---|---|---|
| Value | $2^8$ | 256 | Value | $2^8$ | 256 |
| Value | $2^0$ | 1 | Value | $2^0$ | 1 |

ENCODING ROUND 1

DCT-matrix 1 | | | | | DCT-matrix 2 | | | |

| Nr | DCT values (Data set) | TCL(0) | PCL(0) | File(0) | DCT values (Data set) | TCL(0) | PCL(0) | File(0) |
|---|---|---|---|---|---|---|---|---|
| 1 | 10 | 2560 | | | 11 | 2816 | | |
| 2 | 4 | 4 | 2564 | 2564 | 1 | 5 | 5 | 2821 | 2821 | 16 |
| 3 | 3 | 768 | | | 3 | 768 | | |
| 4 | 1 | 1 | 769 | 769 | 2 | 0 | 0 | 768 | 768 | 17 |
| 5 | 4 | 1024 | | | 5 | 1280 | | |
| 6 | 2 | 2 | 1026 | 1026 | 3 | 3 | 3 | 1283 | 1283 | 18 |
| 7 | 5 | 1280 | | | 5 | 1280 | | |
| 8 | 1 | 1 | 1281 | 1281 | 4 | 2 | 2 | 1282 | 1282 | 19 |
| 9 | 2 | 512 | | | 2 | 512 | | |
| 10 | 1 | 1 | 513 | 513 | 5 | 3 | 3 | 515 | 515 | 20 |
| 11 | 2 | 512 | | | 2 | 512 | | |
| 12 | 1 | 1 | 513 | | 5 | 2 | 2 | 514 | 514 | 21 |
| 13 | 1 | 256 | | | 1 | 256 | | |
| 14 | 2 | 2 | 258 | 258 | 6 | 3 | 3 | 259 | 259 | 22 |
| 15 | 1 | 256 | | | 2 | 512 | | |
| 16 | 0 | 0 | 256 | 256 | 7 | 0 | 0 | 512 | 512 | 23 |
| 17 | 1 | 256 | | | 3 | 768 | | |
| 18 | 2 | 2 | 258 | | 6 | 3 | 3 | 771 | 771 | 24 |
| 19 | 0 | 0 | | | 0 | 0 | | |
| 20 | 1 | 1 | 1 | 1 | 8 | 0 | 0 | 0 | | 13 |
| 21 | 1 | 256 | | | 2 | 512 | | |
| 22 | 1 | 1 | 257 | 257 | 9 | 0 | 0 | 512 | | 23 |
| 23 | -1 | -256 | | | 0 | 0 | | |
| 24 | -1 | -1 | -257 | -257 | 10 | 0 | 0 | 0 | | 13 |
| 25 | -1 | -256 | | | 0 | 0 | | |
| 26 | 1 | 1 | -255 | -255 | 11 | 1 | 1 | 1 | | 8 |
| 27 | 1 | 256 | | | 2 | 512 | | |
| 28 | -1 | -1 | 255 | 255 | 12 | 0 | 0 | 512 | | 23 |
| 29 | 0 | 0 | | | 0 | 0 | | |
| 30 | 0 | 0 | 0 | 0 | 13 | 1 | 1 | 1 | | 8 |
| 31 | -1 | -256 | | | 0 | 0 | | |
| 32 | 0 | 0 | -256 | -256 | 14 | 0 | 0 | 0 | | 13 |
| 33 | 0 | 0 | | | 0 | 0 | | |
| 34 | 0 | 0 | 0 | | 13 | 0 | 0 | 0 | | 13 |
| 35 t/m 64 | 30 times 0 | | 30 times 0 | 30 0 | 15 | 30 times 0 | | 30 times 0 | | 15 |

Fig 19.2

| Base value | Encoding round 1 | |
|---|---|---|
| Value | 2^8 | 256 |
| Value | 2^0 | 1 |

DCT-matrix 3

| DCT values (Data set) | | TCL(0) | PCL(0) | File(0) |
|---|---|---|---|---|
| 12 | 3072 | | | |
| 6 | 6 | 3078 | 3078 | 25 |
| 2 | 512 | | | |
| -1 | -1 | 511 | 511 | 26 |
| 4 | 1024 | | | |
| 3 | 3 | 1027 | 1027 | 27 |
| 6 | 1536 | | | |
| 3 | 3 | 1539 | 1539 | 28 |
| 0 | 0 | | | |
| 4 | 4 | 4 | 4 | 29 |
| 2 | 512 | | | |
| 1 | 1 | 513 | | 5 |
| 4 | 1024 | | | |
| 3 | 3 | 1027 | | 27 |
| 3 | 768 | | | |
| 1 | 1 | 769 | | 2 |
| 3 | 768 | | | |
| 2 | 2 | 770 | 770 | 30 |
| 1 | 256 | | | |
| 3 | 3 | 259 | | 22 |
| 1 | 256 | | | |
| 0 | 0 | 256 | | 7 |
| -1 | -256 | | | |
| 0 | 0 | -256 | | 14 |
| 2 | 512 | | | |
| 2 | 2 | 514 | | 21 |
| 1 | 256 | | | |
| 0 | 0 | 256 | | 7 |
| 0 | 0 | | | |
| 0 | 0 | 0 | | 13 |
| 1 | 256 | | | |
| -1 | -1 | 255 | | 12 |
| 1 | 256 | | | |
| 0 | 0 | 256 | | 7 |
| 30 times | | 30 times | | 15 |
| 0 | | 0 | | |

| Base value | Encoding round 1 | |
|---|---|---|
| Value | 2^8 | 256 |
| Value | 2^0 | 1 |

DCT-matrix 4

| DCT values (Data set) | | TCL(0) | PCL(0) | File(0) |
|---|---|---|---|---|
| 13 | 3328 | | | |
| 7 | 7 | 3335 | 3335 | 31 |
| 3 | 768 | | | |
| -2 | -2 | 766 | 766 | 32 |
| 4 | 1024 | | | |
| 2 | 2 | 1026 | | 3 |
| 5 | 1280 | | | |
| 2 | 2 | 1282 | | 19 |
| -1 | -256 | | | |
| 2 | 512 | 256 | | 7 |
| 0 | 0 | | | |
| -1 | -1 | -1 | -1 | 33 |
| 4 | 1024 | | | |
| 2 | 2 | 1026 | | 3 |
| 2 | 512 | | | |
| 1 | 1 | 513 | | 5 |
| 5 | 1280 | | | |
| 3 | 3 | 1283 | | 18 |
| 1 | 256 | | | |
| 2 | 2 | 258 | | 6 |
| 0 | 0 | | | |
| 0 | 0 | 0 | | 13 |
| 0 | 0 | | | |
| 0 | 0 | 0 | | 13 |
| 2 | 512 | | | |
| -1 | -1 | 511 | | 26 |
| -1 | -256 | | | |
| 0 | 0 | -256 | | 14 |
| 0 | 0 | | | |
| 0 | 0 | 0 | | 13 |
| 0 | 0 | | | |
| 0 | 0 | 0 | | 13 |
| 0 | 0 | | | |
| 0 | 0 | 0 | | 13 |
| 30 times | | 30 times | | 15 |
| 0 | | 0 | | |

Fig 20.1

ENCODING ROUND 2

| base values | | | | base values | | | |
|---|---|---|---|---|---|---|---|
| Value 1 2^16 | 65536 | | | Value 1 2^16 | 65536 | | |
| Value 2 2^0 | 1 | | | Value 2 2^0 | 1 | | |
| File(0) | TCL(1) | PCL(1) | File(1) | File(0) | TCL(1) | PCL(1) | File(1) |
| 1   65536 | | | | 16  1048576 | | | |
| 2       2 | 65538 | 65538 | 1 | 17      17 | 1048593 | 1048593 | 10 |
| 3   196608 | | | | 18  1179648 | | | |
| 4       4 | 196612 | 196612 | 2 | 19      19 | 1179667 | 1179667 | 11 |
| 5   327680 | | | | 20  1310720 | | | |
| 5       5 | 327685 | 327685 | 3 | 21      21 | 1310741 | 1310741 | 12 |
| 6   393216 | | | | 22  1441792 | | | |
| 7       7 | 393223 | 393223 | 4 | 23      23 | 1441815 | 1441815 | 13 |
| 6   393216 | | | | 24  1572864 | | | |
| 8       8 | 393224 | 393224 | 5 | 13      13 | 1572877 | 1572877 | 14 |
| 9   589824 | | | | 23  1507328 | | | |
| 10     10 | 589834 | 589834 | 6 | 13      13 | 1507341 | 1507341 | 15 |
| 11  720896 | | | | 8   524288 | | | |
| 12     12 | 720908 | 720908 | 7 | 23      23 | 524311 | 524311 | 16 |
| 13  851968 | | | | 8   524288 | | | |
| 14     14 | 851982 | 851982 | 8 | 13      13 | 524301 | 524301 | 17 |
| 13  851968 | | | | 13  851968 | | | |
| 15     15 | 851983 | 851983 | 9 | 15      15 | 851983 | | 9 |

Fig 20.2

| base values | | | | | base values | | | | |
|---|---|---|---|---|---|---|---|---|---|
| Value 1 | 2^16 | 65536 | | | Value 1 | 2^16 | 65536 | | |
| Value 2 | 2^0 | 1 | | | Value 2 | 2^0 | 1 | | |
| File(0) | | TCL(1) | PCL(1) | File(1) | File(0) | | TCL(1) | PCL(1) | File(1) |
| 25 | 1638400 | | | | 31 | 2031616 | | | |
| 26 | 26 | 1638426 | 1638426 | 18 | 32 | 32 | 2031648 | 2031648 | 27 |
| 27 | 1769472 | | | | 3 | 196608 | | | |
| 28 | 28 | 1769500 | 1769500 | 19 | 19 | 19 | 196627 | 196627 | 28 |
| 29 | 1900544 | | | | 7 | 458752 | | | |
| 5 | 5 | 1900549 | 1900549 | 20 | 33 | 33 | 458785 | 458785 | 29 |
| 27 | 1769472 | | | | 3 | 196608 | | | |
| 2 | 2 | 1769474 | 1769474 | 21 | 5 | 5 | 196613 | 196613 | 30 |
| 30 | 1966080 | | | | 18 | 1179648 | | | |
| 22 | 22 | 1966102 | 1966102 | 22 | 6 | 6 | 1179654 | 1179654 | 31 |
| 7 | 458752 | | | | 13 | 851968 | | | |
| 14 | 14 | 458766 | 458766 | 23 | 13 | 13 | 851981 | 851981 | 32 |
| 21 | 1376256 | | | | 26 | 1703936 | | | |
| 7 | 7 | 1376263 | 1376263 | 24 | 14 | 14 | 1703950 | 1703950 | 33 |
| 13 | 851968 | | | | 13 | 851968 | | | |
| 12 | 12 | 851980 | 851980 | 25 | 13 | 13 | 851981 | | 32 |
| 7 | 458752 | | | | 13 | 851968 | | | |
| 15 | 15 | 458767 | 458767 | 26 | 15 | 15 | 851983 | | 9 |

Fig 21

Difference DCT-matrices after zig-zag ordering

DCT-matrix 1

```
10  4  3  1  4  2  5  1  2  1  2  1  1  2  1  0
 1  2  0  1  1  1 -1 -1 -1  1  1 -1  0  0 -1  0
 0  0  0  0  0  0  0  0  0  0  0  0  0  0  0  0
 0  0  0  0  0  0  0  0  0  0  0  0  0  0  0  0
```

Difference DCT-matrix 2 relative to DCT-matrix 1

```
 1  1  0 -1  1  1  0  1  0  2  0  1  0  1  1  0
 2  1  0 -1  1 -1  1  1  1  0  1  1  0  1  1  0
 0  0  0  0  0  0  0  0  0  0  0  0  0  0  0  0
 0  0  0  0  0  0  0  0  0  0  0  0  0  0  0  0
```

Difference DCT-matrix 3 relative to DCT-matrix 2

```
 1  1 -1 -1 -1  0  1  1 -2  1  0 -1  3  0  1  1
 0 -1  1  3 -1  0 -1  0  2  1 -1  0  0 -1  1 -1
 1  0  0  0  0  0  0  0  0  0  0  0  0  0  0  0
 0  0  0  0  0  0  0  0  0  0  0  0  0  0  0  0
```

Difference DCT-matrix 4 relative to DCT-matrix 3

Encoding in unique numbers
Encoding of first 32 DCT-values per 2 values (bytes) and second 32 DCT-values at once

| Base Value | encoding round 1 | | | Base Value | encoding round 1 | | |
|---|---|---|---|---|---|---|---|
| Value 1 | $2^8$ | 256 | | Value 1 | $2^8$ | 256 | |
| Value 2 | $2^0$ | 1 | | Value 2 | $2^0$ | 1 | |

ENCODING ROUND 1

DCT-matrix 1                                              DCT-matrix 2

| number | DCT values (Data set) | | TCL(0) | PCL(0) | File(0) | DCT values (Data set) | | TCL(0) | PCL(0) | File(0) |
|---|---|---|---|---|---|---|---|---|---|---|
| 1 | 10 | 2560 | | | | 1 | 256 | | | |
| 2 | 4 | 4 | 2564 | 2564 | 1 | 1 | 1 | 257 | | 9 |
| 3 | 3 | 768 | | | | 0 | 0 | | | |
| 4 | 1 | 1 | 769 | 769 | 2 | -1 | -1 | -1 | -1 | 16 |
| 5 | 4 | 1024 | | | | 1 | 256 | | | |
| 6 | 2 | 2 | 1026 | 1026 | 3 | 1 | 1 | 257 | | 9 |
| 7 | 5 | 1280 | | | | 0 | 0 | | | |
| 8 | 1 | 1 | 1281 | 1281 | 4 | 1 | 1 | 1 | | 8 |
| 9 | 2 | 512 | | | | 0 | 0 | | | |
| 10 | 1 | 1 | 513 | 513 | 5 | 2 | 2 | 2 | 2 | 17 |
| 11 | 2 | 512 | | | | 0 | 0 | | | |
| 12 | 1 | 1 | 513 | | 5 | 1 | 1 | 1 | | 8 |
| 13 | 1 | 256 | | | | 0 | 0 | | | |
| 14 | 2 | 2 | 258 | 258 | 6 | 1 | 1 | 1 | | 8 |
| 15 | 1 | 256 | | | | 1 | 256 | | | |
| 16 | 0 | 0 | 256 | 256 | 7 | 0 | 0 | 256 | | 7 |
| 17 | 1 | 256 | | | | 2 | 512 | | | |
| 18 | 2 | 2 | 258 | | 6 | 1 | 1 | 513 | | 5 |
| 19 | 0 | 0 | | | | 0 | 0 | | | |
| 20 | 1 | 1 | 1 | 1 | 8 | -1 | -1 | -1 | | 16 |
| 21 | 1 | 256 | | | | 1 | 256 | | | |
| 22 | 1 | 1 | 257 | 257 | 9 | -1 | -1 | 255 | | 12 |
| 23 | -1 | -256 | | | | 1 | 256 | | | |
| 24 | -1 | -1 | -257 | -257 | 10 | 1 | 1 | 257 | | 9 |
| 25 | -1 | -256 | | | | 1 | 256 | | | |
| 26 | 1 | 1 | -255 | -255 | 11 | 0 | 0 | 256 | | 7 |
| 27 | 1 | 256 | | | | 1 | 256 | | | |
| 28 | -1 | -1 | 255 | 255 | 12 | 1 | 1 | 257 | | 9 |
| 29 | 0 | 0 | | | | 0 | 0 | | | |
| 30 | 0 | 0 | 0 | 0 | 13 | 1 | 1 | 1 | | 8 |
| 31 | -1 | -256 | | | | 1 | 256 | | | |
| 32 | 0 | 0 | -256 | -256 | 14 | 0 | 0 | 256 | | 7 |
| 33 | 0 | 0 | | | | 0 | 0 | | | |
| 34 | 0 | 0 | | 0 | 13 | 0 | 0 | 0 | | 13 |
| 35 t/m 64 | 30 times 0 | | 30 times 0 | 30 times 0 | 15 | 30 times 0 | | 30 time | | 15 |

Fig 22.2

Base  
Value   encoding round 1  
Value 1   2^8   256  
Value 2   2^0   1

Base  
Value   encoding round 1  
Value 1   2^8   256  
Value 2   2^0   1

DCT-matrix 3

| DCT values (Data set) | | TCL(0) | PCL(0) | File(0) |
|---|---|---|---|---|
| 1 | 256 | | | |
| 1 | 1 | 257 | | 9 |
| -1 | -256 | | | |
| -1 | -1 | -257 | | 10 |
| -1 | -256 | | | |
| 0 | 0 | -256 | | 14 |
| 1 | 256 | | | |
| 1 | 1 | 257 | | 9 |
| -2 | -512 | | | |
| 1 | 1 | -511 | -511 | 18 |
| 0 | 0 | | | |
| -1 | -1 | -1 | | 16 |
| 3 | 768 | | | |
| 0 | 0 | 768 | 768 | 19 |
| 1 | 256 | | | |
| 1 | 1 | 257 | | 9 |
| 0 | 0 | | | |
| -1 | -1 | -1 | | 16 |
| 1 | 256 | | | |
| 3 | 3 | 259 | 259 | 20 |
| -1 | -256 | | | |
| 0 | 0 | -256 | | 14 |
| -1 | -256 | | | |
| 0 | 0 | -256 | | 14 |
| 2 | 512 | | | |
| 1 | 1 | 513 | | 5 |
| -1 | -256 | | | |
| 0 | 0 | -256 | | 14 |
| 0 | 0 | | | |
| -1 | -1 | -1 | | 16 |
| 1 | 256 | | | |
| -1 | -1 | 255 | | 12 |
| 1 | 256 | | | |
| 0 | 0 | 256 | | 7 |
| 30 times 0 | 30 times | | | 15 |

DCT-matrix 4

| DCT values (Data set) | | TCL(0) | PCL(0) | File(0) |
|---|---|---|---|---|
| 1 | 256 | | | |
| 1 | 1 | 257 | | 9 |
| 1 | 256 | | | |
| -1 | -1 | 255 | | 12 |
| 0 | 0 | | | |
| -1 | -1 | -1 | | 16 |
| -1 | -256 | | | |
| -1 | -1 | -257 | | 10 |
| -1 | -256 | | | |
| -2 | -512 | -768 | -768 | 21 |
| -2 | -512 | | | |
| -2 | -2 | -514 | -514 | 22 |
| 0 | 0 | | | |
| -1 | -1 | -1 | | 16 |
| -1 | -256 | | | |
| 0 | 0 | -256 | | 14 |
| 2 | 512 | | | |
| 1 | 1 | 513 | | 5 |
| 0 | 0 | | | |
| -1 | -1 | -1 | | 16 |
| -1 | -256 | | | |
| 0 | 0 | -256 | | 14 |
| 1 | 256 | | | |
| 0 | 0 | 256 | | 7 |
| 0 | 0 | | | |
| -3 | -3 | -3 | -3 | 23 |
| -2 | -512 | | | |
| 0 | 0 | -512 | -512 | 24 |
| 0 | 0 | | | |
| 0 | 0 | 0 | | 13 |
| -1 | -256 | | | |
| 1 | 1 | -255 | | 11 |
| -1 | 0 | | | |
| 0 | 0 | 0 | | 13 |
| 30 times 0 | 30 times 0 | | | 15 |

Fig 23.1

ENCODING ROUND 2

Base value
Value 1   2^16   65536
Value 2   2^0    1

| File(0) | | TCL(1) | PCL(1) | File(1) |
|---|---|---|---|---|
| 1 | 65536 | | | |
| 2 | 2 | 65538 | 65538 | 1 |
| 3 | 196608 | | | |
| 4 | 4 | 196612 | 196612 | 2 |
| 5 | 327680 | | | |
| 5 | 5 | 327685 | 327685 | 3 |
| 6 | 393216 | | | |
| 7 | 7 | 393223 | 393223 | 4 |
| 6 | 393216 | | | |
| 8 | 8 | 393224 | 393224 | 5 |
| 9 | 589824 | | | |
| 10 | 10 | 589834 | 589834 | 6 |
| 11 | 720896 | | | |
| 12 | 12 | 720908 | 720908 | 7 |
| 13 | 851968 | | | |
| 14 | 14 | 851982 | 851982 | 8 |
| 13 | 851968 | | | |
| 15 | 15 | 851983 | 851983 | 9 |

Base value
Value 1   2^16   65536
Value 2   2^0    1

| File(0) | | TCL(1) | PCL(1) | File(1) |
|---|---|---|---|---|
| 9 | 589824 | | | |
| 16 | 16 | 589840 | 589840 | 10 |
| 9 | 589824 | | | |
| 8 | 8 | 589832 | 589832 | 11 |
| 17 | 1114112 | | | |
| 8 | 8 | 1114120 | 1114120 | 12 |
| 8 | 524288 | | | |
| 7 | 7 | 524295 | 524295 | 13 |
| 5 | 327680 | | | |
| 16 | 16 | 327696 | 327696 | 14 |
| 12 | 786432 | | | |
| 9 | 9 | 786441 | 786441 | 15 |
| 7 | 458752 | | | |
| 9 | 9 | 458761 | 458761 | 16 |
| 8 | 524288 | | | |
| 7 | 7 | 524295 | | 13 |
| 13 | 851968 | | | |
| 15 | 15 | 851983 | | 9 | number of key codes
encoding round 1   encoding round 2
    72                  36              108

Fig 23.2

| Base value | | | | | Base value | | | | |
|---|---|---|---|---|---|---|---|---|---|
| Value 1 | 2^16 | 65536 | | | Value 1 | 2^16 | 65536 | | |
| Value 2 | 2^0 | 1 | | | Value 2 | 2^0 | 1 | | |
| File(0) | TCL(1) | PCL(1) | File(1) | | File(0) | TCL(1) | PCL(1) | File(1) | |
| 9 | 589824 | | | | 9 | 589824 | | | |
| 10 | 10 | 589834 | 589834 | 17 | 12 | 12 | 589836 | 589836 | 26 |
| 14 | 917504 | | | | 16 | 1048576 | | | |
| 9 | 9 | 917513 | 917513 | 18 | 10 | 10 | 1048586 | 1048586 | 27 |
| 18 | 1179648 | | | | 21 | 1376256 | | | |
| 16 | 16 | 1179664 | 1179664 | 19 | 22 | 22 | 1376278 | 1376278 | 28 |
| 19 | 1245184 | | | | 16 | 1048576 | | | |
| 9 | 9 | 1245193 | 1245193 | 20 | 14 | 14 | 1048590 | 1048590 | 29 |
| 16 | 1048576 | | | | 5 | 327680 | | | |
| 20 | 20 | 1048596 | 1048596 | 21 | 16 | 16 | 327696 | | 14 |
| 14 | 917504 | | | | 14 | 917504 | | | |
| 14 | 14 | 917518 | 917518 | 22 | 7 | 7 | 917511 | 917511 | 30 |
| 5 | 327680 | | | | 23 | 1507328 | | | |
| 14 | 14 | 327694 | 327694 | 23 | 24 | 24 | 1507352 | 1507352 | 31 |
| 16 | 1048576 | | | | 13 | 851968 | | | |
| 12 | 12 | 1048588 | 1048588 | 24 | 11 | 11 | 851979 | 851979 | 32 |
| 7 | 458752 | | | | 13 | 851968 | | | |
| 15 | 15 | 458767 | 458767 | 25 | 15 | 15 | 851983 | | 9 |

METHOD AND DEVICE FOR ENCODING AND DECODING OF DATA IN UNIQUE NUMBER VALUES

PRIORITY CLAIM

This application claims priority to the following foreign patent applications:
International Patent Application No. PCT/NL2009/050289, filed May 25, 2009, by Ipo Paulus Willem Marinus Maria VAN DEN BOOM, entitled METHOD AND DEVICE FOR ENCODING AND DECODING OF DATA IN UNIQUE NUMBER VALUES; and
Netherlands Patent Application No. 2001597, filed May 21, 2008, by Ipo Paulus Willem Marinus Maria VAN DEN BOOM, entitled METHOD AND DEVICE FOR ENCODING AND DECODING OF DATA IN UNIQUE NUMBER VALUES, each of which is incorporated herein by reference.

BACKGROUND

The invention relates to the field of encoding/decoding, where digital image, sound and/or text information can be encoded, stored, sent, received, and decoded in a space-saving manner and without loss of information.

PRIOR ART

A digital image is a matrix of B*H image points or pixels (pixel=picture element). The colour of each pixel is determined by a certain value of D bits. A complete image is thus described by B*H*D bits.
Example:
An image of 720×576 pixels (the standard resolution of a DVD film) having 24 bits per pixel (true colour) is represented by 720×576×24=9,953,280 bits or 1,244,160 bytes or 1.19 MB. 8 bits=1 byte, 1024 bytes=1 KB (KiloByte), 1024 KB=1 MB (MegaByte).

The typical playing speed of a video film is 25 images per second (frames per second, fps). This means that one second of film with the data from the example above contains 30 MB per second or more than 100,000 MB per hour. Although the usual memory capacity of computers is considerably large, it will not be possible in practice to store 100 GB (GigaByte=1024 MB) per hour of film. A DVD offers a storage capacity, for example, between 5 and 17 GB. The naive manner of storage, namely storing all bits of the film, is thus not practically applicable.

There are two different ways in particular to reduce the required memory capacity of data:
1) Reduction of redundancy: in this case, the information is converted to another representation, so that the same information can be stored in less space. The original information can always be retrieved without loss; and
2) Modification of the input information: in this case, for example, irrelevant parts of the information are removed, for example non-audible frequencies in the case of sound or non-visible parts in the case of image information; or the input information is modified in another manner, such that successive compression steps start working more efficiently. In the case of this kind of data reduction, the original information cannot be retrieved exactly.

W. D. Hagamen, e.a., "Encoding verbal information as unique numbers", IBM SYST, No. 4, 1972, pp. 278-315, (hereinafter for shortness: Hagamen e.a. [1972]) have proposed a lossless encoding scheme for texts. First, a number value is assigned to all letters, numerals, punctuation marks and blanks. Then, letters in each word are taken together, and, with the aid of a certain formula, a code per word is calculated. Identical words thereby receive identical codes. The codes of consecutive words are placed consecutively in a temporary word list. All unique codes in the temporary word list are stored in a permanent word list at one time. Subsequently, a folder is made on the basis of the temporary word list by replacing each code therein by an index that refers to the position of the unique corresponding value in the permanent word list. Certainly in the case of larger original texts, this folder will generally still contain redundancy. The process is therefore repeated for groups of words and subsequently for groups of groups of words, and so on, until one end-code is reached that represents the whole original text.

In each encoding round, Hagamen e.a. [1972] use a formula having the following form:

$$F(\vec{V}) = \sum_{n=0}^{n=N} [V_n * BN^n] \quad (1)$$

where:

$$\vec{V} = (V_0, V_1, \ldots, V_N) \quad (2)$$

BN=a base value.
$\vec{V}$ is the vector formed from consecutive values in the folder that was made in the previous encoding round and that are used together in function F, per encoding round, to build a temporary word list. Per encoding round, the base value BN can vary. Per encoding round, the number of arguments of vector $\vec{V}$ can also vary.

In Hagamen e.a. [1972], a decoding unit can retrieve the original text completely lossless if it knows the end-code and all permanent word lists, as well as the precise encoding steps taken in each round, that is to say, the base value BN used per round, as well as the total number of encoding rounds employed.

A disadvantage of the technique described by Hagamen e.a. [1972] is that it is still not completely optimal with regard to the data reduction that can be achieved.

SHORT DESCRIPTION OF THE INVENTION

The object of the invention is to provide a manner of data reduction, such that the same amount of data can be stored using less memory space and can be sent to receivers/decoding units as desired. The process of encoding/decoding data described and claimed here uses the technique described hereinabove under 1). The encoding of data thus takes place without any loss of data; encoding takes place completely lossless'. The original encoded data can be completely retrieved, without loss, in its original form by means of decoding. The claimed technique is an improvement of the encoding mechanism disclosed by Hagamen e.a. [1972].

The invention is characterized by various independent appended claims. Forms of embodiment are claimed in dependent claims.

In summary, the encoding method according to the invention comprises at least the following actions:
a) defining an integer value i=0 and a reference database;
b) the storage of the data in an i-th temporary code list (TCL(i));

c) generating an i-th folder (Folder(i)) from the i-th temporary code list (TCL(i)) by, in each position thereof containing a value, replacing the value by an index that refers to the position of the same corresponding value as stored in the reference database;

d) generating a series of new temporary codes and placing thereof in an (i+1)-th temporary code list (TCL(i+1)), in which each new temporary code is calculated using a predetermined formula F that always combines at least two values from the i-th folder (Folder(i));

e) generating an (i+1)-th folder (Folder(i+1)) from the (i+1)-th temporary code list (TCL(i+1)) by, in each position thereof containing a value, replacing the value by an index that refers to the position of the same corresponding value as stored in the reference database;

f) checking whether at least one of the (i+1)-th temporary code list (TCL(i+1)) and the (i+1)-th folder (Folder(i+1)) contains one or more values more than once; if not, then jumping to action g); if yes, then incrementing the value of i by 1 and jumping to action d); and g) terminating the encoding.

The invention, however, also relates to an encoding unit having a processor and a memory, in which memory data and instructions of a computer program are stored, arranged such that these provide the processor with the ability to execute this method.

The invention also relates to a computer program product having data and instructions arranged such that these, after having been received by a processor, provide the processor with the ability to execute this method.

The invention also relates to a data carrier or signal provided with such a computer program product.

In summary, the decoding method according to the invention comprises at least the following actions:

a) receiving the end-code comprising an (i+1)-th folder (Folder(i+1)) generated ultimately by an encoding unit or a unique reference thereto, and receiving the value of i;

b) using values in the (i+1)-th folder (Folder(i+1)) as index values that refer to values in a reference database;

c) calculating values in an (i+1)-th temporary code list (TCL(i+1)) by placing, in each position in the (i+1)-th folder (Folder(i+1)), a value from the reference database having the index value corresponding to that position;

d) calculating values in an i-th folder (Folder(i)) by applying a decoding formula to the (i+1)-th temporary code list (TCL(i+1)), the decoding formula being an inverse formula of a formula that has been used by the encoding unit for calculating the (i+1)-th temporary code list from the (i)-th folder (Folder(i)), wherein the i-th folder (Folder(i)) comprises N times as many values as the (i+1)-th temporary code list (TCL(i+1)), where $N \geq 2$;

e) using the values in the i-th folder (Folder(i)) as index values that refer to values in the reference database;

f) calculating values in an i-th temporary code list (TCL(i)) by placing, in each position in the i-th folder (Folder(i)), a value from the reference database having the index value corresponding to that position;

g) decrementing the value of i by 1; if $i \geq 0$, calculating values in an i-th folder (Folder(i)) by applying a decoding formula on the (i+1)-th temporary code list (TCL(i+1)), the decoding formula being an inverse formula of a formula that has been used by the encoding unit for calculating the (i+1)-th temporary code list from the (i)-th folder (Folder(i)), wherein the i-th folder (Folder(i)) comprises N times as many values as the (i+1)-th temporary code list (TCL(i+1)), where $N \geq 2$, and jumping back to action e); if i<0, jumping to action h); and h) deriving an original dataset from the i-th folder, where i=0.

During decoding, use is made of the fact that the end-code is located in the last folder that was made by the encoding unit. The end-code consists of one or more index values in the relevant last folder. During decoding, index values from the related folder are obtained in each decoding round that refer to the positions of the number values in the reference database. The reference to the positions of number values in the reference database results in a new temporary code list. From that, with the aid of the inverse of the formula, the corresponding new folder is derived. The decoding process is repeated until the original folder is obtained.

The invention also relates to a decoding unit comprising a processor and a memory, in which memory data and instructions of a computer program are stored, arranged such that these provide the processor with the ability to execute the decoding method.

The invention also relates to a computer program product comprising data and instructions arranged such that these, after having been received by a processor, provide the processor with the ability to execute the decoding method.

The invention also relates to a data carrier or signal provided with such a computer program product.

The invention also relates to an encoding/decoding system comprising such an encoding unit and decoding unit.

The invention will hereinafter be explained in detail with reference to several figures. The figures show forms of embodiment only, and are not intended as limitation of the inventive idea, which is determined by the appended claims. Technically equivalent solutions are deemed to fall within the scope of the claims.

SHORT DESIGNATION OF THE FIGURES

FIG. 2 shows a table explaining the consecutive encoding actions of the invention.

FIG. 3 shows four DCT matrices originating from four consecutive 8*8 matrices in an exemplary video frame.

FIG. 4 shows four DCT matrices resulting from these four DCT matrices after reading them out in a zig-zag pattern.

Figure 1:
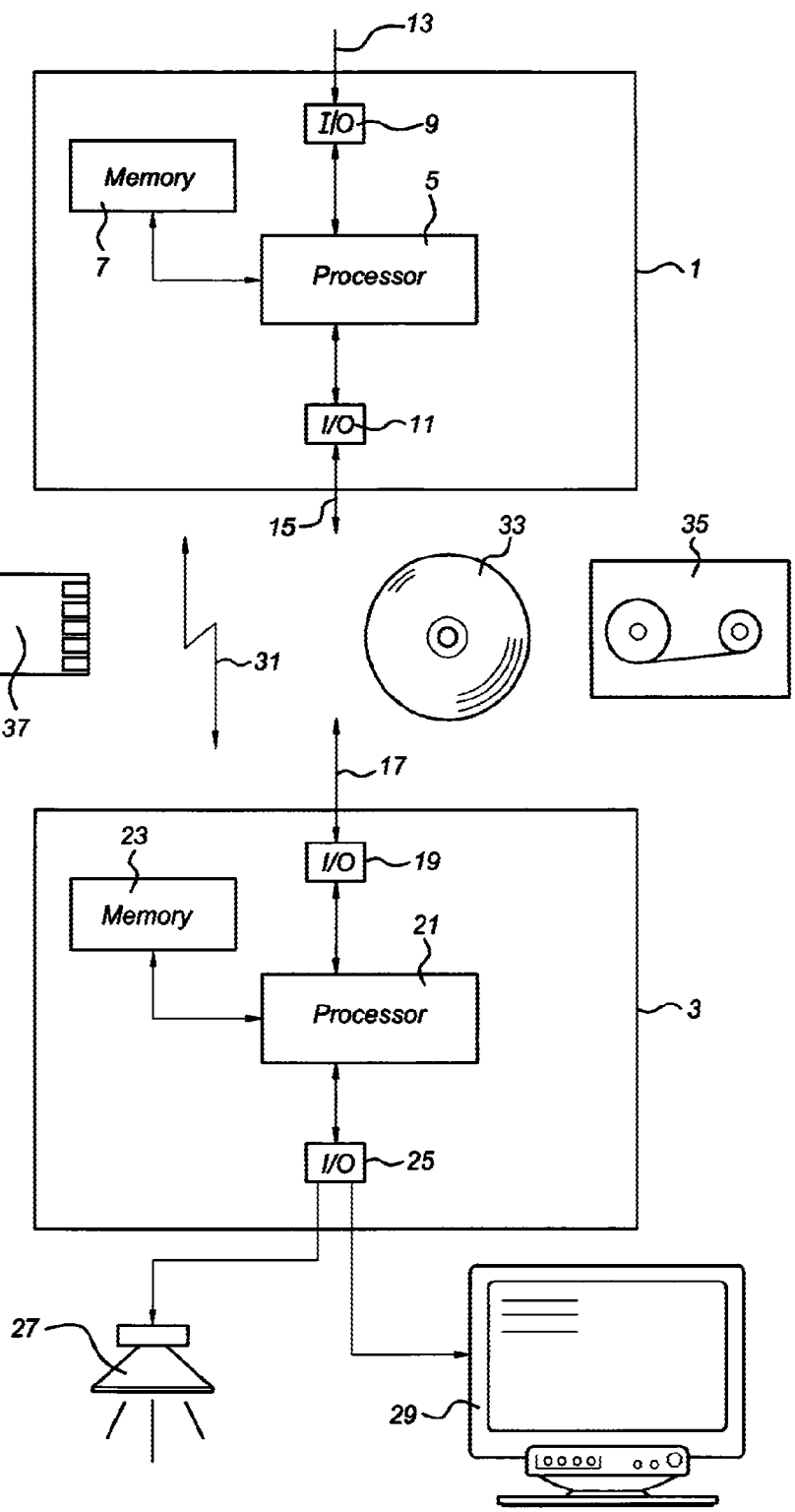
FIG. 1 shows a schematic arrangement of an encoding unit and a decoding unit.

FIGS. 5A and 5B together show the results of a first encoding round performed on these four zig-zag pattern matrices.

FIG. 6 shows the results of a second encoding round performed on the results of the first encoding round.

FIG. 7 shows the reference databases resulting from encoding rounds 1 and 2 as well as the number of times a certain code occurs.

FIG. 8 shows how the reference database of FIG. 7 can be reorganized when taking into account how often a certain code occurs in the database; the most frequent value is located at the lowest possible position in the reference database concerned.

FIGS. 9A, 9B together show the results of a first encoding round performed on the four zig-zag pattern matrices of FIG. 4, however, now performed while using the referencing scheme of FIG. 8.

FIG. 10 shows the results of a second encoding round performed on the results of the first encoding round of FIGS. 9A, 9B.

FIG. 11 shows four DCT matrices originating from the four consecutive 8*8 matrices of FIG. 3; the first one results from the first matrix of FIG. 3 after reading it out following a zig-zag pattern. The second, third and fourth matrix result from determining the difference between the original second, third and fourth matrix respectively and their predecessor, and after reading them out in a zig-zag pattern.

FIGS. 12A and 12B together show the results of a first encoding round performed on the four zig-zag pattern matrices of FIG. 11.

FIG. 13 shows the results of a second encoding round performed on the results of the first encoding round of FIGS. 12A, 12B.

FIG. 14 shows the reference databases resulting from encoding rounds 1 and 2 of FIGS. 12A, 12B and 13 as well as the number of times a certain code occurs;

FIG. 15 shows how the reference database of FIG. 14 can be reorganized when taking into account how often a certain code occurs in the database; the most frequent value is located at the lowest possible position in the reference database concerned.

FIGS. 16A, 16B together show the results of a first encoding round performed on the four zig-zag pattern matrices of FIG. 11, however, now performed while using the referencing scheme of FIG. 15.

FIG. 17 shows the results of a second encoding round performed on the results of the first encoding round of FIGS. 16A, 16B.

FIGS. 18 to 20 show an example of encoding in which the first 34 values of a 64 value vector are encoded using combinations of two consecutive values in a predetermined formula, and the last 30 values of the 64 value vector are encoded at once.

FIGS. 21 to 23 show the same actions as FIGS. 18 to 20, however, now applied to difference matrices.

DESCRIPTION OF FORMS OF EMBODIMENT

Introduction

FIG. 1 shows a general set-up of a system in which the present invention can be applied. The system comprises an encoding unit 1, which can also fulfill the function of transmitter. The encoding unit 1 comprises a processor 5, which is connected to a memory 7. The processor 5 is also connected to an input/output device (I/O) 9 and an I/O 11. Via the I/O 9, the processor 5 can receive data through a connection 13. The connection 13 can be a wire, but can also be implemented wirelessly. For the invention, it is irrelevant which wavelength of electromagnetic radiation is used for a possible wireless connection. Via the I/O 11, the processor 5 can output data via a connection 15, which can also concern a wire or a wireless connection.

In the memory, one or more software programs and data are stored that enable the processor 5 to provide certain functionality, such as the encoding of data according to the invention and the subsequent transmission thereof.

FIG. 1 shows different ways in which the encoded data produced by processor 5 can be transmitted. Transmission can take place via a wire, for example. The double arrow 31 indicates that, as an alternative, the data produced can be sent to a receiver wirelessly. That can take place within the context of radio, television, or from one terminal to another. A terminal is, for example, a mobile telephone, a PDA (personal digital assistant), an MP3 player or multimedia player, etc. Alternatively, the data produced can be stored on a data carrier such as an optical disk (for example a CD, a DVD), a magnetic tape 35, or a memory card 37 such as a memory stick. Other forms of storage are also possible, of course.

The signal produced by the encoding unit 1 is received by a receiver or decoding unit 3. The decoding unit 3 comprises a processor 21, which is connected to a memory 23. The processor 21 is also connected to an input/output device (I/O) 19 and an I/O 25. Via the I/O 19, the processor 21 can receive the data through a connection 17. Via I/O 25, the processor 21 can output data, for example audio data to a loudspeaker (headphone) and/or video data to a monitor or display 29.

The decoding unit 3 can have any desired implementation, such as a CD or DVD player, a tape recorder, a player based on data stored on a memory chip (such as nowadays an MP3 player), a mobile telephone, a PDA, a Blackberry, etc.

The memories shown can comprise one or more of: a hard disk, Read Only Memory (ROM), Electrically Erasable Programmable Read Only Memory (EEPROM) and Random Access Memory (RAM). Not all these memory types need necessarily be present. Moreover, they need not be placed physically close to the respective processor. They can also be placed remotely with respect thereto.

In a form of embodiment, the respective processors are connected to means for the input of instructions, data and so on by a user, such as a keyboard and a mouse. Other input means, such as a touch screen, a track ball and/or speech converter, which are known to persons skilled in the art, can also be applied.

A reading unit connected to the respective processors can also be provided. Such a reading unit is arranged to read data from a data carrier, such as a floppy disk, a memory stick, a magnetic tape, a CD-R, a DVD-R, or a CDROM.

The respective processors can be connected to a printer for printing output data on paper, as well as a display unit, for example a monitor or LCD (Liquid Crystal Display) screen, or any other type of display unit known to persons skilled in the art. The processors can be connected to a communication network, for example the PSTN (Public Switched Telephone Network), a local network (LAN=local area network), a wide area network (WAN), the Internet, and so on by means of suitable input/output means for the reception and transmission of data.

The processors can be implemented as an individual system or as a number of processors operating in parallel, each being arranged to execute subtasks of a larger program, or as one or more main processors having various subprocessors. Portions of the functionality of the invention can even, if desired, be implemented by remote processors that communicate with the respective processor via a network.

Encoding of Data in Unique Number Values

The coding program converts digital data (image, sound, text, characters) to a space-saving format. The digital data contains at least image, sound, and/or text (in this case, text is also understood to mean any random form of a sequence of characters). In the encoding steps according to the invention, no use is made of compression techniques in which loss of data occurs. Compression techniques are techniques in which data is omitted or preprocessed such that therewith the original data can no longer be retrieved. The result of the use of such known compression techniques is the occurrence of (any) loss of quality with respect to the original data as present prior to data processing. Some of such as compression techniques are used as parts of the encoding steps performed in the case of JPEG, MPEG, MP3 etc. for example. Other parts of these known encoding techniques are, however, lossless.

The encoding technique described hereinafter makes no use whatsoever of compression techniques that result in loss of data. All original data is encoded and can be completely decoded in a lossless manner in its original state. Of course, such original data can itself be the output of an other encoding technique in which some input data is encoded and which is not necessarily lossless. Then, of course applying a decoding process to such original data to arrive at the input data would not result in obtaining such input data losslessly. This will be explained in more detail hereinafter when explaining an embodiment in which the original data is the end result of a DCT (Digital Cosine Transformation) process on certain input data, and where also a quantization action is performed.

An additional and not unimportant advantage is that, by use of the invention, original image, sound and/or text data can be encoded and decoded in its original form with a storage capacity that may be lower than the compression techniques used by JPEG, MPEG and MP3.

Encoding Process

The encoding process consists of several encoding rounds, which in principle, with regard to the number of rounds, can be determined completely at liberty. In the prior art according to Hagamen, the maximum number of encoding rounds is determined by the moment at which only one end-code is generated in the last folder.

In accordance with the invention, however, the maximum number of encoding rounds is determined by the moment at which, in an encoding round, no more further data reduction can be reached. It has namely been found that the encoding process can be terminated sooner: the moment at which reduction is no longer achieved is (sometimes much) sooner than when only one end-code is present in a folder. The encoding process can, as will be explained, be completed as soon as a certain folder consists only of directly consecutive number values such as 1, 2, 3, 4, . . . N. The unique results per encoding round are stored in a reference database.

In essence, as will also be further explained, a reference database can be compiled in two different forms: in the first form, use is made of a universal reference database, and in the second form the reference database is created during encoding by the encoding unit 1. In the second technique, a start could possibly indeed be made using a minimum, universal standard database that is subsequently extended by encoding unit 1 with that which is encoded.

Either the data to be encoded is presented as number values that represent one or more bytes of the data to be encoded, or the data to be encoded is represented by means of preceding encoding in unique number values. The arrangement in one or more bytes is not intrinsically necessary for the invention, but is most obvious for contemporary computers. In the case of byte encoding, these number values lie within a range of 0 to 255, that is 256 different number values. The encoding/decoding according to the invention is not restricted to the encoding/decoding at byte level. In the event of the encoding/decoding of image information, encoding/decoding can also take place alternatively, for example, at pixel level and even at the level of individual image lines R, G and B, byte matrices, pixel matrices etc., regardless of the size of these matrices.

Now, consecutive encoding rounds will be described to explain the invention further. Point of departure is a dataset that can be defined as follows: a dataset comprises random data of a random dimension, originating from a computer file or stream. Mostly, every computer file comprises a certain set of bytes. These bytes are stored in a computer in binary form: each byte comprises mostly 8 bits, although other numbers are possible. Since the scope of a byte (8 bits) is much smaller than the number of bytes used in computer files, repetition is unavoidable, as a result of which the algorithm proposed here is applicable to heterogeneous datasets.

Encoding Round 1

Reference is made to FIG. 2, which shows tables in which the actions and results of consecutive encoding rounds are displayed. In a form of embodiment, the invention employs temporary code lists TCL(i) (i=0, 1, 2, 3, . . . I), permanent code lists PCL(i) that together form the reference database, folders Folder(i) as well as functions Fi. In a form of embodiment, the very first temporary code list TCL(0) is equal to the input for the encoding algorithm, and is derived from the dataset to be encoded. The first permanent code list PCL(0) is also derived from the original dataset, such as will now be explained.

The tables of FIG. 2 show, by way of example, consecutive actions based on a dataset of 16 bytes. The representation of the bytes in the table of FIG. 2 is in hexadecimal form. FF, for example, stands for 1111 1111 and 0C stands for 0000 1100. In practice, much larger datasets, such as video files (DVD) or audio files (CD), will be used. The dataset can be stored in a memory of the encoding unit 1, but also received by the encoding unit 1 from an external source. The first temporary code list TCL(0) is equal to the dataset read in and is present in a working storage on which the processor 5 performs its operations.

The processor 5 checks all bytes in the temporary code list TCL(0). Each time a byte is read out by the processor 5 and found to be unequal to a byte of the dataset that was already read previously, the processor 5 makes a new code for it in the permanent code list PCL(0). If, as shown, a dataset does not comprise all theoretically possible byte values, the permanent code list PCL(0) will thus also not comprise all theoretically possible byte values either. But the temporary code list TCL (0) will then not contain all theoretically possible byte values either. In the dataset of FIG. 2, only 4 unique values occur: FF, 12, 0C and 13, which will be included in the permanent code list PCL(0) only once. The permanent code list PCL(0) is stored in the memory 7 by processor 5.

Subsequently, processor 5 generates a first folder Folder (0). Folder(0) contains just as many elements as the temporary code list TCL(0). In each position where a byte was present in the temporary code list TCL(0), Folder(0), however, contains only a reference (index) to the position of the value of this original byte in the permanent code list PCL(0). The index refers to this value as stored in the permanent code list PCL(i). Thus "1" refers to "FF", "2" to "12", "3" to "0C", and "4" to "13".

In a form of embodiment, the content of Folder(0) is reduced in length by processor 5, for example by applying run length encoding. Thereby, if successful, the number of elements in Folder(0) is reduced and less index values need to be encoded. This subsequently leads to less required storage capacity for the corresponding permanent code list PCL(0). Moreover, this leads to a faster encoding process. The same form of data reduction can also be applied in one or more subsequent folders Folder(i).

In the event of very large datasets, some byte values may be found to occur much more frequently than other byte values. The processor 5 can establish this by analyzing either the original dataset or temporary code list TCL(0). In principle, the byte values in the permanent code list PCL(0) can then be stored in a space-saving manner in memory 7, for example by making use of a variable bit encoding scheme such as known to persons skilled in the art. The more frequently a certain byte value occurs, the less number of bits will be required for the storage of the unique byte values in permanent code list PCL(0). Besides that, a Huffman encoding scheme, for example, can be used for storing the byte values in PCL(0) more efficiently, but the invention is not restricted hereto. Other lossless schemes known to persons skilled in the art, including also 2-dimensional encoding schemes (such as used in JPEG, for example), can be used.

In the first encoding round, the first permanent code list PCL(0) is thus formed and stored. Alternatively, it is possible to take as a departure point a universal code list in which all possible values of the bytes occur (that is, 256 pieces) and in which byte values can be defined in advance according to a variable bit encoding scheme. The encoding scheme then depends on how frequently a certain byte value occurs in a dataset on average. That will depend on whether the dataset represents video, audio or text. If the dataset represents text, the encoding scheme will depend on the language or the type of text (for example, software program). The more frequently a certain byte value occurs, the less the number of bits that will need to be stored in permanent code list PCL(0). A Huffman encoding scheme can be used for this, for example, but the invention is not restricted hereto. Any other lossless scheme, including also a 2-dimensional encoding scheme, can be used.

Encoding Round 2

In encoding round 2, the index values stored in Folder(0) are used to build a new temporary code list TCL(1). In this case, new code values are calculated by processor 5, using a predetermined function F1(Folder(0)). To that end, function F1 is applied, for example, to at least preferably two consecutive values from Folder(0). In the table of FIG. 2, function F1 is, for example, always applied to two consecutive values. The invention is not restricted thereto, however. As indicated in the table of FIG. 2, that results in consecutive values F1(1;2), F1(1;1); F1(3;4), etc. in temporary code list TCL(1).

Processor 5 again checks how many different values are present in the temporary code list TCL(1), and processor 5 builds a permanent code list PCL(1) in which only the unique values occurring in the temporary code list TCL(1) are present. In the example shown in the table of FIG. 2, these are values F1(1;2), F1(1;1) and F1(3;4). The processor 5 also stores the permanent code list PCL(1) in memory 7, and does so in such a way that these can be distinguished from permanent code list PCL(0). Subsequently, the processor 5 builds a new folder Folder(1) having just as many elements as the temporary code list TCL(1), but in which in each position, instead of the original value from the temporary code list TCL(1), an index is present that refers to the position of the value in permanent code list PCL(1).

As mentioned, the processor 5 can, on the basis of either temporary code list TCL(1) or Folder(1), establish how often a certain value occurs in the permanent code list PCL(1). This can be used by processor 5 to establish the values in permanent code list PCL(1) with a variable bit encoding scheme in which the most frequently occurring values are stored with the shortest code. That can be done using a Huffman encoding or another scheme known to persons skilled in the art.

A formula, suitable for a computer, that can be used for function F1 is:

$$F1(\vec{V}) = \sum_{n=0}^{n=N} [V_n * BN1^n] \quad (1)$$

where:

$$\vec{V} = (V_0, V_1, \ldots, V_N) \quad (2)$$

BN1=a base value.

$\vec{V}$ is the vector formed from consecutive values in Folder (0), which are used together in function F1 to build temporary code list TCL(1). In the example mentioned above, vector $\vec{V}$ has only two values (V1,V2) each time. According to the table in FIG. 2, the vector $\vec{V}$ has consecutive values (1;2), (1;1), (3;4), etc.

The base value BN1 must be chosen such that function F1 can supply a unique value for every unique vector $\vec{V}$. Choosing a correct base value BN1 per encoding round is mainly of importance for the decoding. The use of an incorrect base value BN1 does not supply the original data upon decoding. Stated otherwise: the base value BN1 is an entity with which the index values in the folders Folder(i) can be converted to single number values. The magnitude of the base value BN1 is dependent on the number of index values to be encoded that occur in the folder, or on the highest index value that occurs in the folder. The base value must be at least 1 higher than the highest index value that occurs. Suitably, the base value is chosen as a power of 2, since that increases the speed with which a computer can calculate the formula. The base value BN1 is dependent on the number of elements in the related folder if these vary from 1, 2, 3 etc. to N−2, N−1, N, being incremented by 1 each time. In that event, the number of elements in the folder is equal to the highest index value in the folder. In the event that the highest value does not correspond with the number of elements in the related folder, the base value is minimal, the highest index value plus 1.

As an alternative for the calculation given in formula (I), use can be made of a matrix multiplication, in which the vector $\vec{V}$ is an M×N dimensional matrix. This can lead to advantageous results in some cases.

If the permanent code lists are based 100% on the dataset to be encoded itself, then a slightly modified formula can be used:

$$F1(\vec{V}) = \sum_{n=0}^{n=N} [V_n * BN1^n] - BN1^N \quad (1a)$$

This can be explained as follows. If encoding takes place per 2 number values, then in each encoding round, after each calculation, the base value employed can be subtracted from the result of the calculation. During decoding, the base value is then added again in each encoding round. The base value per encoding round is always the same constant. The reason is that, in this way, storage space can be saved. Besides that, it is possible to sort code lists, after encoding, in increasing order according to the size of the encoding results. By using formula (1a), the sorted code lists will start with number value 1. Therewith, the number values already indicate their folder positions in the sorted code lists.

In a more general formula: $1*BN^1$ can be subtracted from the results after each calculation of 2 number values.

If encoding takes place per 3 number values, the following constant value can be subtracted after each calculation: $1*BN^2 + 1*BN^1$.

In the case of encoding per 4 number values, the formula is: $1*BN^3 + 1*BN^2 + 1*BN^1$ and so on.

EXAMPLE

Assume that, in the first encoding round, 4 times the number values of 1, being the lowest possible number value in the first encoding round, is encoded with base value 257. This supplies the following unique number value:

$$1*257^3 + 1*257^2 + 1*257^1 + 1*257^0 = 17,040,900.$$

This unique number value would then be stored in permanent code list PCL(1). However, if $1*257^3+1*257^2+1*257^1$ were to be subtracted from the above-mentioned encoding result, only a number value of 1 would remain. In that case, only a 1 would be stored in the permanent code list PCL(1) instead of 17,040,900.

For the following encoding rounds, the same kind of modification can be executed.

Encoding Round 3

Based on Folder(1), processor 5 generates a subsequent Folder(2) in a similar manner as processor 5 generated Folder (1). To that end, processor 5 applies a function F2(Folder(1)), that again combines 2 or more consecutive index values in Folder(1) to 1 new value. The number of combined values originating from Folder(1) may concern the same number as in function F1 (Folder(0)), but may also differ therefrom. Function F2 may, in principle, differ from function F1. In the example given here, however, function F2(Folder(1)) has the same structure as shown in formula (1)/(1a). Only function F2 will have a base value BN2 that can differ from base value BN1 of function F1.

Processor 5 now calculates a subsequent temporary code list TCL(2) with the aid of the following formula:

$$F2(\vec{V}) = \sum_{n=0}^{n=N} [V_n * BN2^n] \quad (3)$$

Instead of formula (3), formula (1a), in which BN1 is replaced by BN2, can be used.

For the sake of convenience, this formula is based on the vector $\vec{V}$ having just as many arguments (N) as in formula (1), every time formula F2 is applied. In the example applied in the figure tables, for example, the formula is always applied to N=2 elements in each encoding round. That is allowed to be different, however.

In the example shown in the table of FIG. 2, the temporary code list TCL(2) comprises four values: F2(1;2), F2(3;2), F2(1;3), and F2(1;2). On the basis hereof, processor 5 builds a subsequent permanent code list PCL(2) that still contains only the unique values occurring in the temporary code list TCL(2): F2(1;2), F2(3;2), and F2(1;3). Processor 5 subsequently generates Folder(2) by taking as a departure point the temporary code list TCL(2), but replacing each value therein by an index that refers to the position of one of the values in the permanent code list PCL(2). Again: the values in the permanent code list can be stored in a space-saving manner as desired, such as already explained above. As shown in the table in FIG. 2, Folder(2) still comprises only 4 values: 1, 2, 3, 1.

Encoding Round 4

In encoding round 4, processor 5 again generates a temporary code list TCL(3), a permanent code list PCL(3) and a folder(3). In principle, this is done in the same manner as explained above, in regard to generating the temporary code list TCL(2), permanent code list PCL(2) and Folder(2). The function F3 that is used for this can again be similar to formula (1)/(1a), with a base value BN3 that will differ from base values BN1 and BN2.

The temporary code list TCL(3) then still contains two values: F3(1;2), and F3(3;1). These differ from each other. The permanent code list PCL(3) that must contain all unique values occurring in the temporary code list TCL(3) must therefore be equal to temporary code list TCL(3). Thus, Folder(3) will contain two different index values 1, 2. Since temporary code list TCL(3) and thus Folder(3) in this example no longer have any redundancy, no further data reduction will be achievable anymore. Therefore processor 5 is programmed to establish in each encoding round whether generated permanent code list PCL(i) contains less unique values than the number of values that are present in the temporary code list TCL(i). Processor 5 can establish in an alternative manner whether there is still redundancy or not, by checking whether Folder(i) contains only unique index values. Stated otherwise: as soon as the number of elements in Folder(i) is equal to the highest number position in Folder(i), all number values in the related temporary code list TCL(i) are unique and redundancy is no longer present. If redundancy is no longer present, processor 5 stops encoding, since further encoding would only lead to data increase and thus to more required and unnecessary storage space.

The tables in FIG. 2 show that, in principle, the encoding can be continued until one end-code remains. This only makes sense if still further data reduction can be achieved. In the situation of FIG. 2 that is not the case, but the following step is still shown for the sake of completeness. The two codes present in Folder(3) can again, with a formula such as shown above in formula (1) or formula (1a), be taken together and result in one new value, indicated in the tables in FIG. 2 by temporary code list TCL(4)=F4(1;2). The new value F4(1;2) matches a permanent code list PCL(4) that is identical to the temporary code list TCL(4). A last Folder(4) contains only a "1" that refers to the single code in the permanent code list PCL(4). The value F4(1;2) that is stored in Folder(4) can thus be considered as being the representative of the whole encoded data file.

The value "1" in Folder(4) is the end-code. In the scope of the invention, however, the processor 5, after completing the encoding round 4, has established that neither temporary code list TCL(3) nor permanent code list PCL(3), and nor Folder (3) contain any more redundancy. Processor 5 will therefore, according to the invention, terminate further encoding after encoding round 4. In that case, the end-code of the encoding is equal to the content of Folder(3) and thus consists of two values, namely "1" and "2".

Reference Database

After completion of the encoding process discussed above, all permanent code lists PCL(i) together form a reference database in which each unique number value from each encoding round is stored only once. The reference database is built up in this manner from the encoded data. In that context, the reference database can be considered as being a self-generating database.

The power of the encoding program is the learning effect of that which is encoded. The more encoding that takes place, the greater the chance that recognition of already encoded number values will take place. The learning effect will eventually provide for saving of storage space.

As mentioned, a reference database can be compiled prior to the encoding process. The big advantage is then that each receiver can already have such a reference database stored in its memory, and thus the reference database does not have to be sent from the transmitter to the receiver, which does contribute towards data reduction. Anyone all over the world can moreover have the same database at their disposal. Worldwide, it would then suffice to send only end-codes.

Predetermined base values, be it other base values BN per encoding round, can then be taken as a point of departure. Because of the fact that, for each encoding round, the base value to be used is already known beforehand, as well as the fact that the number of folder positions to be encoded and the number of encoding rounds can be freely determined, the universal reference database can already be calculated before the encoding process has yet started. After all, this reference database then contains all values that can be adopted for the related encoding round when the determined base value is used. It is also possible to establish this calculation of the reference database in a software program. The storage of such a calculation program would take up only little space compared to establishing a reference database with all possible values, and would prevent the reference database itself from having to be transmitted.

As an intermediate solution, the processor 5 can take as a point of departure a partially universal database and extend this universal database with number values that it encounters in a temporary code list TCL(i) that are not yet present in this universal database. In a way, a self-generating database also comes into existence, but then one that is partly universal.

Decoding Process

Decoding unit 3 (FIG. 1) now only requires the following data to reconstruct the original dataset:

1. the end-code; in the scope of this invention, this is the assembly of all index values that are present in the last Folder(3), since the processor 5 has established that, after generating temporary code list TCL(3), permanent code list PCL(3) and Folder(3), these lists no longer contain any redundancy and the processor 5 thus thereafter has terminated the encoding process. In this case, the end-code thus contains two values, namely "1" and "2";
2. the number of encoding rounds applied by encoding unit 1, as well as the function that was used in the related encoding round to calculate the temporary code list from the folder of the previous encoding round. Preferably, a fixed decoding program is used that is related to a certain fixed encoding program. The function and any base value used are then laid down per round, so that the decoding unit does not need to receive any data in that regard. Alternatively, a decoding unit receives data in regard to the functions that are used per encoding round (that can be a reference to one of many known functions). If a function such as function (1) or (1a) is used, it can suffice for the decoding unit to receive data that indicate this, and for it to only need to know per round which base value BN was used; and
3. the reference database, that can consist of all permanent code lists PCL(i) per encoding round (a 100% self-generating database), a completely universal database, or a combination of both (partially self-generating database). The part generated by encoding unit 1 must be sent to decoding unit 3. A variable bit encoding scheme may have been applied to that permanent code list. If that is the case, then the decoding unit 3 must have received the rules for the same from encoding unit 1, or know otherwise. A (possibly partial) universal code list can be stored beforehand in decoding unit 3.

If all this is known to decoding unit 3, then the decoding unit 3 can execute the decoding process in a loss free manner. The decoding process takes place in the reverse order to the encoding process. That will be briefly discussed for the situation in which the encoding unit 1 has compiled the permanent code list itself, using the formula shown in (1).

The end-code from the last-formed Folder(3) consists of one or several index values. All these index values are repeatedly divided by the base value BN3, (thus by $BN3^0$, $BN3^1, \ldots, BN3^N$,) corresponding to the last encoding stroke until the folder values in the previous Folder(2) are regained. The folder values Folder(2) thus obtained are used, with permanent code list PCL(2), to obtain the previous Folder(1). To this end, the folder values in Folder(2) are repeatedly divided by the base value BN2 until the folder values in the previous Folder(1) are regained that refer to the number values in the corresponding permanent code list PCL(1).

This process is repeated until the original dataset is regained.

With that, the original encoded data is retrieved again in the original state and form, without any loss of information.

Remarks/Variants

Byte Encoding of Data

Byte encoding can be applied to all data in any form whatsoever, image, sound, or text. Processor 5 encodes at byte level such that the results per encoding round are expressed in number values, are compared with each other and only the unique number values are stored once only in permanent code lists. In this manner, it is possible for image, sound and text to be encoded and decoded simultaneously using the same encoding/decoding program. Moreover, byte encoding makes it possible, in the case of encoding of image, sound and text, mixed and in absolutely random sequences, for use only to have to be made or to be able to be made of one and the same reference database.

The number of bytes that, per encoding round, can be collectively encoded to a new code, for example with the aid of formula (1), can be determined freely per encoding round but cannot vary during an encoding round. That also applies if a choice is made for encoding at a level other than dan bytes, for example pixel values, number values, lines, and so on.

Number Encoding of Text Data

In the case of the encoding/decoding of text, it is also possible to use encoding in advance of the individual letters, punctuation marks, numerals etc. (characters') in unique number values. For that, reference is made to Hagamen e.a. [1972], for example.

A possible number value encoding could be the positions of characters in the alphabet: the letter 'a' is represented as '1', the letter 'b' as '2' etc. Blanks, for example, are encoded as '0'. Besides that, it is possible in this case to apply a variable bit encoding scheme, in which the most frequently occurring letters are presented as a lowest possible number value and are stored in the memory using fewer bits. To that end, Huffman encoding, for example, can be applied.

In this way, combinations of letters, being words, are represented as a combination of numbers in unique number values which are stored once only in the respective permanent code lists. In that event, use can be made of formula (1)/(1a). No collective encoding of a fixed number of bytes takes place here, but of all or a maximum number of characters, being letters per word or punctuation marks, numerals, blanks etc.

Subsequently, groups of words, now being number values, are further encoded in such a way that lines, sentence parts, sentences, paragraphs, pages etc. are represented as unique number values which are stored once only.

The measure of efficiency in storage capacity is therefore dependent on the measure of agreement of words, sentence parts, lines etc. in text data. The more frequently the same words, sentence parts etc. occur in the text data to be encoded, the greater the storage efficiency.

Hagamen e.a. [1972] discloses that research into German books has shown that, in German texts, 1000 words represent approximately 70% of the text data. These 1000 words could therefore, with regard to a German text, be included in a standard permanent code list. Thus only the remaining 30% then needs to be determined by the processor 5, and stored and sent to the decoder 3 with the remaining data. For other languages, similar patterns would be able to be established.

The encoding/decoding of text data is not language-specific. Any text data, in any language whatsoever, can be encoded into unique number values, even simultaneously.

Reference Database

In the case of either byte encoding, number encoding or pixel coding, the unique number values per encoding round are finite, from which it follows that the ultimate reference database will also be finite in magnitude. In all encoding variants, incidentally, the same reference database can be used.

By way of illustration:

The Dutch language, but other Germanic and Anglo-Saxon languages as well, have a total of approximately 128 letters, numerals, script characters etc. in which the number of possible combinations, in practice, is finite. A large number of theoretical combinations, for example five times an "f" consecutively, hardly ever occurs in practice. The same applies for images and sound: a large number of theoretical combinations will (hardly) ever occur in practice.

In summary, the reference database can be compiled in different ways:

1. Self-Generating Reference Database

Processor 5 takes as the point of departure an empty reference database in which no code whatsoever is yet included. Dependent on the data to be encoded, processor 5 extends the reference database (that is to say, with the permanent code lists), starting with zero codes. With that, the reference database formed is directly related to the encoded dataset. Not all combinations of theoretically possible occurring number values will occur in a self-generating reference database; only combinations of number values actually occurring in practice as codes will be included in the reference database. By way of illustration: combinations of letters which do not occur in the Dutch vocabulary will therefore not occur in a self-generating reference database either. A self-generating database can be used for the encoding of one or several datasets. If used for the encoding of only one dataset, then a self-generating database is also called an autonomous reference database. Together with the end-code, such an autonomous reference database can be smaller than the encoded original data file. For transmission and storage of this specific database, less space is therefore required. This could be interesting for certain applications, namely if a device has a limited storage capacity at its disposal. In that regard, mobile telephones for the transmission of photographs and small films can be borne in mind. In the event that a self-generating reference database is used for the encoding of (much) more datasets, this database can 'develop' into a universal reference database.

A self-generating database allows an own (unique) base value to be used that other data to be encoded cannot use. By way of illustration: if DVD 1 is a black-and-white film and DVD 2 is a colour film, the codes of both films will differ strongly. In DVD 1, purely hypothetically stated, only two RGB values would occur. And therewith, in the first encoding round, a base value of only 3 would suffice. It would be absolutely impossible to encode DVD 2 using such a base value however, since here 256 different RGB values can occur. On the other hand, a base value of 257, that is necessary for the first encoding round of DVD 2, would result in codes having an unnecessarily high value if that were to be used for encoding the black-and-white DVD 1.

2. Self-Generating Reference Database on the Basis of Existing Minimum Standard Database Processor 5 takes as the point of departure a minimum standard reference database in which, prior to the encoding, frequently occurring codes are already included. Dependent on the data to be encoded, processor 5 extends the reference database (that is to say, the permanent code lists). With that, the reference database formed is directly, but not 100%, related to the encoded data. Each item of data to be newly encoded uses the reference database already available and extends this, or does not, with unique number values not yet occurring in the database.

The minimum standard reference database can, but need not, be universal. The minimum standard reference database can be based on a previous set of data, for example coupled to a previously encoded DVD. As more data becomes encoded, the extension of new unique number values not yet occurring in the reference database will decrease. The more data that is encoded, the greater the chance of the unique number values already being included in the reference database.

Not all combinations of theoretically possible occurring number values will occur in such a self-generating reference database. By way of illustration: combinations of letters which do not occur in the Dutch vocabulary will therefore not occur in such a self-generating reference database either. For instance, in the Dutch language a combination of five identical successive letters, for example, is in general not possible.

In this case, the standard universal database can already be stored at a decoder, and the encoding unit would only still have to transmit the extended information for the reference database. Each time a set of data is encoded, the reference database at the decoder can be extended by new values that can be added to the reference database, as well as codes referring to these new values. The combinations of such new values and new codes can, then, be distributed to one or more encoders such that they are available for future use by the decoders. This will eventually result in a reference database comprising most relevant data.

3. Universal Reference Database

Prior to the encoding of data, regardless of which, and knowing the number of encoding rounds to be executed, the number of number values to be encoded and the base value to be used per encoding round, the reference database can be compiled, for example by means of a software calculation program. In that case, the reference database consists of all 'theoretically' maximally possible occurring unique number values per encoding round to be executed. Encoding of data is necessary in that case to determine the position of the unique encoding results in the reference database. In contrast to self-generating databases, combinations of data to be encoded which in practice would never occur, are indeed included in universal databases. A universal reference database can also be created from a self-generating database, if this is always used for datasets to be newly encoded. In contrast to a previously compiled universal database, not all 'theoretically' maximally possible unique number values will occur in a self-generated universal database.

A universal reference database can be used in an advantageous manner as follows. Assume that a universal reference database is formed for a predetermined number of encoding rounds, for example 15 encoding rounds, with fixed formulae and base values per round. This does not necessarily imply that each encoding process will actually have to consist of 15 encoding rounds. If it were found that, in a certain encoding process, after 4 encoding rounds a situation already develops in which PCL(i)=TCL(i), then processor 5 can terminate the encoding process for this dataset, and processor 5 would not need to execute the remaining 11 encoding rounds. That would only require unnecessary storage capacity as well as encoding/decoding time. For decoding, only the information needs to be provided that the decoding process consists of only 4 decoding rounds. With that, the encoding of individual datasets has become quite flexible and, for each encoding process, aimed at a result with the largest possible efficiency with regard to the storage and the encoding/decoding time, provided the number of encoding rounds, that is, 15 in this example, is not exceeded.

Central Reference Database

In the case of a self-generating reference database as well as in the case of a self-generating reference database based on an existing minimum standard database, only one and the same reference database need be taken as point of departure when encoding all possible data types. This has the advantage that, after the encoding of various data files, increasingly less unique encoding results need to be added to the reference database as more and more data files are encoded. If the same reference database, which is used in the event of each encoding of these data files, is available to the receiver, only a small number of new unique encoding results need to be transmitted to the receiver besides the unique end-code(s), which need to be added by the receiver to the reference database which is already in his possession.

As the receiver wishes to receive more encoded data files (video, audio, text etc.), the unique encoding results that 'his' reference database still lacks will become increasingly fewer, but in any case will be (much) fewer than the original encoded data files.

End-Code

The unique end-code resulting per encoded data can be obtained by:

1. One Unique End-Code

The whole encoding process takes place just as long as only one unique number value remains in PCL(i), TCL(i) as well as in Folder(i). The unique number value in Folder(i) can then be considered as the end-code of the related encoded data file. In that case, the last index value in Folder(i) will be equal to "1". This can result in problems during decoding, unless one knows exactly to what this value "1" refers and how many encoding rounds have taken place. If, on the other hand, the encoding is terminated sooner because further encoding will not be profitable due to lack of redundancy in the temporary code list TCL(i), the permanent code list PCL(i) and in Folder (i), the related end-folder will consist of a series of index values that in regard to composition will be absolutely unique.

2. PCL(i)=TCL(i)

As soon as the situation occurs during the encoding that, in a temporary code list TCL(i), all codes are different, it holds that PCL(i)=TCL(i). There is then no longer any redundancy. This means that further continuation of the encoding process will not result in a profit regarding storage capacity of encoded number values. All unique number values in subsequent permanent code lists PCL(i)s also correspond with the respective codes in the temporary code lists TCL(i)s. There is no point in further encoding, which would devalue the profit that could be reached in terms of storage capacity. In that case, the last Folder(i) related to permanent code list PCL(i) or temporary code list TCL(i) can be regarded as end-code.

3. Unique Number Value in the Case PCL(i)=TCL(i)

If PCL(i)=TCL(i), the first number value and the last number value in the related Folder(i) are also known. The last number value being known, the number of elements in the related Folder(i) is also known. In that case, as an alternative, the highest value in the related Folder(i) can be regarded as end-code. In the situation of FIG. 2, Folder(3), for example, can be regarded as end-code. Alternatively however, the value "2" can be regarded as end-code, that is to say, the highest value in Folder(3). After all, if a decoding unit receives the value "2" as end-code, it also knows that the last generated folder must also contain the value "1".

Encoding/Decoding

The encoding and decoding of data can take place independently at physically different locations. Thus the encoding of data can take place at a central physical location, and the decoding can take place at a random location anywhere in the world.

Transmission

Transmission of the end-code, the reference database and so on can take place in many different ways, including via data carriers, such as CDs, DVDs, BluRay, memory sticks, but also via a telecommunications network, for example via SMS or e-mail.

Encoding

The encoding of each form of data needs to take place only once; once encoded, data does not need to be encoded again.

The speed of encoding of data can take place on a 'real-time' basis, enabling inter alia encoded TV programs to be broadcast live on TV, the Internet, mobile telephones and so on, which will result in considerable savings in the bandwidth capacity available.

Decoding

For the decoding, the 'receiver' needs to have the decoding program, the reference database and the unique end-code at their disposal.

Dependent on the manner in which the reference database is compiled, self-generating or universal, only the acquisition of the end-code and a few data regarding the decoding program (how many rounds does it need to apply and what was the base value per encoding round?) are necessary for the decoding of encoded data. For the decoding, the following must be available:

1. The decoding program;
2. The reference database, either self-generating or universal (an autonomous database is a special form of a self-generating database);
3. The number of encoding rounds executed;
4. The base values used in each encoding round; and
5. The unique end-code.

In the event that use is made of a (self-generating) universal database, the number of encoding rounds executed and the base values used per encoding round can be laid down beforehand and thus be pre-programmed in the decoding program. This information need therefore not be separately transmitted to the receiver. In that case, just receiving the unique end-code is sufficient.

Base Value

The base value to be used is dependent on the number of elements to be encoded in Folder(i) or on the highest number value in Folder(i) to be encoded. If, in a certain Folder(i), all index values are successive (that is, always vary in value by "1"), the base value must minimally be one higher than the number of elements or the largest number in Folder(i). The base value can be automatically determined per encoding round every time again by processor 5. Processor 5 then adds information in that regard to the data that, with the permanent code list, has to be sent to a receiver. The latter is not necessary if the same base values are taken as a departure point by default. Herewith, the decoding program is then already known.

Universal Database

In the event that a universal database is used, the base value used for each encoding round can be fixed.

Self-Generating and Autonomous Database

In this case, the actual number of elements per Folder(i) or the highest number value from each previous Folder(i) is taken into account. Prior to each encoding round, the most optimal base value variable can be calculated by the encoding program.

If a self-generating database is used for the encoding of several datasets, the theoretically maximum base value shall have to chosen as base value.

Sorting and Difference Calculation of Reference Databases

Reference databases, regardless of the manner in which they are compiled, can be sorted according to the size of the codes before transmission to a receiver takes place. If the last number value, being the highest, is taken as point of departure, the mutual differences between the number values can be calculated. Then, for example, only this highest value can be stored, as well as all difference values with the remaining values occurring in the reference database. These difference values will, together with this highest value, be able to be registered in much fewer bytes than the original values in the reference database. In this manner, without loss of information, a considerable efficiency in storage and in the transmission of the database can be achieved.

Security Encoded Data

Decoding of encoded data such that the original data is again retrieved is only possible if the decoder is familiar with the encoding formula, base value, number of encoding rounds used for encoding as well as the end-code.

Unfamiliarity with one of these required parts will result in decoding for the retrieval of the originally encoded data being impossible. If, for example, only the base value used is not known by the decoder, it will therefore be completely impossible for the relevant decoder to retrieve the original data. Everyone (individuals, enterprises, organizations, institutions, governments, and so on) can therewith determine on their own by whom the data encoded by him or her may or can be decoded into visible/audible original data.

Besides that, it is possible to process (encrypt') the reference database and/or the end-code such that, for example by randomly changing the order of data in the reference database and/or end-code or the data in the reference database and/or having random operations executed, that unfamiliarity with the operations executed will render correct decoding impossible.

Preprocessing of Data to be Encoded

Possible preparatory steps that can be executed on the original dataset prior to the encoding process are (Note: not all examples are lossless operations):
1. Conversion of RGB to YUV values in video/photo;
2. Replacement of pixels by the average of the pixel itself, the pixel to the right, to the bottom right and below or other manner of calculation of average pixel values;
3. Quantization;
4. Only register differences between consecutive frames;
5. Discrete cosine transformation;
6. Noise filters;
7. Variable run length encoding;
8. Huffman encoding;
9. Bloom filter;
10. Hash tables;
11. Hash functions;
12. Chroma sub-sampling;
13. Butterworth filter;
14. DCT-matrices (Discrete Cosinus Transform); and
15. Only register differences between DC- and/or AC- values in consecutive DCT-matrices.

Postprocessing of Encoded Data

Possible postprocessing operations on the permanent code list can be:
1. Rar
2. Zip
3. Deflate

SUMMARY OF THE INVENTION

In summary, the encoding method according to the invention as illustrated with reference to FIGS. 1 and 2 comprises at least the following actions:
a) defining an integer value i=0 and a reference database;
b) the storage of the data in an i-th temporary code list (TCL(i));
c) generating an i-th folder (Folder(i)) from the i-th temporary code list (TCL(i)) by, in each position thereof containing a value, replacing the value by an index that refers to the position of the same corresponding value as stored in the reference database;
d) generating a series of new temporary codes and placing thereof in an (i+1)-th temporary code list (TCL(i+1)), in which each new temporary code is calculated using a predetermined formula F that always combines at least two values from the i-th folder (Folder(i));
e) generating an (i+1)-th folder (Folder(i+1)) from the (i+1)-th temporary code list (TCL(i+1)) by, in each position thereof containing a value, replacing the value by an index that refers to the position of the same corresponding value as stored in the reference database;
f) checking whether at least one of the (i+1)-th temporary code list (TCL(i+1)) and the (i+1)-th folder (Folder(i+1)) contains one or more values more than once; if not, then jumping to action g); if yes, then incrementing the value of i by 1 and jumping to action d); and
g) terminating the encoding.

The invention, however, also relates to an encoding unit having a processor and a memory, in which memory data and instructions of a computer program are stored, arranged such that these provide the processor with the ability to execute this method.

The invention also relates to a computer program product having data and instructions arranged such that these, after having been received by a processor, provide the processor with the ability to execute this method.

The invention also relates to a data carrier or signal provided with such a computer program product.

In summary, the decoding method according to the invention comprises at least the following actions:
a) receiving the end-code comprising an (i+1)-th folder (Folder(i+1)) generated ultimately by an encoding unit or a unique reference thereto, and receiving the value of i;
b) using values in the (i+1)-th folder (Folder(i+1)) as index values that refer to values in a reference database;
c) calculating values in an (i+1)-th temporary code list (TCL(i+1)) by placing, in each position in the (i+1)-th folder (Folder(i+1)), a value from the reference database having the index value corresponding to that position;
d) calculating values in an i-th folder (Folder(i)) by applying a decoding formula to the (i+1)-th temporary code list (TCL(i+1)), the decoding formula being an inverse formula of a formula that has been used by the encoding unit for calculating the (i+1)-th temporary code list from the (i)-th folder (Folder(i)), wherein the i-th folder (Folder(i)) comprises N times as many values as the (i+1)-th temporary code list (TCL(i+1)), where $N \geq 2$;
e) using the values in the i-th folder (Folder(i)) as index values that refer to values in the reference database;
f) calculating values in an i-th temporary code list (TCL(i)) by placing, in each position in the i-th folder (Folder(i)), a value from the reference database having the index value corresponding to that position;

g) decrementing the value of i by 1; if i≧0, calculating values in an i-th folder (Folder(i)) by applying a decoding formula on the (i+1)-th temporary code list (TCL(i+1)), the decoding formula being an inverse formula of a formula that has been used by the encoding unit for calculating the (i+1)-th temporary code list from the (i)-th folder (Folder(i)), wherein the i-th folder (Folder(i)) comprises N times as many values as the (i+1)-th temporary code list (TCL(i+1)), where N≧2, and jumping back to action e); if i<0, jumping to action h); and h) deriving an original dataset from the i-th folder, where i=0.

Embodiment Based on Pre-Encoded Original Data.

Now an embodiment of the invention will be described in which the original data encoded with the encoding technique of the present invention is itself already the result of an encoding in which a DCT (Digital Cosine Transformation) process is used. Such a DCT process is used, for instance, in a part of the JPEG encoding process, and is a lossy encoding technique when used in combination with a quantization action.

The relation between the size of the reference database and the number of codes in the last File( ... ) is like "communicating vessels": the larger the one the smaller the other one. Such a "communicating vessels" relation is present in whatever data is encoded, be it text, audio and video. DCT conversion can be used independent from the type of input data, i.e. text, audio or video.

The more encoding rounds are performed the larger the chance that the result of a encoding step is unique and should be stored in the reference database. Moreover, each encoding result will become larger as its value is concerned because of the necessarily increasing value of the base value. However, after each next encoding round the number of codes in File(i) will become smaller but due to the increased reference database the values of the codes in File(i) will become larger.

Therefore, in some cases, applying the encoding rounds until the criterion is met that all codes in the last File(i) are unique as explained above, will eventually result in a small number of codes in the last File(i), however, may also result in a unacceptably large reference database. Transmission of such a large reference database could, therefore, in practice, be impossible.

An embodiment, now to be described in detail, takes this into account. In that embodiment, a DCT process is used. A DCT process is, for instance used in the well known JPEG encoding. Briefly stated, JPEG uses the following process steps:

1. transformation of RGB (Red, Green, Blue) data into YCbCr or YUV data;
2. sub-sampling the YcbCr or YUV data;
3. dividing pixels of video frames into 8*8 pixel matrices;
4. applying DCT process to 8*8 pixel matrices;
5. quantisation of all values in 8*8 DCT pixel matrices in values between 0 and 100;
6. converting the 8*8 DCT pixel matrices into 64 vector values using a "zig-zag" read pattern in these matrices; and
7. entropy encoding of the 64 vector values using RLE (Run Length Encoding)/Huffman encoding.

As experiments have shown, the principles of the present invention can be advantageously applied on data obtained after step 5 or 6, where it is observed that step 2 is optional. Moreover, the input data to step 3 does not necessarily need to relate to video frames. The principles of this embodiment are equally well applicable to data from other sources than video. Data from such other sources can also be grouped into 8*8 matrices that can be subjected to a DCT process.

Starting with video data an input 8*8 pixel matrix may, for instance, comprise the following values:

TABLE A

| 154 | 123 | 123 | 123 | 123 | 123 | 123 | 136 |
| 192 | 180 | 136 | 154 | 154 | 154 | 136 | 110 |
| 254 | 198 | 154 | 154 | 180 | 154 | 123 | 123 |
| 239 | 180 | 136 | 180 | 180 | 166 | 123 | 123 |
| 180 | 154 | 136 | 167 | 166 | 149 | 136 | 136 |
| 128 | 136 | 123 | 136 | 154 | 180 | 198 | 154 |
| 123 | 105 | 110 | 149 | 136 | 136 | 180 | 166 |
| 110 | 136 | 123 | 123 | 123 | 136 | 154 | 136 |

Applying a DCT process to this matrix results in the following 8*8 DCT pixel matrix when a quantization of 50 (Q=50) is applied:

TABLE B

| 10 | 4 | 2 | 5 | 1 | 0 | 0 | 0 |
| 3 | 6 | 1 | 2 | 1 | 0 | 0 | 0 |
| 1 | 2 | 1 | -2 | -1 | 0 | 0 | 0 |
| 1 | 3 | 0 | -1 | 0 | 0 | 0 | 0 |
| -2 | 1 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |

As is evident from this example, the 8*8 DCT pixel matrix has many zero values which provides a good basis for further compression of the data, as will be evident to persons skilled in the art.

Now, two alternative ways of such further compression are shown using the principles of the present invention. Basis for the further explanation is a DCT matrix 1, which equals Table B as shown above, in combination with three other DCT matrices: difference DCT matrix 2, difference DCT matrix 3 and difference DCT matrix 4 which are derived from three consecutive pixel blocks of an exemplary video frame where each consecutive difference DCT matrix is obtained by subtracting a DCT matrix k (k=2, 3, 4) from its predecessor DCT matrix k−1. FIG. 3 shows these four matrices.

Alternative 1.

In the first alternative, the 8*8 DCT pixel matrix of table A is read according to a zig-zag pattern as also used in the JPEG process referred to above. This renders a vector with 64 DCT pixel values with many zero values at the end:

Vector with 64 DCT values

| 10 | 3 | 4 | 2 | 6 | -1 | 1 | 2 | 1 | 5 | 1 | 2 | 1 | 3 | -2 |
| 0 | 1 | 0 | -2 | 1 | 0 | 0 | 0 | -1 | -1 | 0 | 0 | 0 | 0 | |
| 0 | 0 | 0 | 0 | 0 | 0 | 0 | 0 | 0 | 0 | 0 | 0 | 0 | | |
| 0 | 0 | 0 | 0 | 0 | 0 | 0 | 0 | 0 | 0 | 0 | 0 | 0 | | |
| 0 | 0 | 0 | 0 | 0 | 0 | 0 | | | | | | | | |

Note that these 64 DCT values are not organised in a 2-dimensional matrix anymore but on a 1-dimensional line.

Encoding Round 1.

Now, encoding is performed by applying the encoding mechanism as explained with reference to FIG. 2 on sets of two DCT values, i.e., on two consecutive bytes. The number of possible different unique values of two such bytes of 8 bits is $2^{16}=65.536$. So, this is also the maximum number of different values that may be present in reference database 1 after the first encoding round. Also the maximum number of key codes is 65.536 after the first encoding round. Since each one of these different values is expressed in two bytes, the maximum size of the reference database 1 after the first encoding round is 65.536*2 bytes=131.072 bytes which equals 128 Kb.

Encoding Round 2.

Now, two positions from File(0) are encoded. Since each such position comprises 2 bytes (cf. encoding in the first round), now a total of four bytes are encode together. So, the total number of different combinations of values in the second round is 2^32=4.294.967.296. This is the maximum number of different unique combinations of values resulting from encoding round 2 that need be stored in reference database 2. The maximum number of key codes is also 4.294.967.296.

Since every combination of values comprises four bytes as a maximum, the maximum size of the reference database from encoding round 2 is 16 Gb.

In other words, when encoding combinations of two values two times (i.e. in two rounds), each value having a size of one byte, the maximum size of the reference database is 16 Gb. Such a reference database can be considered a universal database that can easily be transmitted to third parties.

An example may further illustrate this. Using the encoding technique of this example, 120 Gb of video data from a Total 19 DVDs was encoded. The reference database resulting from encoding these 120 Gb had a size of 365 Mb. After applying a compression action in accordance with Winrar to these 365 Mb a reference database of 130 Mb resulted.

In the attached figures, these two encoding rounds are explained in detail for four DCT matrices:

FIGS. 3-10 explain these encoding rounds for four consecutive DCT matrices in an exemplary video frame (note: they could also have resulted from a JPEG picture or an MP3 audio file; and FIGS. 11-17 explain these encoding rounds for the first DCT matrix of FIG. 3 and three consecutive difference DCT matrices based on the other three DCT matrices of FIG. 3.

FIG. 3 shows four DCT matrices originating from four consecutive 8*8 matrices in an exemplary video frame.

FIG. 4 shows four DCT matrices resulting from these four DCT matrices after reading them out in a zig-zag pattern.

FIGS. 5A and 5B together show the results of a first encoding round performed on these four zig-zag pattern matrices while using formula (I). In encoding round 1, the base value BN=256 since each value to be encoded is itself 8 bits (one byte). Temporary code list TCL(0), permanent code list PCL(0) and File(0) are obtained in the same way as explained above with reference to the earlier examples. In the example here, permanent codelist PCL(0) is produced during the process of encoding itself. However, use can be made of an already available reference code list.

FIG. 6 shows the results of a second encoding round performed on the results of the first encoding round. Again two values are encoded together using formula (I). Since now two values of two bytes each need be encoded with this formula, the base number needs to be BN=2^16=65.536. Temporary code list TCL(1), permanent code list PCL(1) and File(1) are obtained in the same way as explained above with reference to the earlier examples. In the example here, permanent codelist PCL(1) is produced during the process of encoding itself. However, use can be made of an already available reference code list.

FIG. 7 shows the reference databases resulting from encoding rounds 1 and 2 as well as the number of times a certain code occurs.

FIG. 8 shows how the reference database of FIG. 7 can be reorganized when taking into account how often a certain code occurs in the database. In the reorganized reference database, the most frequent value is located at the lowest possible position. The references to the codes, i.e. the "key codes", are amended such that the code occurring with the highest frequency gets the shortest possible reference number (or key code).

FIGS. 9A, 9B together show the results of a first encoding round performed on the four zig-zag pattern matrices of FIG. 4, however, now performed while using the referencing scheme of FIG. 8.

FIG. 10 shows the results of a second encoding round performed on the results of the first encoding round of FIGS. 9A, 9B.

FIG. 11 to FIG. 17 show essentially the same method as performed in FIGS. 3 to 10, be it now on difference DCT matrices. I.e., FIG. 11 shows four DCT matrices originating from the four consecutive 8*8 matrices of FIG. 3; the first one results from the first matrix of FIG. 3 after reading it out following a zig-zag pattern. The second, third and fourth matrix result from determining the difference between the original second, third and fourth matrix respectively and their predecessor, and after reading them out in a zig-zag pattern.

FIGS. 12A and 12B together show the results of a first encoding round performed on the four zig-zag pattern matrices of FIG. 11. Temporary code list TCL(0), permanent code list PCL(0) and File(0) are obtained in the same way as explained above with reference to the earlier examples. In the example here, permanent codelist PCL(0) is produced during the process of encoding itself. However, use can be made of an already available reference code list.

FIG. 13 shows the results of a second encoding round performed on the results of the first encoding round of FIGS. 12A, 12B. Temporary code list TCL(1), permanent code list PCL(1) and File(1) are obtained in the same way as explained above with reference to the earlier examples. In the example here, permanent codelist PCL(1) is produced during the process of encoding itself. However, use can be made of an already available reference code list.

FIG. 14 shows the reference databases resulting from encoding rounds 1 and 2 of FIGS. 12A, 12B and 13 as well as the number of times a certain code occurs.

FIG. 15 shows how the reference database of FIG. 14 can be reorganized when taking into account how often a certain code occurs in the database; the most frequent value is located at the lowest possible position in the reference database concerned.

FIGS. 16A, 16B together show the results of a first encoding round performed on the four zig-zag pattern matrices of FIG. 11, however, now performed while using the referencing scheme of FIG. 15.

FIG. 17 shows the results of a second encoding round performed on the results of the first encoding round of FIGS. 16A, 16B.

When using the scheme of FIGS. 11 to 17 the basic advantage is that the first value of the 64 value vector associated with the difference DCT matrices is lower. This first value is the DC component. It is known that DC values of consecutive DCT matrices of video frames are in most cases close to one another, and therefore after determining difference DCT matrices these DC values become much lower.

Differences between DC components of consecutive DCT matrices can be determined while using DPCM (Difference Pulse Code Modulation).

The example of FIGS. 3 to 17 shows that the number of elements in reference database 1 and 2 when applying the encoding technique according to the invention on DCT matrices and difference DCT matrices, respectively, is as follows:

|  | DCT encoding | Difference DCT encoding |
|---|---|---|
| Reference database 1 | 32 | 23 |
| Reference database 2 | 32 | 30 |

So, when using encoding based on difference DCT matrices more positions in File(0) and File(1) will have the same value. Therefore, after applying an additional encoding action based on e.g. Huffman, Run Length Encoding, ZIP or Winrar the resulting lossless compression will be better than based on pure DCT matrices.

So, the basic steps performed by the method illustrated with reference to FIGS. 3 to 10 can be summarized as follows:

a) receiving input data elements, which input data elements are obtained from:
  I. dividing data elements into M*M matrices, where M is an integer value;
  II. applying a DCT process to these M*M matrices rendering M*M DCT matrices with DCT data elements; and
  III. quantisation of all values in said M*M DCT matrices in values between a predetermined lower and higher limit rendering said input data elements, and b) applying a predetermined formula F which has at least the following component:

$$F(\vec{V}) = \sum_{n=0}^{n=N} [V_n * BN^n] \quad (1)$$

where:

$$\vec{V} = (V_0, V_1, \ldots, V_N) \quad (2)$$

= a vector, where $N \geq 1$, formed from $N + 1$ input data elements;

BN=a base value;
rendering a first series of codes;

c) storage of the first series of codes in a first temporary code list (TCL(0));

d) generating a first folder (Folder(0)) from the first temporary code list (TCL(0)) by, in each position thereof containing a value, replacing the value by an index that refers to the position of the same corresponding value as stored in a reference database;

e) generating a series of second temporary codes and placing thereof in a second temporary code list (TCL(1)), in which each new temporary code is calculated using said predetermined formula F that always combines at least two values from the first folder (Folder(0)), using a different value for base value BN; and f) generating a second folder (Folder(1)) from the second temporary code list (TCL(1)) by, in each position thereof containing a value, replacing the value by an index that refers to the position of the same corresponding value as stored in the reference database.

As explained above M may be equal to 8.

In the embodiment according to FIGS. 11 to 17, the second, third, etc. DCT matrices are difference DCT matrices.

In an embodiment, the actions I, II and III are also part of the invention as claimed.

Decoding is performed while using the inverse actions of the encoding actions defined above on the values contained in the second folder Folder(1). Such inverse actions as to decoding codes obtained by using formula (1) or (1a) have been explained earlier.

Additional actions are added to these basic actions when the method in accordance with FIGS. 8 to 10 is applied. Again, when one has to decode the result of the additional actions of these FIGS. 8 to 11, one has to apply the inverse actions of these additional actions too.

The same applies for decoding the results of the encoding process illustrated with reference to FIGS. 11 to 13, and FIGS. 15 to 17, respectively.

All these method actions can be performed by a suitably programmed computer arrangement as shown in FIG. 1. Moreover, these method actions can be implemented as suitable instructions in a computer program that can be loaded by such a computer arrangement. Such a computer program can be distributed via CD-ROMs, via the Internet etc., i.e., via any suitable carrier, be it a physical data carrier or a suitable carrier signal, to be transmitted via wired or wireless connections.

As in the example explained with reference to FIGS. 1 and 2, possible postprocessing operations on the permanent code list can be:

1. Rar
2. Zip
3. Deflate

Further Embodiment

In the examples of FIGS. 3-17 only two encoding rounds are applied, in the first round sets of two bytes are encoded and in the second round sets of two values each having 16 bits are encoded. Now, a further alternative will be described.

Reference is made to the 64 value vector illustrated above as resulting from the DCT matrix of Table B after zig-zag reading out. There are 39 zero values at the end. A run length encoding may be applied to these 39 zeros.

The entire 64 value vector is encoded by checking whether this 64 value vector already exists in a reference database. If not yet present, it is added to the reference database and a new reference (key code) is produced. Then, the 64 value vector is substituted by the new reference. However, if already present, the 64 value vector is simply substituted by the reference associated with this 64 value vector in the reference database.

In this embodiment, the maximum size of the reference database is not 16 Gb. It may get very much larger than 16 Gb. However, the number of key codes will be much smaller than in the case of the embodiment explained above where sets of two DCT values are encoded together using formula (1) or (1a).

Instead of 64 value vectors, sets of 4, 8, 16 and 32, etc. can be encoded in this way.

Note that in this variant, formula (1) is not used.

Still Further Embodiment

In a still further embodiment, an encoding technique is used in which the above technique of combining two or more data elements while using formula (1) or (1a) is combined with the above mentioned vector encoding.

The results of these two different techniques can be summarized as follows.

|  | Size: | |
| --- | --- | --- |
|  | Two encoding rounds per two bytes | encoding of 64 value vector |
| Reference database | smaller | larger |
| Key codes | larger | smaller |

So, encoding of two (or more) data elements together while using formula (1) or (1a) will render a reference database which is smaller in size than in the case of encoding 64 value vectors. However, the size of the key codes will be larger in the case of encoding two (or more) data elements together.

In case of encoding of two data elements of a 64 value vector as indicated above, there may be as many as 39 zero values at the end of the vector. So, these last 39 DCT values are all zero. Applying the technique of combining consecutively two data elements in two rounds renders a large number of encoding combinations of two times zero. This two times zero combination need only be placed once in the reference database, however, they do generate an unnecessary high number of key codes referring to these double zero combinations. They should all be stored and transmitted to a receiver.

One way to deal with this is to combine the above explained encoding techniques. I.e., one can encode a part of the 64 value vector by combining two (or more) consecutive data elements and applying formula (1) or (1a) to them, and encode the remainder of all DCT values together.

An example may illustrate this in more detail.

An 8*8 DCT matrix is subjected to a zig-zag ordering rendering a 64 value vector in which most zero values are located at the end of the vector values.

The 64 value vector is split in at least one first and at least one second part. The first part(s) are located at the beginning of the 64 value vector whereas the second part(s) are located behind the first part(s). The vector values of the first part(s) are encoded using formula (1) or (1a) applied on consecutive combinations of two (or more) values. The vector values of the second part(s), which will most probably comprise many zero values, are encoded by attributing a code to them at once.

In FIGS. 18 to 20, an example is shown in which the first 34 values of a 64 value vector are encoded using combinations of two consecutive values and formula (1), and the last 30 values of the 64 value vector are encoded at once. The combination of encoding per two consecutive values and the last 30 values at once renders substantially less key codes, i.e., 192 versus 108. De sizes of the reference databases are roughly the same. FIGS. 21 to 23 show the same actions as FIGS. 18 to 20, however, now applied to difference matrices. It is observed that the numbers given in the examples above are not intended to limit the scope of the invention. For instance, combinations of more than two consecutive values may be encoded while using formula (1) or (1a), and more or less than 30 values may be encoded at once.

To decode codes obtained by this combined way of encoding, one simply has to perform the inverse actions of the encoding actions defined above on the values contained in the second folder Folder(1). Such inverse actions as to decoding codes obtained by using formula (1) or (1a) have been explained earlier.

It is observed that in all embodiments, the invention includes:

1) A method of encoding;
2) An apparatus, e.g. a computer, to perform such an encoding method;
3) A computer program product that can be loaded by such an apparatus to perform said encoding method while in use;
4) A data carrier comprising such a computer program product, which data carrier can be a physical data carrier or a carrier wave;
5) A method of decoding;
6) An apparatus, e.g. a computer, to perform such a decoding method;
7) A computer program product that can be loaded by such an apparatus to perform said decoding method while in use;
8) A data carrier comprising such a computer program product, which data carrier can be a physical data carrier or a carrier wave;
9) A method that comprises both said encoding and decoding method;
10) An apparatus, e.g. a computer, to perform both said encoding and decoding method;
11) A computer program product that can be loaded by such an apparatus to perform both said encoding and decoding method while in use; and
12) A data carrier comprising such a computer program product, which data carrier can be a physical data carrier or a carrier wave.

The invention claimed is:

1. A computer-implemented method for the encoding of data in a dataset, comprising the following actions:
   a) defining an integer value i=0 and a reference database by an encoding unit;
   b) the storage of the data in an i-th temporary code list (TCL(i)) by the encoding unit;
   c) generating, by the encoding unit, an i-th folder (Folder(i)) from the i-th temporary code list (TCL(i)) by, in each position thereof containing a value, replacing said value by an index that refers to the position of the same corresponding value as stored in the reference database;
   d) generating, by the encoding unit, a series of new temporary codes and placing thereof in an (i+1)-th temporary code list (TCL(i+1)), in which each new temporary code is calculated using a predetermined formula F that always combines at least two values from the i-th folder (Folder(i));
   e) generating, by the encoding unit, an (i+1)-th folder (Folder(i+1)) from the (i+1)-th temporary code list (TCL(i+1)) by, in each position thereof containing a value, replacing said value by an index that refers to the position of the same corresponding value as stored in the reference database;
   f) checking, the encoding unit, whether at least one of the (i+1)-th temporary code list (TCL(i+1)) and the (i+1)-th folder (Folder(i+1)) contains one or more values more than once; if not, then jumping to action g); if yes, then incrementing the value of i by 1 and jumping to action d); and
   g) terminating the encoding by the encoding unit,.

2. The computer-implemented method for the encoding of data according to claim 1, comprising the commencement of action c) with:
   generating, by the encoding unit, a list that only contains all unique values from the i-th temporary code list (TCL(i)) once only and the storage thereof in an i-th permanent code list (PCL(i)) which forms part of the reference database;
and action e) commencing with:
   generating, by the encoding unit, a subsequent list that only contains all unique values from the (i+1)-th temporary code list (TCL(i+1)) once only and the storage thereof in an (i+1)-th permanent code list (PCL(i+1)) which forms part of the reference database.

3. The computer-implemented method for the encoding of data according to claim 1, comprising the use, by the encoding unit, of either a complete or partial universal reference database established in advance.

4. The computer-implemented method for the encoding of data according to claim 3, wherein the reference database is partially universal, and said method comprises the extension of said partially universal reference database by the commencement of action c) with:
the addition by the encoding unit of values from the i-th temporary code list (TCL(i)) to
the partially universal reference database if these do not yet occur therein;
and commencement of action e) with:
the addition by the encoding unit of values from the (i+1)-th temporary code list (TCL(i+1)) to the partially universal reference database if these do not yet occur therein.

5. The computer-implemented method for the encoding of data according to claim 3, in which the indices that refer to a value in the reference database are arranged according to a variable bit encoding scheme.

6. The computer-implemented method according to claim 2, in which a lossless compression algorithm is applied to the reference database.

7. The computer-implemented method according to claim 2, in which each i-th and (i+1)-th permanent code list is stored separately by the encoding unit and each i-th and (i+1)-th folder is compiled by the encoding unit with the smallest possible integer values.

8. The computer-implemented method for the encoding of data according to claim 1, in which the predetermined formula at least has the following component:

$$F(\vec{V}) = \sum_{n=0}^{n=N} [V_n * BN^n] \quad (1)$$

where:

$$\vec{V} = (V_0, V_1, \ldots, V_N) \quad (2)$$

$= a$ vector, where $N \geq 1$, formed from $N + 1$ consecutive values in the $i-th$ folder (folder(i));

BN=a base value.

9. The computer-implemented method for the encoding of data according to claim 8, in which the predetermined formula is the following:

$$F(\vec{V}) = \sum_{n=0}^{n=N} [V_n * BN^n] - BN^N. \quad (1a)$$

10. The computer-implemented method according to claim 8, in which N has a constant value for each value of i.

11. The computer-implemented method according to claim 8, in which N has a constant value for the same value of i, but may have another value for different values of i.

12. The computer-implemented method according to claim 8, in which each folder comprises consecutive index values that always differ from each other by a value of 1, and the base value has a value that is at least 1 higher than the highest index value in a folder to which the predetermined formula is applied.

13. The computer-implemented method according to claim 1, in which, after action g), an end-code is compiled, by the encoding unit, that comprises the folder (Folder(i+1)) generated ultimately, or a reference thereto, and making available, by the encoding unit, the end-code, as well as data related to the formula used for calculating each i-th and (i+1)-th temporary code list, to a decoding unit.

14. The computer-implemented method according to claim 13, characterized in that the ultimately generated folder (Folder(i+1)) comprises index values that always differ from each other by a value of 1 and that the end-code is equal to the highest index value.

15. The computer-implemented method according to claim 1, in which the reference database has a series of codes sorted in order of size, and is compressed in size by the encoding unit, replacing the series by a new series comprising only the largest value from the series and all difference values between the largest value from the series and the remaining codes from the series.

16. An encoding unit comprising a processor and a non-transitory computer readable medium on which computer readable medium instructions of a computer program are stored that are processed by the processor to perform the method according to claim 1.

17. A computer program product comprising computer code stored on a non-transitory computer readable medium and processed by a processor to perform the method according to claim 1.

18. The computer-implemented method according to claim 9, in which N has a constant value for each value of i.

19. The computer-implemented method according to claim 9, in which N has a constant value for the same value of i, but may have another value for different values of i.

20. A computer-implemented method for the decoding of an end-code according to the following actions:
a) receiving, by a decoding unit, the end-code comprising an (i+1)-th folder (Folder(i+1)) generated ultimately by an encoding unit or a unique reference thereto, and receiving the value of i;
b) using, by the decoding unit, values in the (i+1)-th folder (Folder(i+1)) as index values that refer to values in a reference database;
c) calculating, by the decoding unit, values in an (i+1)-th temporary code list (TCL(i+1)) by placing, in each position in the (i+1)-th folder (Folder(i+1)), a value from the reference database having the index value corresponding to that position;
d) calculating, by the decoding unit, values in an i-th folder (Folder(i)) by applying a decoding formula to the (i+1)-th temporary code list (TCL(i+1)), said decoding formula being an inverse formula of a formula that has been used by the encoding unit for calculating the (i+1)-th temporary code list from the (i)-th folder (Folder(i)), wherein the i-th folder (Folder(i)) comprises N times as many values as the (i+1)-th temporary code list (TCL(i+1)), where $N \geq 2$;
e) using, by the decoding unit, the values in the i-th folder (Folder(i)) as index values that refer to values in the reference database;
f) calculating, by the decoding unit, values in an i-th temporary code list (TCL(i)) by placing, in each position in the i-th folder (Folder(i)), a value from the reference database having the index value corresponding to that position;

g) decrementing, by the decoding unit, the value of i by 1; if i≧0, calculating values in an i-th folder (Folder(i)) by applying a decoding formula on the (i+1)-th temporary code list (TCL(i+1)), said decoding formula being an inverse formula of a formula that has been used by the encoding unit for calculating the (i+1)-th temporary code list from the (i)-th folder (Folder(i)), wherein the i-th folder (Folder(i)) comprises N times as many values as the (i+1)-th temporary code list (TCL(i+1)), where N≧2, and jumping back to action e);

if i<0, jumping to action h); and h) deriving, by the decoding unit, an original dataset from the i-th folder, where i=0.

21. A decoding unit comprising a processor and a non-transitory computer readable medium in which computer readable medium instructions of a computer program are stored that are processed by a processor to perform the method according to claim 20.

22. A computer program product, comprising data and instructions stored in a non-transitory computer readable medium, arranged such that these, after having been received by a processor, provide the processor with the ability to execute the method according to claim 20.

23. An encoding/decoding system, comprising an encoding unit according to claim 16 and a decoding unit according to claim 21.

24. A computer-implemented method of encoding comprising:

a) receiving, by an encoding unit, input data elements, which input data elements are obtained from:
   I. dividing data elements into M*M matrices, where M is an integer value,
   II. applying a DCT process to these M*M matrices rendering M*M DCT matrices with DCT data elements, and
   III. quantisation of all values in said M*M DCT matrices in values between a predetermined lower and higher limit rendering said input data elements;

b) applying, by an encoding unit, a predetermined formula F which has at least the following component:

$$F(\vec{V}) = \sum_{n=0}^{n=N} [V_n * BN^n] \quad (1)$$

where:

$$\vec{V} = (V_0, V_1, \ldots, V_N) \quad (2)$$

= a vector, where $N \geq 1$, formed from $N + 1$ input data elements;

BN=a base value;
rendering a first series of codes;

c) storage, by the encoding unit of the first series of codes in a first temporary code list (TCL(0));

d) generating, by the encoding unit, a first folder (Folder (0)) from the first temporary code list (TCL(0)) by, in each position thereof containing a value, replacing the value by an index that refers to the position of the same corresponding value as stored in a reference database;

e) generating, by the encoding unit, a series of second temporary codes and placing thereof in a second temporary code list (TCL(1)), in which each new temporary code is calculated using said predetermined formula F that always combines at least two values from the first folder (Folder(0)), using a different value for base value BN; and f) generating, by the encoding unit, a second folder (Folder (1)) from the second temporary code list (TCL(1)) by, in each position thereof containing a value, replacing the value by an index that refers to the position of the same corresponding value as stored in the reference database.

* * * * *